(12) United States Patent
Kishi et al.

(10) Patent No.: US 11,473,209 B2
(45) Date of Patent: *Oct. 18, 2022

(54) QUARTZ GLASS CRUCIBLE AND MANUFACTURING METHOD THEREOF

(71) Applicant: SUMCO CORPORATION, Tokyo (JP)

(72) Inventors: Hiroshi Kishi, Akita (JP); Kouta Hasebe, Akita (JP); Takahiro Abe, Tokyo (JP); Hideki Fujiwara, Tokyo (JP); Eriko Kitahara, Akita (JP)

(73) Assignee: SUMCO CORPORATION, Tokyo (JP)

(*) Notice: Subject to any disclaimer, the term of this patent is extended or adjusted under 35 U.S.C. 154(b) by 423 days.

This patent is subject to a terminal disclaimer.

(21) Appl. No.: 16/610,044

(22) PCT Filed: Apr. 2, 2018

(86) PCT No.: PCT/JP2018/014047
§ 371 (c)(1),
(2) Date: Oct. 31, 2019

(87) PCT Pub. No.: WO2018/203454
PCT Pub. Date: Nov. 8, 2018

(65) Prior Publication Data
US 2020/0115820 A1    Apr. 16, 2020

(30) Foreign Application Priority Data

May 2, 2017   (JP) .............................. JP2017-091924

(51) Int. Cl.
*C30B 15/10*   (2006.01)
*C03B 19/09*   (2006.01)
(Continued)

(52) U.S. Cl.
CPC ............ *C30B 15/10* (2013.01); *C03B 19/095* (2013.01); *C03B 20/00* (2013.01); *C03C 17/004* (2013.01);
(Continued)

(58) Field of Classification Search
CPC ....... C30B 15/10; C30B 29/06; C03B 19/095; C03B 20/00; C03C 17/004; C03C 2217/70; C03C 2217/92
See application file for complete search history.

(56) References Cited

U.S. PATENT DOCUMENTS 11,162,186 B2 * 11/2021 Kishi .................. C03C 23/0055
2003/0183161 A1 * 10/2003 Tsujimoto ............... C30B 15/10
117/200

(Continued)

FOREIGN PATENT DOCUMENTS

CN    103154330 A     6/2013
DE    112017004764    6/2019
(Continued)

OTHER PUBLICATIONS

A Notification of Examination Opinions with Search Report issued by Taiwan Intellectual Property Office, dated Dec. 27, 2018, for Taiwan counterpart application No. 107113641. (15 pages).

(Continued)

*Primary Examiner* — Robert M Kunemund
(74) *Attorney, Agent, or Firm* — Law Office of Katsuhiro Arai

(57) ABSTRACT

In an exemplary embodiment, a quartz glass crucible 1 includes: a cylindrical crucible body 10 which has a bottom and is made of quartz glass; and crystallization-accelerator-containing coating films 13A and 13B which are formed on surfaces of the crucible body 10 so as to cause crystallization-accelerator-enriched layers to be formed in the vicinity (Continued)

of the surfaces of the crucible body 10 by heating during a step of pulling up a silicon single crystal by a Czochralski method. The quartz glass crucible is capable of withstanding a single crystal pull-up step undertaken for a very long period of time, such as multi-pulling, and a manufacturing method thereof.

23 Claims, 22 Drawing Sheets

(51) Int. Cl.
  *C03B 20/00* (2006.01)
  *C03C 17/00* (2006.01)
  *C30B 29/06* (2006.01)
(52) U.S. Cl.
  CPC ............ *C03C 17/005* (2013.01); *C30B 29/06* (2013.01); *C03C 2217/70* (2013.01); *C03C 2217/92* (2013.01)

(56) References Cited

U.S. PATENT DOCUMENTS

| 2005/0178319 | A1 | 8/2005 | Korus et al. |
| 2006/0016389 | A1 | 1/2006 | Holder et al. |
| 2008/0092804 | A1 | 4/2008 | Hansen et al. |
| 2008/0289568 | A1* | 11/2008 | Kanda ................... C03B 19/095 65/17.3 |
| 2010/0154702 | A1* | 6/2010 | Tsujimoto ............... C03C 17/25 427/226 |
| 2013/0247818 | A1 | 9/2013 | Wang et al. |
| 2014/0150714 | A1 | 6/2014 | Horioka et al. |
| 2019/0145019 | A1 | 5/2019 | Kishi et al. |

FOREIGN PATENT DOCUMENTS

| JP | H01275496 | A | 11/1989 |
| JP | H082932 | A | 1/1996 |
| JP | H09110590 | A | 4/1997 |
| JP | 2003160393 | A | 6/2003 |
| JP | 2003192391 | A | 7/2003 |
| JP | 2005523229 | A | 8/2005 |
| JP | 2006206342 | A | 8/2006 |
| JP | 2008507467 | A | 3/2008 |
| JP | 2010537945 | A | 12/2010 |
| JP | 2012232857 | A | 11/2012 |
| WO | 2012159267 | A1 | 11/2012 |
| WO | 2018055974 | A1 | 3/2018 |

OTHER PUBLICATIONS

International Search Report (ISR) dated Apr. 24, 2018, issued for International application No. PCT/JP2018/014047. (2 pages).
An Office Action issued by the German Patent Office, dated Nov. 11, 2021, for German counterpart application No. 112018002317.6 (6 pages).
A Notice of Reasons for Refusal issued by the Japanese Patent Office dated Feb. 15, 2022, for Japanese counterpart application No. 2021-000917. (3 pages).

* cited by examiner

FIG. 3
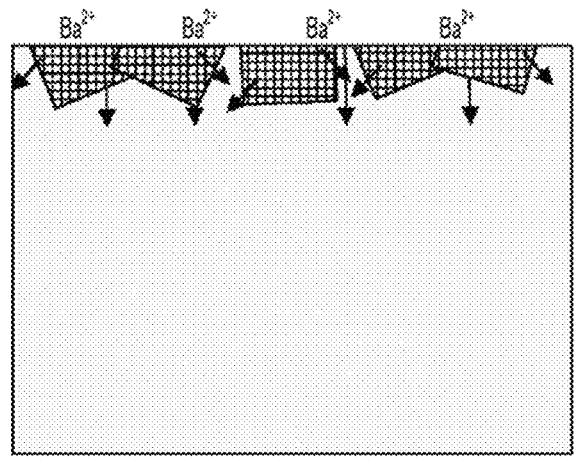
(a)
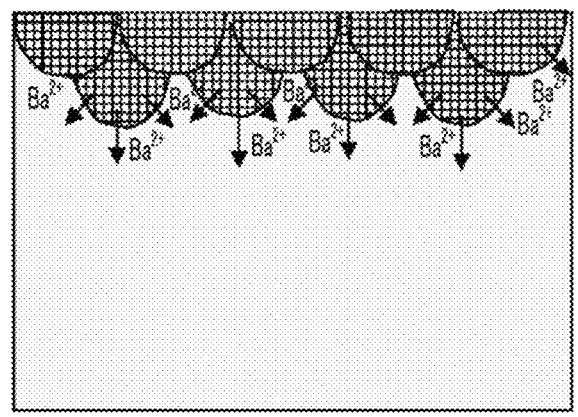
(b)
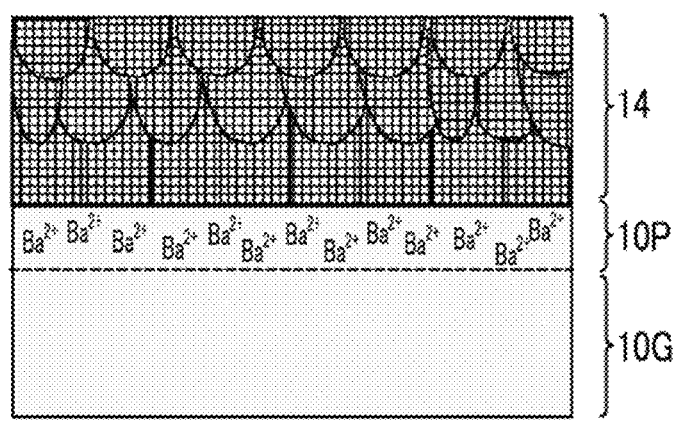
(c)

FIG. 4
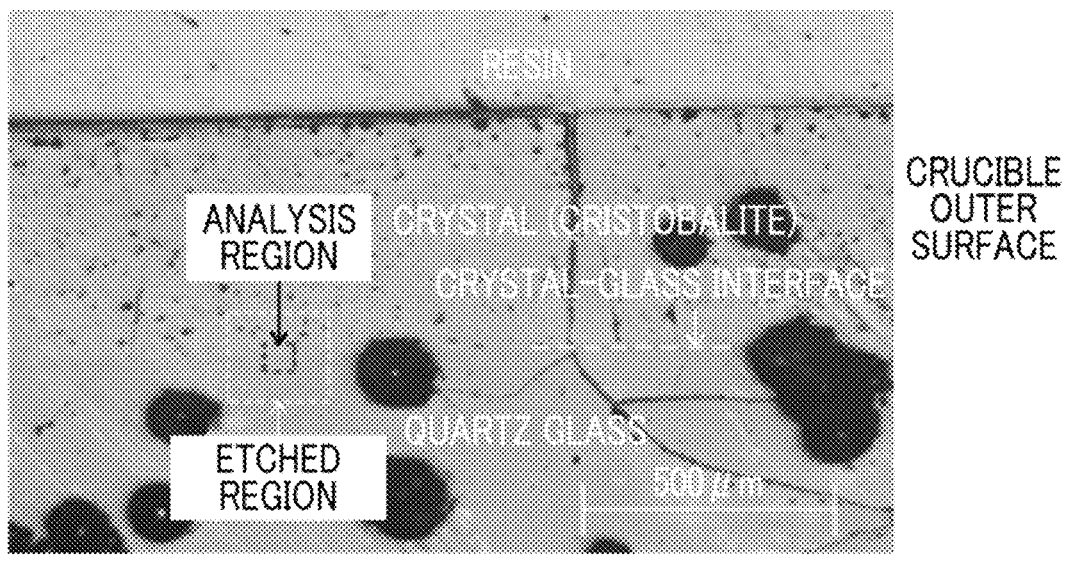
(a)
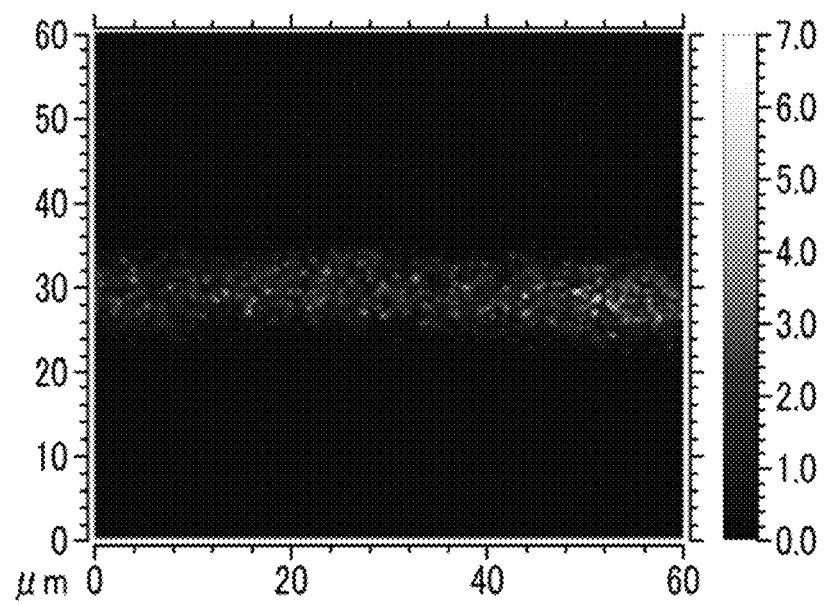
Ba+
MC:    7; TC: 2.248e+003
(b)

FIG. 5
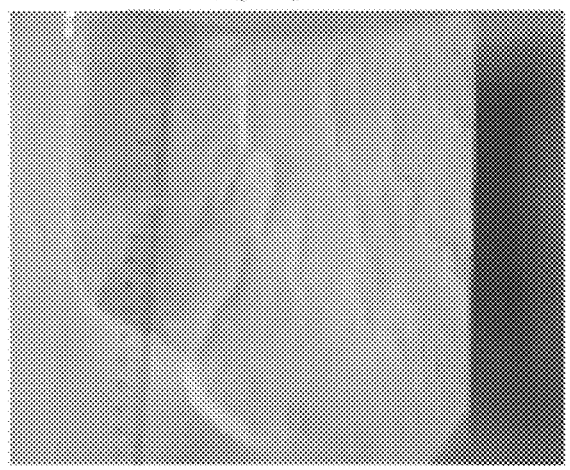
(a)
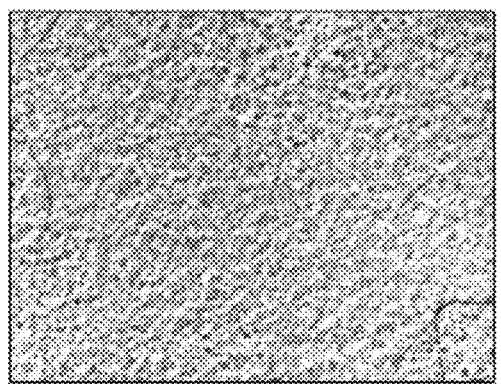
(b)
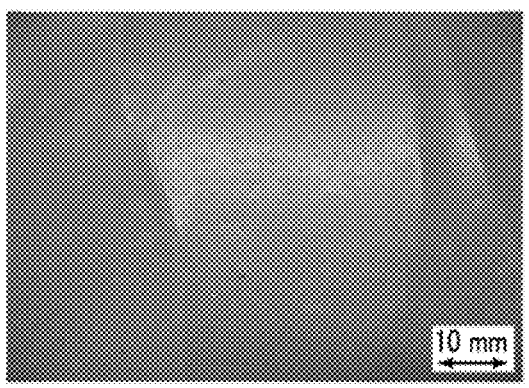
(c)
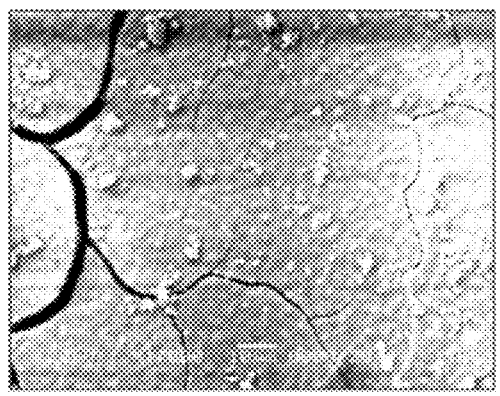
(d)
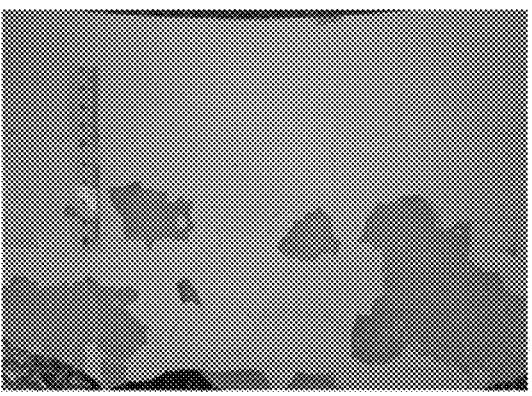
(e)

FIG. 7

| CRYSTAL STRUCTURE | CRUCIBLE | | | | | |
|---|---|---|---|---|---|---|
| | INNER SURFACE | | | OUTER SURFACE | | |
| | W PORTION | R PORTION | B PORTION | W PORTION | R PORTION | B PORTION |
| RANDOM (7.0 OR MORE) | C | C | C | C | C | C |
| DOME-SHAPED (0.4 OR MORE AND LESS THAN 7.0) | A | B | B | A | A | A |
| COLUMNAR (LESS THAN 0.4) | | A | A | B | B | B |

FIG. 10
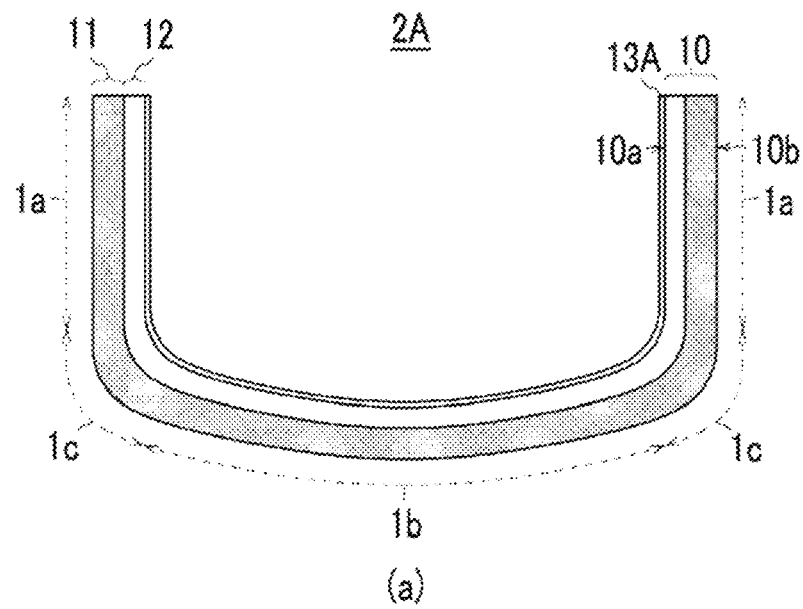
(a)
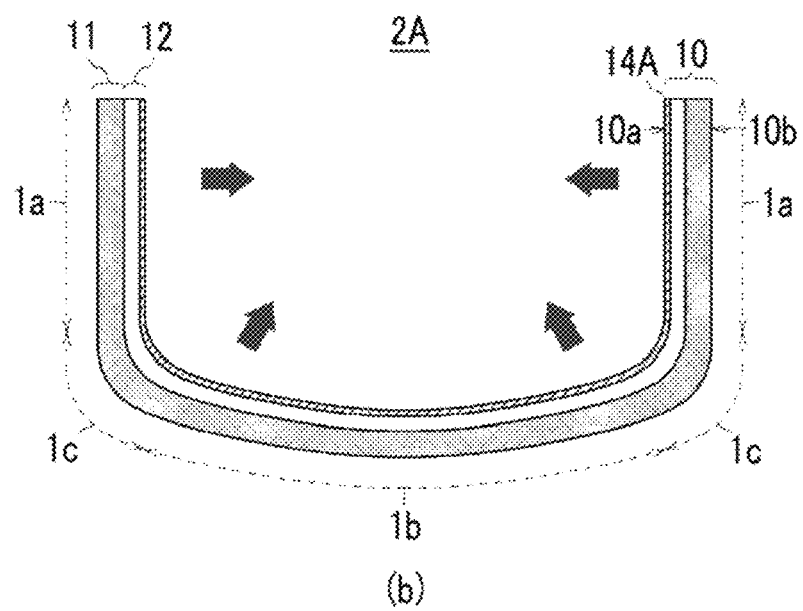
(b)

FIG. 11
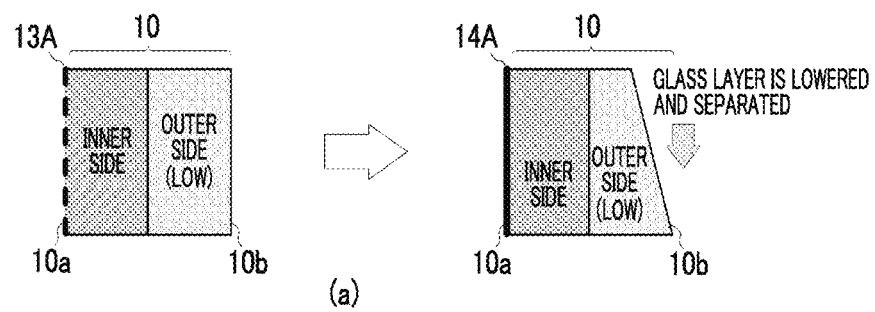
(a)
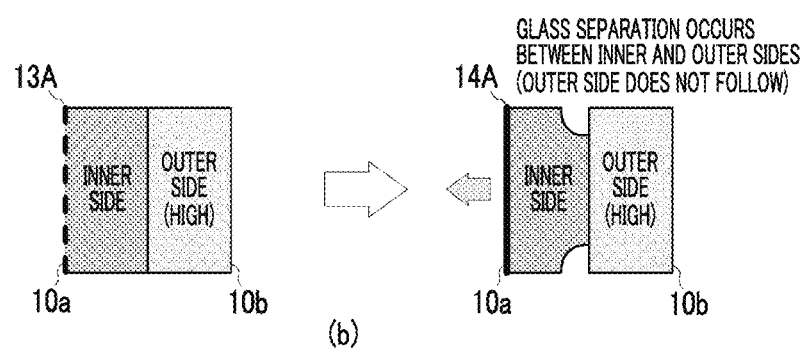
(b)

FIG. 12
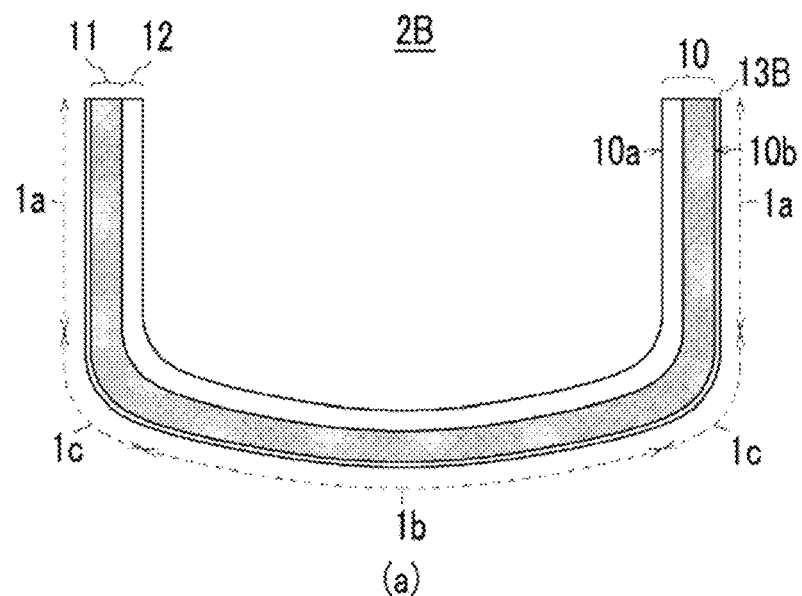
(a)
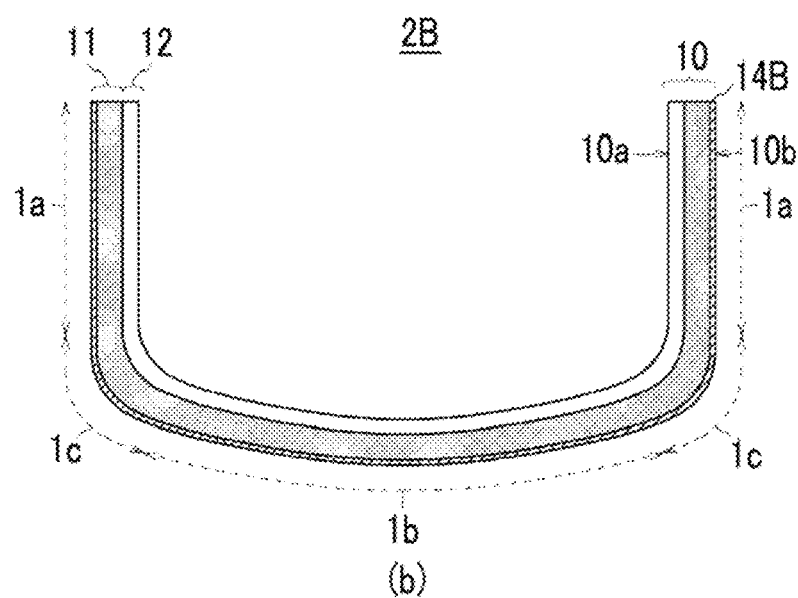
(b)

FIG. 16
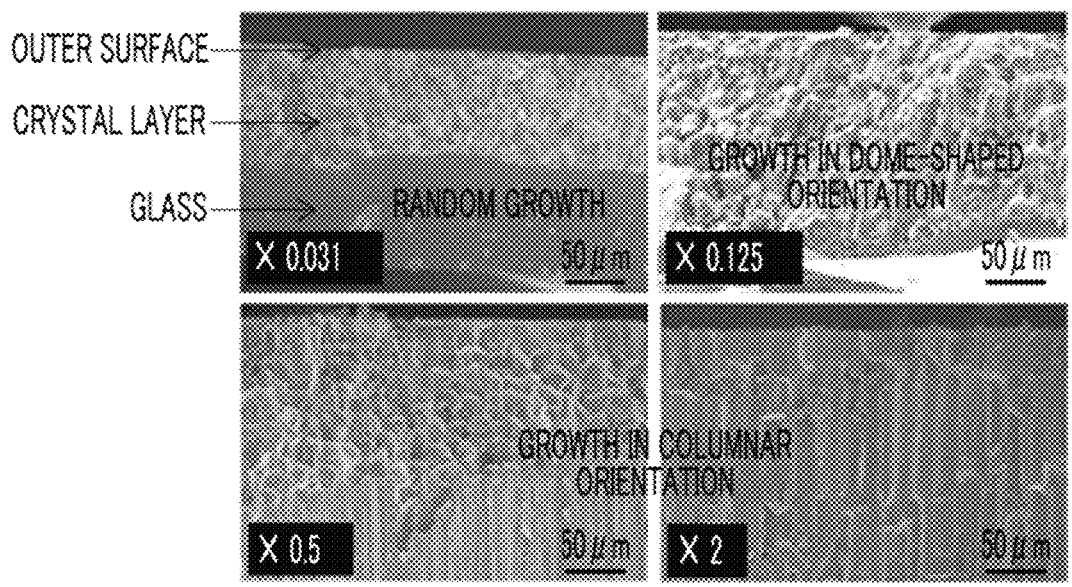
(a)
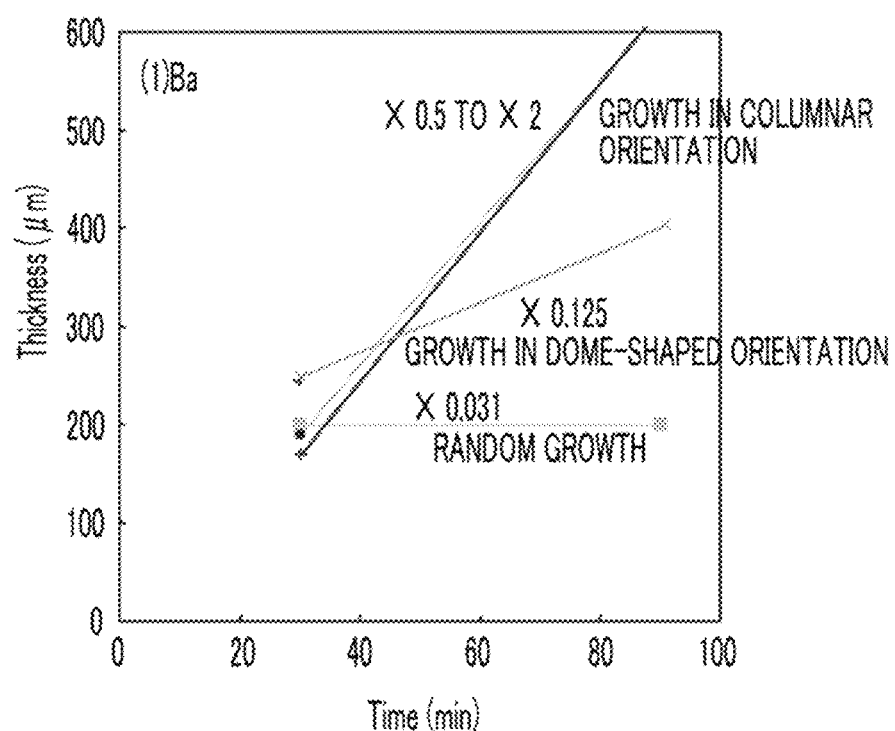
(b)

FIG. 18
CRUCIBLE SAMPLE #2
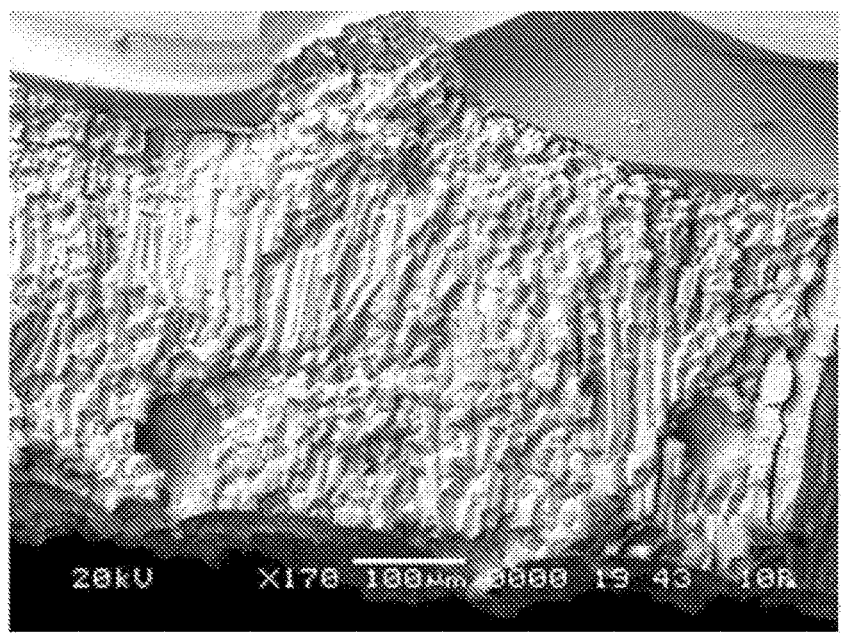
(a)
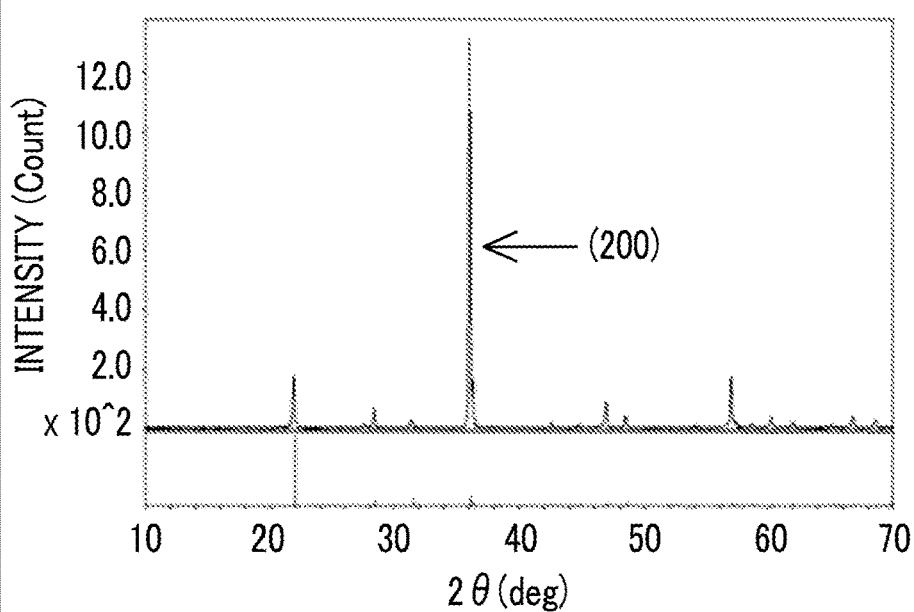
(b)

FIG. 19
CRUCIBLE SAMPLE #3
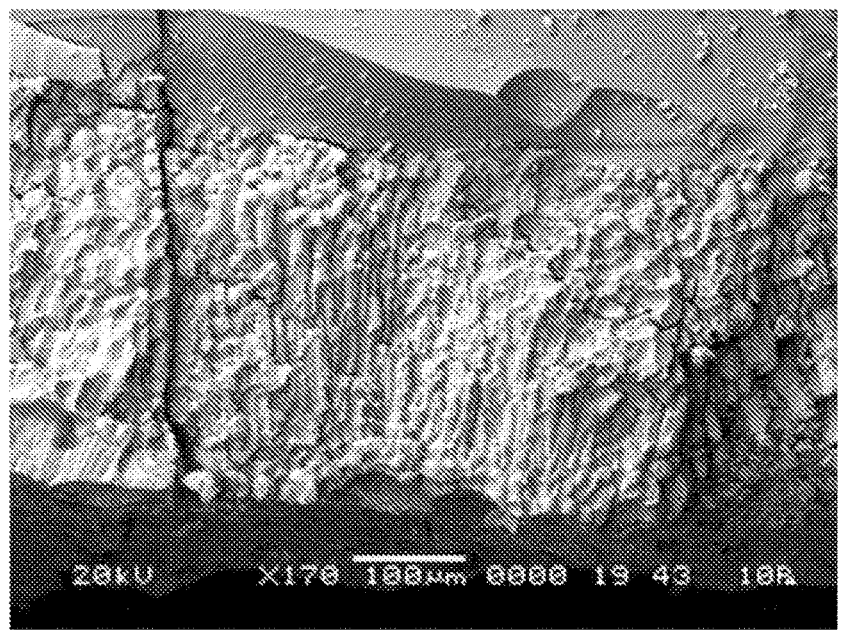
(a)
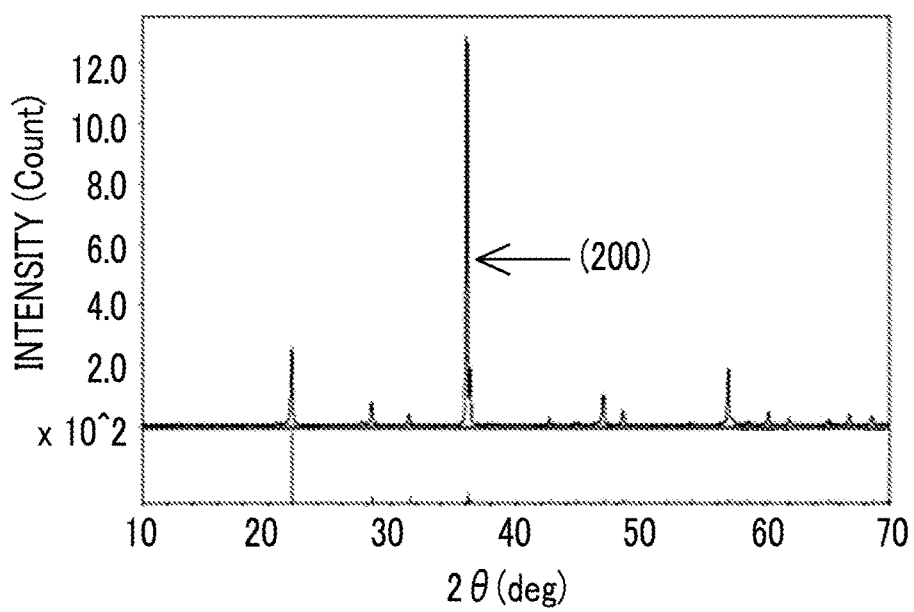
(b)

FIG. 20

| SAMPLE | X1 | X2 | X3 | X4 | X5 | X6 |
|---|---|---|---|---|---|---|
| CRYSTAL LAYER POSITION | INNER SURFACE + OUTER SURFACE | INNER SURFACE + OUTER SURFACE | INNER SURFACE + OUTER SURFACE | INNER SURFACE + OUTER SURFACE | INNER SURFACE + OUTER SURFACE | INNER SURFACE + OUTER SURFACE |
| INNER SURFACE APPLICATION FILM Ba CONCENTRATION (atoms/cm³) | 1.0E17 | 8.0E15 | 1.0E17 | 8.0E15 | 2.4E17 | 6.0E15 |
| INNER SURFACE CRYSTAL ORIENTATION | DOME-SHAPED + COLUMNAR | DOME-SHAPED | DOME-SHAPED + COLUMNAR | DOME-SHAPED | DOME-SHAPED + COLUMNAR | DOME-SHAPED |
| INNER CRYSTAL LAYER THICKNESS GRADIENT | 0.8 TO 1.2 | 0.8 TO 1.2 | 0.8 TO 1.2 | 0.8 TO 1.2 | 0.8 TO 1.2 | 0.8 TO 1.2 |
| INNER SURFACE Ba CONCENTRATION GRADIENT | 70 TO 130% | 70 TO 130% | 70 TO 130% | 70 TO 130% | 70 TO 130% | 70 TO 130% |
| INNER SURFACE Ba-ENRICHED LAYER THICKNESS | 6μm | 6μm | 6μm | 6μm | 7μm | 5μm |
| OUTER SURFACE APPLICATION FILM Ba CONCENTRATION (atoms/cm³) | 8.0E15 | 8.0E15 | 8.0E15 | 8.0E15 | 8.0E15 | 3.0E16 |
| OUTER SURFACE CRYSTAL ORIENTATION | DOME-SHAPED | DOME-SHAPED | DOME-SHAPED | DOME-SHAPED | DOME-SHAPED | DOME-SHAPED |
| OUTER CRYSTAL LAYER THICKNESS GRADIENT | 0.8 TO 1.2 | 0.8 TO 1.2 | 0.8 TO 1.2 | 0.8 TO 1.2 | 0.8 TO 1.2 | 0.8 TO 1.2 |
| OUTER SURFACE Ba CONCENTRATION GRADIENT | 70 TO 130% | 70 TO 130% | 70 TO 130% | 70 TO 130% | 70 TO 130% | 70 TO 130% |
| OUTER SURFACE Ba-ENRICHED LAYER THICKNESS | 6μm | 6μm | 6μm | 6μm | 6μm | 6μm |
| CRYSTAL LAYER THICKNESS RATIO (INNER SURFACE/OUTER SURFACE) | 4.5 | 0.6 | 1.5 | 1.2 | 2.5 | 0.6 |
| APPLICATION FILM Ba CONCENTRATION RATIO (INNER SURFACE/OUTER SURFACE) | 12.5 | 1 | 12.5 | 1 | 30 | 0.2 |
| GLASS VISCOSITY RATIO | INNER SIDE/OUTER SIDE =0.8 | INNER SIDE/OUTER SIDE =2.0 | INNER SIDE/OUTER SIDE =6.5 | INNER SIDE/OUTER SIDE =0.1 | INNER SIDE/OUTER SIDE =2 | INNER SIDE/OUTER SIDE =0.8 |
| CRUCIBLE DEFORMATION | NO DEFORMATION | NO DEFORMATION | NO DEFORMATION | NO DEFORMATION | NO DEFORMATION | NO DEFORMATION |
| PRESENCE OR ABSENCE OF WRINKLES AND CRACKS | NO WRINKLES | NO WRINKLES | NO WRINKLES | NO WRINKLES | NO WRINKLES | NO WRINKLES |
| DELAMINATION | NO DELAMINATION | NO DELAMINATION | NO DELAMINATION | NO DELAMINATION | NO DELAMINATION | NO DELAMINATION |
| SINGLE CRYSTALLINITY | 89% | 88% | 86% | 87% | 85% | 85% |

FIG. 21

| SAMPLE | X7 | X8 | X9 | X10 | X11 |
|---|---|---|---|---|---|
| CRYSTAL LAYER POSITION | INNER SURFACE + OUTER SURFACE | INNER SURFACE + OUTER SURFACE | INNER SURFACE + OUTER SURFACE | INNER SURFACE + OUTER SURFACE | INNER SURFACE + OUTER SURFACE |
| INNER SURFACE APPLICATION FILM Ba CONCENTRATION (atoms/cm$^3$) | 1.0E17 | 1.0E17 | 2.4E17 | 2.4E17 | 8.0E15 |
| INNER SURFACE CRYSTAL ORIENTATION | DOME-SHAPED + COLUMNAR | DOME-SHAPED + COLUMNAR | DOME-SHAPED + COLUMNAR | DOME-SHAPED + COLUMNAR | DOME-SHAPED |
| INNER CRYSTAL LAYER THICKNESS GRADIENT | PLACES HAVING 0.2 PRESENT | PLACES HAVING 0.2 PRESENT | PLACES HAVING 0.2 PRESENT | 0.8 TO 1.2 | 0.8 TO 1.2 |
| INNER SURFACE Ba CONCENTRATION GRADIENT | PLACES HAVING 30% PRESENT | PLACES HAVING 30% PRESENT | PLACES HAVING 30% PRESENT | 70 TO 130% | 70 TO 130% |
| INNER SURFACE Ba-ENRICHED LAYER THICKNESS | 6μm | 6μm | 7μm | 7μm | 6μm |
| OUTER SURFACE APPLICATION FILM Ba CONCENTRATION (atoms/cm$^3$) | 8.0E15 | 8.0E15 | 8.0E15 | 8.0E15 | 1.0E17 |
| OUTER SURFACE CRYSTAL ORIENTATION | DOME-SHAPED | DOME-SHAPED | DOME-SHAPED | DOME-SHAPED | DOME-SHAPED + COLUMNAR |
| OUTER CRYSTAL LAYER THICKNESS GRADIENT | PLACES HAVING 0.2 PRESENT | PLACES HAVING 0.2 PRESENT | PLACES HAVING 0.2 PRESENT | 0.8 TO 1.2 | 0.8 TO 1.2 |
| OUTER SURFACE Ba CONCENTRATION GRADIENT | PLACES HAVING 30% PRESENT | PLACES HAVING 30% PRESENT | PLACES HAVING 30% PRESENT | 70 TO 130% | 70 TO 130% |
| OUTER SURFACE Ba-ENRICHED LAYER THICKNESS | 6μm | 6μm | 6μm | 6μm | 6μm |
| CRYSTAL LAYER THICKNESS RATIO (INNER SURFACE/OUTER SURFACE) | 4.5 | 1.5 | 4 | 6.5 | 0.1 |
| APPLICATION FILM Ba CONCENTRATION RATIO (INNER SURFACE/OUTER SURFACE) | 12.5 | 12.5 | 30 | 30 | 0.08 |
| GLASS VISCOSITY RATIO | INNER SIDE/OUTER SIDE =0.8 | INNER SIDE/OUTER SIDE =6.5 | INNER SIDE/OUTER SIDE =2 | INNER SIDE/OUTER SIDE =7.5 | INNER SIDE/OUTER SIDE =0.1 |
| CRUCIBLE DEFORMATION | NO DEFORMATION | NO DEFORMATION | NO DEFORMATION | NO DEFORMATION | NO DEFORMATION |
| PRESENCE OR ABSENCE OF WRINKLES AND CRACKS | SOME WRINKLES PRESENT, NO CRACKS | SOME WRINKLES PRESENT, NO CRACKS | SOME WRINKLES PRESENT, NO CRACKS | SOME WRINKLES PRESENT ON INNER SIDE, NO CRACKS | SOME WRINKLES PRESENT ON OUTER SIDE, NO CRACKS |
| DELAMINATION | NO DELAMINATION | NO DELAMINATION | NO DELAMINATION | NO DELAMINATION | NO DELAMINATION |
| SINGLE CRYSTALLINITY | 81% | 79% | 80% | 80% | 86% |

FIG. 22

| SAMPLE | X12 | X13 | X14 | X15 | X16 | X17 | X18 |
|---|---|---|---|---|---|---|---|
| CRYSTAL LAYER POSITION | ONLY INNER SURFACE | ONLY INNER SURFACE | ONLY INNER SURFACE | ONLY INNER SURFACE | ONLY INNER SURFACE | ONLY INNER SURFACE | ONLY INNER SURFACE |
| INNER SURFACE APPLICATION FILM Ba CONCENTRATION (atoms/cm$^3$) | 1.0E17 | 1.0E17 | 1.0E17 | 1.0E17 | 1.0E17 | 4.0E17 | 8.0E17 |
| INNER SURFACE CRYSTAL ORIENTATION | DOME-SHAPED + COLUMNAR | DOME-SHAPED + COLUMNAR | DOME-SHAPED + COLUMNAR | DOME-SHAPED + COLUMNAR | DOME-SHAPED + COLUMNAR | DOME-SHAPED + COLUMNAR | DOME-SHAPED + COLUMNAR |
| INNER SURFACE CRYSTAL LAYER THICKNESS GRADIENT | 0.8 TO 1.2 | 0.8 TO 1.2 | 0.8 TO 1.2 | 0.8 TO 1.2 | PLACES HAVING 0.2 PRESENT | 0.8 TO 1.2 | 0.8 TO 1.2 |
| INNER SURFACE Ba CONCENTRATION GRADIENT | 70 TO 130% | 70 TO 130% | 70 TO 130% | 70 TO 130% | PLACES HAVING 30% PRESENT | 70 TO 130% | 70 TO 130% |
| INNER SURFACE Ba-ENRICHED LAYER THICKNESS | 0.6um | 18um | 6um | 6um | 6um | 30um | 80um |
| OUTER SURFACE APPLICATION FILM Ba CONCENTRATION (atoms/cm$^3$) | | | | | | | |
| OUTER SURFACE CRYSTAL ORIENTATION | | | | | | | |
| OUTER CRYSTAL LAYER THICKNESS GRADIENT | | | | | | | |
| OUTER SURFACE Ba CONCENTRATION GRADIENT | | | | | | | |
| OUTER SURFACE Ba-ENRICHED LAYER THICKNESS | | | | | | | |
| GLASS VISCOSITY RATIO | OUTER SIDE/ INNER SIDE =3.0 | OUTER SIDE/ INNER SIDE =3.0 | OUTER SIDE/ INNER SIDE =0.3 | OUTER SIDE/ INNER SIDE =1.2 | OUTER SIDE/ INNER SIDE =3.0 | OUTER SIDE/ INNER SIDE =3.0 | OUTER SIDE/ INNER SIDE =3.0 |
| CRUCIBLE DEFORMATION | NO DEFORMATION | NO DEFORMATION | SLIGHT DEFORMATION | SLIGHT DEFORMATION | NO DEFORMATION | NO DEFORMATION | NO DEFORMATION |
| PRESENCE OR ABSENCE OF WRINKLES AND CRACKS | NO WRINKLES | NO WRINKLES | NO WRINKLES | NO WRINKLES | SOME WRINKLES PRESENT, NO CRACKS | SOME WRINKLES PRESENT, NO CRACKS | WRINKLES PRESENT, CRACKS PRESENT |
| DELAMINATION | NO DELAMINATION | NO DELAMINATION | NO DELAMINATION | NO DELAMINATION | NO DELAMINATION | NO DELAMINATION | NO DELAMINATION |
| SINGLE CRYSTALLINITY | 89% | 93% | 81% | 81% | 80% | 83% | 72% |

FIG. 23

| SAMPLE | X19 | X20 | X21 | X22 | X23 | X24 |
|---|---|---|---|---|---|---|
| CRYSTAL LAYER POSITION | ONLY OUTER SURFACE | ONLY OUTER SURFACE | ONLY OUTER SURFACE | ONLY OUTER SURFACE | ONLY OUTER SURFACE | ONLY OUTER SURFACE |
| INNER SURFACE APPLICATION FILM Ba CONCENTRATION (atoms/cm²) | | | | | | |
| INNER SURFACE CRYSTAL ORIENTATION | | | | | | |
| INNER CRYSTAL LAYER THICKNESS GRADIENT | | | | | | |
| INNER SURFACE Ba CONCENTRATION GRADIENT | | | | | | |
| INNER SURFACE Ba-ENRICHED LAYER THICKNESS | | | | | | |
| OUTER SURFACE APPLICATION FILM Ba CONCENTRATION (atoms/cm²) | 8.0E15 | 8.0E15 | 8.0E15 | 8.0E15 | 4.0E17 | 8.0E17 |
| OUTER SURFACE CRYSTAL ORIENTATION | DOME-SHAPED | DOME-SHAPED | DOME-SHAPED | DOME-SHAPED | DOME-SHAPED + COLUMNAR | DOME-SHAPED + COLUMNAR |
| OUTER CRYSTAL LAYER THICKNESS GRADIENT | 0.8 TO 1.2 | 0.8 TO 1.2 | 0.8 TO 1.2 | PLACES HAVING 0.2 PRESENT | 0.8 TO 1.2 | 0.8 TO 1.2 |
| OUTER SURFACE Ba CONCENTRATION GRADIENT | 70 TO 130% | 70 TO 130% | 70 TO 130% | PLACES HAVING 30% PRESENT | 70 TO 130% | 70 TO 130% |
| OUTER SURFACE Ba-ENRICHED LAYER THICKNESS | 0.6μm | 18μm | 6μm | 6μm | 50μm | 80μm |
| GLASS VISCOSITY RATIO | INNER SIDE/ OUTER SIDE =2.0 | INNER SIDE/ OUTER SIDE =2.0 | INNER SIDE/ OUTER SIDE =0.3 | INNER SIDE/ OUTER SIDE =2.0 | INNER SIDE/ OUTER SIDE =2.0 | OUTER SIDE/ INNER SIDE =3.0 |
| CRUCIBLE DEFORMATION | NO DEFORMATION | NO DEFORMATION | SLIGHT DEFORMATION | NO DEFORMATION | NO DEFORMATION | SLIGHT DEFORMATION |
| PRESENCE OR ABSENCE OF WRINKLES AND CRACKS | NO WRINKLES | NO WRINKLES | NO WRINKLES | SOME WRINKLES PRESENT, NO CRACKS | SOME WRINKLES PRESENT, NO CRACKS | WRINKLES PRESENT, CRACKS PRESENT |
| DELAMINATION | NO DELAMINATION | NO DELAMINATION | NO DELAMINATION | NO DELAMINATION | NO DELAMINATION | NO DELAMINATION |
| SINGLE CRYSTALLINITY | 86% | 93% | 90% | 79% | 86% | 72% |

FIG. 24

| SAMPLE | Y1 | Y2 | Y3 | Y4 | Y5 | Y6 |
|---|---|---|---|---|---|---|
| CRYSTAL LAYER POSITION | INNER SURFACE + OUTER SURFACE | INNER SURFACE + OUTER SURFACE | ONLY INNER SURFACE | ONLY INNER SURFACE | ONLY OUTER SURFACE | ONLY OUTER SURFACE |
| INNER SURFACE APPLICATION FILM Ba CONCENTRATION (atoms/cm$^2$) | 3.0E15 | 1.0E14 | 1.0E14 | 1.0E14 | | |
| INNER SURFACE CRYSTAL ORIENTATION | RANDOM | RANDOM | RANDOM | RANDOM | | |
| INNER CRYSTAL LAYER THICKNESS GRADIENT | PLACES HAVING 0.2 PRESENT | PLACES HAVING 0.2 PRESENT | 0.5 TO 1.5 | PLACES HAVING 0.2 PRESENT | | |
| INNER SURFACE Ba CONCENTRATION GRADIENT | PLACES HAVING 30% PRESENT | PLACES HAVING 30% PRESENT | 40 TO 150% | PLACES HAVING 30% PRESENT | | |
| INNER SURFACE Ba-ENRICHED LAYER THICKNESS | DETECTION LIMIT OR LOWER | DETECTION LIMIT OR LOWER | DETECTION LIMIT OR LOWER | DETECTION LIMIT OR LOWER | | |
| OUTER SURFACE APPLICATION FILM Ba CONCENTRATION (atoms/cm$^2$) | 1.0E14 | 1.0E15 | | | 1.0E14 | 1.0E14 |
| OUTER SURFACE CRYSTAL ORIENTATION | RANDOM | RANDOM | | | RANDOM | RANDOM |
| OUTER CRYSTAL LAYER THICKNESS GRADIENT | PLACES HAVING 0.2 PRESENT | PLACES HAVING 0.2 PRESENT | | | 0.8 TO 1.2 | PLACES HAVING 0.2 PRESENT |
| OUTER SURFACE Ba CONCENTRATION GRADIENT | PLACES HAVING 30% PRESENT | PLACES HAVING 30% PRESENT | | | 70 TO 130% | PLACES HAVING 30% PRESENT |
| OUTER SURFACE Ba-ENRICHED LAYER THICKNESS | DETECTION LIMIT OR LOWER | DETECTION LIMIT OR LOWER | | | DETECTION LIMIT OR LOWER | DETECTION LIMIT OR LOWER |
| CRYSTAL LAYER THICKNESS RATIO (INNER SURFACE/ OUTER SURFACE) | 6.5 | 0.1 | | | | |
| APPLICATION FILM Ba CONCENTRATION RATIO (INNER SURFACE/ OUTER SURFACE) | 30 | 0.1 | | | | |
| GLASS VISCOSITY RATIO | INNER SIDE/ OUTER SIDE =3.0 | INNER SIDE/ OUTER SIDE =0.1 | OUTER SIDE/ INNER SIDE =3.0 | OUTER SIDE/ INNER SIDE =1.2 | OUTER SIDE/ INNER SIDE =3.0 | INNER SIDE/ OUTER SIDE =0.3 |
| CRUCIBLE DEFORMATION | DEFORMED | DEFORMED | DEFORMED | DEFORMED | DEFORMED | DEFORMED |
| PRESENCE OR ABSENCE OF WRINKLES AND CRACKS | WRINKLES PRESENT, CRACKS PRESENT | WRINKLES PRESENT, CRACKS PRESENT | NO WRINKLES | WRINKLES PRESENT, CRACKS PRESENT | NO WRINKLES | WRINKLES PRESENT, CRACKS PRESENT |
| DELAMINATION | DELAMINATION OCCURRED | DELAMINATION OCCURRED | NO DELAMINATION | DELAMINATION OCCURRED | NO DELAMINATION | DELAMINATION OCCURRED |
| SINGLE CRYSTALLINITY | 53% | 53% | 59% | 48% | 60% | 49% |

QUARTZ GLASS CRUCIBLE AND MANUFACTURING METHOD THEREOF

CROSS-REFERENCE TO RELATED APPLICATIONS

This application is the U.S. National Phase under 35 U.S.C. § 371 of International Application PCT/JP2018/014047, filed Apr. 2, 2018, which claims priority to Japanese Patent Application No. JP2017-091924, filed May 2, 2017. The International Application was published under PCT Article 21(2) in a language other than English.

TECHNICAL FIELD

The present invention relates to a quartz glass crucible and a manufacturing method thereof and, particularly to a quartz glass crucible used for manufacturing a silicon single crystal by the Czochralski method (CZ method) and a manufacturing method thereof.

BACKGROUND ART

A quartz glass crucible is used for manufacturing a silicon single crystal by the CZ method. In the CZ method, a silicon raw material is heated in the quartz glass crucible for melting, a seed crystal is dipped into the silicon melt, and then the seed crystal is gradually pulled up while rotating the crucible to grow a single crystal. In order to manufacture a high quality silicon single crystal for a semiconductor device at low costs, it is necessary to perform so-called multi-pulling in which not only can the yield of single crystals be increased by a single pull-up step, a plurality of silicon single crystal ingots can be pulled up from a single crucible. For this, a crucible having a stable shape capable of withstanding long-term use is necessary.

In a quartz glass crucible of the related art, the viscosity is reduced in a thermal environment at 1400° C. or higher during pulling up a silicon single crystal, so that the shape thereof cannot be maintained, and deformation of the crucible such as buckling or collapse to the inside occurs. Accordingly, variations in the liquid surface level of a silicon melt, breakage of the crucible, contact with components in a furnace, and the like become problems. Furthermore, the inner surface of the crucible is crystallized by coming into contact with the silicon melt during pulling up a single crystal and cristobalite called a brown ring is formed. In a case where the cristobalite is delaminated and incorporated into the silicon single crystal during growth, this causes dislocation.

In order to solve such problems, a method of increasing the strength of a crucible by positively crystallizing the wall surface of the crucible is proposed. For example, Patent Document 1 describes a quartz glass crucible in which a coating film of a crystallization accelerator of elements in group 2a is present in the inner surface of the quartz glass crucible within a depth of 1 mm. When a silicon single crystal is pulled up by using the quartz glass crucible, a crystal layer is formed on the inner surface of the crucible, so that heat resistance property is improved. Therefore, for example, even when a silicon single crystal is pulled up at a reduced pressure, the inner surface does not become rough and is maintained smooth, so that pulling up is possible for a long period of time with good crystallization ratio.

In addition, Patent Document 2 describes that a devitrification accelerator such as a barium hydroxide aqueous solution is applied to the inner surface of a crucible, and the crystallization rate is adjusted particularly by changing the concentration of the devitrification accelerator in different parts of the crucible, thereby preventing delamination of crystals. The crystallization rates of a corner portion, a wall portion, and a bottom portion of the crucible are set in descending order, and the devitrification growth rate is set to be in a range of 0.1 to 0.6 μm/h for uniform devitrification.

Patent Document 3 describes a surface treatment method of a quartz glass product such as a quartz glass crucible, in which the inner surface of a crucible is coated with a reducing coating agent (amines, organosilane halogens, or the like) containing a methyl group to accelerate cristobalite formation during pulling, thereby preventing delamination of a devitrification point.

Patent Document 4 describes a quartz glass crucible in which the strength is increased by semi-crystallizing the inner surface. The quartz glass crucible contains a crystallization accelerator in the inner surface of the crucible having a thickness of 1 to 10 μm and a semi-crystal layer having a crystallinity of 80% to 95%. The semi-crystal layer is formed by applying a voltage to a mold during arc melting to move the crystallization accelerator to the inner surface of the quartz glass crucible in a rotating mold method.

Patent Document 5 describes that the outer layer of a side wall of a crucible is formed as a doped region which contains a first components such as Ti acting as a reticulating agent in quartz glass and a second component such as Ba acting as a separation point forming agent in the quartz glass and has a thickness of 0.2 mm or more, and when a quartz glass crucible is heated in a specific usage method for crystal pulling, cristobalite is formed in the doped region to accelerate the crystallization of the quartz glass, thereby increasing the strength of the crucible.

BACKGROUND ART LITERATURE

Patent Document

Patent Document 1 Japanese Patent Application Laid-Open No. H8-2932
Patent Document 2 Japanese Patent Application Laid-Open No. 2003-160393
Patent Document 3 Japanese Patent Application Laid-Open No. 2010-537945
Patent Document 4 Japanese Patent Application Laid-Open No. 2006-206342
Patent Document 5 Japanese Patent Application Laid-Open No. 2005-523229

SUMMARY OF THE INVENTION

Problems to be Solved by the Invention

However, in the method of strengthening a crucible in the related art described in Patent Documents 1 and 2, there may be cases where the thickness of the crystal layer is insufficient, and delamination of crystal grains occur depending on the crystallization state. That is, when crystals grow in all directions (hereinafter, "random growth") with no regularity in the crystal growth direction in the crystal layer, the crystallization accelerator is trapped in the crystal grain boundary, so that the crystallization rate decreases with time, and the crystal growth in the thickness direction of the crucible is stopped in a relatively early stage in a pull-up step. Therefore, in the pull-up step taken for a very long period of time under high-temperature heat load, such as multi-pulling, there is a problem that a thin crystal layer in the inner surface of the crucible is eroded in the silicon melt and disappears completely.

The method of strengthening a crucible in the related art described in Patent Document 3 focuses only on the density of the brown ring on the surface and does not consider the crystal growth in the thickness direction of the crucible. When the thickness of the crystal layer is not sufficiently secured, there is a problem that the strength of the crucible cannot be maintained and deformation occurs, or delamination of the brown ring generated on the surface of the quartz glass occurs. Furthermore, since the brown ring does not cover the entire inner surface of the crucible, the brown ring does not contribute to an increase in the strength of the crucible.

In the method of strengthening a crucible in the related art described in Patent Documents 4 and 5, since the crystallization accelerator is present in a glass matrix, the crystallization accelerator simultaneously generates crystal nuclei, so that the crystal layer grows randomly. Therefore, there is a problem that the thickness of the crystal layer is insufficient due to a decrease in the crystallization rate. Since there is a possibility that the inner surface of the crucible may be eroded by 1 mm or more during pull-up of a single crystal, in a case where the crystal layer is thin, there is concern that the crystal layer may disappear in the latter half of the single-crystal pull-up step.

Accordingly, an object of the present invention is to provide a quartz glass crucible capable of withstanding a single-crystal pull-up step taken for a very long period of time, such as multi-pulling, and a manufacturing method thereof.

Means for Solving the Problems

The inventors conducted intensive studies on the mechanism of crystallization of the surface of a crucible at a high temperature in a crystal pull-up step and as a result, found the structure of a crystal layer, which enables continuous crystal growth and can prevent disappearance of the crystal layer due to delamination of the crystal layer and erosion into a silicon melt.

The present invention is based on such technical knowledge, and a quartz glass crucible according to a first aspect of the present invention is used for pulling up a silicon single crystal by a Czochralski method, and includes: a cylindrical crucible body which has a bottom and is made of quartz glass; and a crystallization-accelerator-containing coating film which is formed on a surface of the crucible body so as to cause a crystallization-accelerator-enriched layer to be formed in the vicinity of the surface of the crucible body by heating during a step of pulling up the silicon single crystal.

According to the present invention, since the crystallization of the quartz glass is accelerated by the presence of the crystallization-accelerator-enriched layer as a liquid phase during the step of pulling up the silicon single crystal, a crystal layer composed of an aggregate of dome-shaped or columnar crystal grains can be formed. Therefore, it is possible to prevent deformation of the crucible caused during the pull-up step taken for a very long period of time, such as multi-pulling. In addition, it is possible to prevent dislocation of the silicon single crystal caused by delamination of crystal grains (cristobalite) from the inner wall surface of the crucible. In addition, although stress in a shrinkage direction is applied to a glass layer which is in contact with the crystal layer due to the difference in thermal expansion coefficient or density between the crystal layer and the glass layer, the crystallization-accelerator-enriched layer between the crystal layer and the glass layer is a binary or higher glass having a low melting point, and the stress is relieved by interposing the crystallization-accelerator-enriched layer as a liquid phase.

In the present invention, it is preferable that a thickness of the crystallization-accelerator-enriched layer is 0.1 μm or more and 50 μm or less. The fluidity of the part is not so high due to the crystallization-accelerator-enriched layer having an appropriate thickness, so that the crystal layer and the glass layer are less likely to be shifted from each other, wrinkles and cracks are not generated in the surface of the crystal layer, and the crystal layer is not delaminated. Therefore, the manufacturing yield (single-crystal yield) of the silicon single crystal can be increased.

In the present invention, it is preferable that the crucible body includes a straight body portion having a cylindrical shape, a bottom portion which is curved, and a corner portion connects the straight body portion to the bottom portion, and the crystallization-accelerator containing-coating film is formed at least on the straight body portion, and is more preferably formed on the straight body portion and the corner portion. The crystallization-accelerator-containing coating film may be formed on at least the straight body portion and the corner portion, but may be formed on only the straight body portion and the corner portion. By forming the crystallization-accelerator-enriched layer at least in the straight body portion of the crucible body, it is possible to prevent the straight body portion from collapsing to the inside. In addition, by forming the crystallization-accelerator-enriched layer on the straight body portion and the corner portion, it is not only possible to prevent the straight body portion from collapsing to the inside, but also possible to prevent sinking, which causes an increase in the thickness of the lower portion of the crucible, or buckling (uplift).

In the present invention, it is preferable that an crystallization accelerator contained in the crystallization-accelerator-containing coating film contains a compound forming glass of a system of two or more components with $SiO_2$, and is particularly preferably barium (Ba). Other examples of the crystallization accelerator may include Mg, Ca, Sr, Ra, Li, Zn, and Pb. However, since barium has a small segregation coefficient to a silicon single crystal, even if Ba is taken into a silicon melt, Ba can suppress the risk of being incorporated into the silicon single crystal and causing a problem. In addition, as long as the crystallization accelerator is an element forming glass of a system of two components, or three or more components in combination with Si, the same effect as Ba can be obtained.

In addition, a quartz glass crucible according to a second aspect of the present invention is used for pulling up a silicon single crystal by a Czochralski method, and includes: a cylindrical crucible body which has a bottom and is made of quartz glass; and first and second crystallization-accelerator-containing coating films which are respectively formed on an inner surface of the crucible body and an outer surface of the crucible body so as to cause a ratio $t_i/t_o$ of a thickness $t_i$ of an inner crystal layer formed on the inner surface of the crucible body to a thickness to of an outer crystal layer formed on the outer surface of the crucible body by heating during a step of pulling up the silicon single crystal to be 0.3 or more and 5 or less.

According to the present invention, by causing the thickness ratio $t_i/t_o$ of the inner crystal layer to the outer crystal layer to be in a range of 0.3 to 5, even if there is a difference in shrinkage stress due to the difference in thermal expansion coefficient or density between the crystal layer and the glass layer during heating, the tensile stress of the glass layer from both the inner surface and the outer surface of the crucible is balanced, thereby preventing generation of wrinkles and cracks in the crystal layer. Therefore, it is possible to increase the single-crystal yield by preventing deformation of the crucible caused during the pull-up step taken for a very long period of time, such as multi-pulling.

In the present invention, it is preferable that a ratio $c_i/c_o$ of a concentration $c_i$ of a crystallization accelerator in the first crystallization-accelerator-containing coating film to a concentration $c_o$ of a crystallization accelerator in the second crystallization-accelerator-containing coating film is 0.3 or more and 20 or less. By causing the concentration ratio $c_i/c_o$ of between the crystallization accelerators in the first and second crystallization-accelerator-containing coating films to be in a range of 0.3 to 20, the thickness ratio $t_i/t_o$ of the inner crystal layer to the outer crystal layer can be within a range of 0.3 to 5.

In the present invention, it is preferable that a ratio $\eta_i/\eta_o$ of a glass viscosity $\eta_i$ on an inner surface side to a glass viscosity $\eta_o$ on an outer surface side of the crucible body at a heating temperature during the step of pulling up is 0.2 or more and 5 or less. By causing the glass viscosity ratio $\eta_i/\eta_o$ at a heating temperature during the step of pulling up to be in a range of 0.2 to 5, the thickness ratio $t_i/t_o$ of the inner crystal layer to the outer crystal layer can be within a range of 0.3 to 5.

In the present invention, it is preferable that the concentration of the crystallization accelerator in the first crystallization-accelerator-containing coating film is different from the concentration of the crystallization accelerator in the second crystallization-accelerator-containing coating film, and a glass viscosity on one surface side of the inner surface and the outer surface of the crucible body, which is in contact with a crystallization-accelerator-containing coating film having a higher crystallization-accelerator concentration, is higher than a glass viscosity on the other surface side which is in contact with a crystallization-accelerator-containing coating film having a lower crystallization accelerator concentration. By causing the viscosity of the glass surface being in contact with the crystallization-accelerator-containing coating film having a higher crystallization accelerator concentration to be higher, the crystallization rate can be made slow, and accordingly the thickness ratio $t_i/t_o$ of the inner crystal layer to the outer crystal layer can be within a range of 0.3 to 5.

In the present invention, it is preferable that an in-plane gradient of the thickness of each of the inner crystal layer and the outer crystal layer is 0.5 or more and 1.5 or less. In a case where the in-plane gradient of the thickness of the crystal layer is smaller than 0.5 or larger than 1.5 and there is unevenness in the thickness of the crystal layer, tensile stress is concentrated on a thin portion of the crystal layer and wrinkles and cracks are generated. However, since the in-plane gradient of the thickness of the crystal layer is in a range of 0.5 to 1.5 and the in-plane thickness of the crystal layer is uniform, even if there is a difference in shrinkage stress due to the difference in thermal expansion coefficient or density between the crystal layer and the glass layer during heating, there are no origins of deformation of the crystal layer, such as wrinkles and cracks, and wrinkles and cracks of the inner crystal layer and the outer crystal layer are prevented.

In the present invention, it is preferable that in-plane gradients of concentrations of crystallization accelerators in the first and second crystallization-accelerator-containing coating films are 40% or more and 150% or less. By causing the in-plane gradients of the concentrations of the crystallization accelerators in the first and second crystallization-accelerator-containing coating films to be 40 to 150%, the in-plane gradient of the thickness of each of the inner crystal layer and the outer crystal layer in a pull-up step can be within a range of 0.5 to 1.5.

In addition, a quartz glass crucible according to a third aspect of the present invention is used for pulling up a silicon single crystal by the Czochralski method, and includes: a cylindrical crucible body which has a bottom and is made of quartz glass; and a crystallization-accelerator-containing coating film which is formed on an inner surface of the crucible body so as to cause an inner crystal layer to be formed on the inner surface of the crucible body by heating during a step of pulling up the silicon single crystal, in which a ratio $\eta_o/\eta_i$ of a glass viscosity $\eta_o$ on an outer surface side to a glass viscosity $\eta_i$ on an inner surface side of the crucible body at a heating temperature during the step of pulling up is 0.5 or more and 10 or less.

According to the present invention, since the glass viscosity ratio $\eta_o/\eta_i$ of the outer surface side to the inner surface side of the crucible body is in a range of 0.5 to 10 and the viscosity of the outer glass layer is substantially the same as the inner glass layer, even if the surface-layer portion on the inner surface side of the crucible body is crystallized and shrinks, stress is relieved in the inner glass layer or the outer glass layer. Therefore, the generation of wrinkles and cracks in the inner crystal layer can be prevented.

In the present invention, it is preferable that an in-plane gradient of a thickness of the inner crystal layer is 0.5 or more and 1.5 or less. By causing the in-plane gradient of the thickness of the inner crystal layer to be in a range of 0.5 to 1.5, even if there is a difference in shrinkage stress due to the difference in thermal expansion coefficient or density between the inner crystal layer and the glass layer during heating, since the in-plane thickness of the inner crystal layer is uniform, there are no origins of deformation, such as wrinkles and cracks, of the inner crystal layer, and the generation of wrinkles and cracks in the inner crystal layer can be prevented.

In the present invention, it is preferable that an in-plane concentration gradient of a crystallization accelerator in the crystallization-accelerator-containing coating film is 40% or more and 150% or less. By causing the in-plane concentration gradient of the crystallization accelerator in the crystallization-accelerator-containing coating film to be 40 to 150%, the in-plane gradient of the thickness of the outer crystal layer in a pull-up step can be within a range of 0.5 to 1.5.

In addition, a quartz glass crucible according to a fourth aspect of the present invention, is used for pulling up a silicon single crystal by a Czochralski method, and includes: a cylindrical crucible body which has a bottom and is made of quartz glass; and a crystallization accelerator-containing-coating film which is formed on an outer surface of the crucible body so as to cause an outer crystal layer to be formed on the outer surface of the crucible body by heating during a step of pulling up the silicon single crystal, in which a ratio $\eta_i/\eta_o$ of a glass viscosity $\eta_i$ on an inner surface side to a glass viscosity $\eta_o$ on an outer surface side of the crucible body at a heating temperature during the step of pulling up is 0.5 or more.

According to the present invention, since the glass viscosity ratio $\eta_i/\eta_o$ of the inner surface side to the outer surface side of the crucible body is 0.5 or more and the viscosity of the inner glass layer is substantially the same as the outer glass layer, even if the surface-layer portion on the outer surface side of the crucible body is crystallized and shrinks, deformation and separation of solely the inner glass layer do not occur. Therefore, deformation of the crucible can be prevented.

In the present invention, it is preferable that an in-plane gradient of a thickness of the outer crystal layer is 0.5 or more and 1.5 or less. By causing the in-plane gradient of the thickness of the outer crystal layer to be in a range of 0.5 to 1.5, even if there is a difference in shrinkage stress due to the difference in thermal expansion coefficient or density between the outer crystal layer and the glass layer during heating, since the in-plane thickness of the outer crystal layer is uniform, there are no origins of deformation, such as wrinkles and cracks, of the outer crystal layer. Therefore, the generation of wrinkles and cracks in the outer crystal layer can be prevented.

In the present invention, it is preferable that an in-plane concentration gradient of a crystallization accelerator in the crystallization-accelerator-containing coating film is 40% or more and 150% or less. By causing the in-plane concentration gradient of the crystallization accelerator in the crystallization-accelerator-containing coating film to be 40 to 150%, the in-plane gradient of the thickness of the outer crystal layer in a pull-up step can be within a range of 0.5 to 1.5.

In addition, a quartz glass crucible according to a fifth aspect of the present invention is used for pulling up a silicon single crystal by a Czochralski method, and includes: a cylindrical crucible body which has a bottom and is made of quartz glass; and a first crystallization-accelerator-containing coating film which is formed on an inner surface of the crucible body so as to cause an inner crystal layer composed of an aggregate of dome-shaped or columnar crystal grains to be formed on a surface-layer portion of the inner surface of the crucible body by heating during a step of pulling up the silicon single crystal.

According to the present invention, by causing the crystal structure of the inner crystal layer to have orientation, crystallization is accelerated, so that the crystal layer having a thickness that does not cause deformation in the crucible wall can be formed. Therefore, it is possible to prevent deformation of the crucible caused during the pull-up step taken for a very long period of time, such as multi-pulling. In addition, it is possible to prevent dislocation of the silicon single crystal caused by delamination of crystal grains (cristobalite) from the inner wall surface of the crucible.

In the present invention, it is preferable that a ratio A/B between a maximum value A of a peak intensity at a diffraction angle 2θ of 20 to 25° and a maximum value B of a peak intensity at a diffraction angle 2θ of 33 to 40°, obtained by analyzing the inner surface of the crucible body on which the inner crystal layer is formed, by an X-ray diffraction method, is 7 or less. In a case where the analysis result of the X-ray diffraction method satisfies the above conditions, it can be determined that the inner crystal layer has a crystal structure in a dome-shaped orientation or columnar orientation. It should be noted that "orientation" refers to an aggregate of crystal grains grown with crystal axes aligned in a certain direction, and "dome-shaped orientation" refers to a crystal structure in which, when an aggregate of dome-shaped crystal grains is evaluated by XRD (X-ray diffraction), crystal grains with random crystal axis directions and crystal grains grown in an orientation coexist with each other, and orientation is confirmed in a portion of the aggregate of crystal grains.

In the present invention, it is preferable that the inner crystal layer has a dome-shaped crystal layer composed of the aggregate of dome-shaped crystal grains formed on the surface-layer portion of the inner surface of the crucible body, and a columnar crystal layer composed of the aggregate of columnar crystal grains immediately under the dome-shaped crystal layer. When the inner surface of the crucible undergoes crystal growth in a plane, there is concern that crystal grains which have grown may largely be delaminated, which may cause dislocation of the silicon single crystal. However, since the crystal growth of the inner crystal layer is changed from the dome-shaped orientation to the columnar orientation and the columnar crystal grains grow in the thickness direction, a structure in which the crystal grains are less likely to be delaminated even when the crystal grains grow can largely be achieved, thereby preventing dislocation of the silicon single crystal. In addition, the strength of the crucible can always be increased by allowing crystal growth to continue.

In the present invention, it is preferable that a ratio A/B between a maximum value A of a peak intensity at a diffraction angle 2θ of 20 to 25°, and a maximum value B of a peak intensity at a diffraction angle 2θ of 33 to 40° obtained by analyzing the inner surface of the crucible body on which the inner crystal layer is formed, measured by an X-ray diffraction method is less than 0.4. In a case where the analysis result of the X-ray diffraction method satisfies the above conditions, it can be determined that the inner crystal layer primarily has the crystal structure in a columnar orientation.

In the present invention, it is preferable that a crystallization accelerator contained in the first crystallization-accelerator-containing coating film is an element that can become divalent cations to form glass with quartz glass, and is particularly preferably barium which growth in an orientation most strongly compared to other elements. In a case where the crystallization accelerator is barium, and a concentration of the barium in the inner surface of the crucible body is preferably $3.9 \times 10^{16}$ atoms/cm$^2$ or more. Accordingly, a countless number of crystal nuclei are generated on the surface of the crucible within a short period of time, so that crystal growth in a columnar orientation can be accelerated from the earliest possible stage.

It is preferable that the quartz glass crucible according to the present invention further includes: a second crystallization-accelerator-containing coating film which is formed on an outer surface of the crucible body so as to cause an outer crystal layer composed of an aggregate of dome-shaped or columnar crystal grains to be formed on a surface-layer portion of the outer surface of the crucible body by heating during the step of pulling up. With this configuration, by causing the crystal structure of the outer crystal layer to have orientation, crystallization is accelerated, so that the crystal layer having a thickness that does not cause deformation in the crucible wall can be formed. Therefore, it is possible to prevent deformation of the crucible caused during the pull-up step taken for a very long period of time, such as multi-pulling. In addition, since the outer crystal layer can have an appropriate thickness according to the pull-up time, it is possible to prevent foaming and delamination from the quartz glass interface of the outer crystal layer.

In the present invention, it is preferable that a ratio A/B between a maximum value A of a peak intensity at a diffraction angle 2θ of 20 to 25° and a maximum value B of a peak intensity at a diffraction angle 2θ of 33 to 40° obtained by analyzing the outer surface of the crucible body, on which the outer crystal layer is formed, by an X-ray diffraction method is 0.4 or more and 7 or less. In a case where the analysis result of the X-ray diffraction method satisfies the above conditions, it can be determined that the outer crystal layer has the crystal structure in a dome-shaped orientation.

In the present invention, it is preferable that a crystallization accelerator contained in the second crystallization-accelerator-containing coating film is barium, and a concentration of the barium in the outer surface of the crucible body is equal to or more than $4.9 \times 10^{15}$ atoms/cm$^2$ and less than $3.9 \times 10^{16}$ atoms/cm$^2$. Accordingly, crystal growth in a dome-shaped orientation can be accelerated.

In addition, a quartz glass crucible according to a sixth aspect of the present invention is used for pulling up a silicon single crystal by a Czochralski method, and includes: a cylindrical crucible body which has a bottom and is made of quartz glass; and a second crystallization accelerator-containing-coating film which is formed on an outer surface of the crucible body so as to cause an outer crystal layer composed of an aggregate of dome-shaped or columnar crystal grains to be formed on a surface-layer portion of the outer surface of the crucible body by heating during a step of pulling up the silicon single crystal.

According to the present invention, by causing the crystal structure of the outer crystal layer to have orientation, crystallization is accelerated, so that the crystal layer having a thickness that does not cause deformation in the crucible wall can be formed. Therefore, it is possible to prevent deformation of the crucible caused during the pull-up step taken for a very long period of time, such as multi-pulling. In addition, since the outer crystal layer can have an appropriate thickness according to the pull-up time, it is possible to prevent foaming and delamination from the quartz glass interface of the outer crystal layer.

A ratio A/B between a maximum value A of a peak intensity at a diffraction angle 2θ of 20 to 25° and a maximum value B of a peak intensity at a diffraction angle 2θ of 33 to 40° obtained by analyzing the outer surface of the crucible body, on which the outer crystal layer is formed, by an X-ray diffraction method is preferably 7 or less, and particularly preferably 0.4 or more and 7 or less. In a case where A/B from the analysis result of the X-ray diffraction method is 7 or less, the outer crystal layer can be determined to have the crystal structure in a dome-shaped orientation or columnar orientation, and can be determined to have a dome-shaped orientation in a case where A/B is 0.4 or more and 7 or less.

In addition, a manufacturing method of a quartz glass crucible according to a seventh aspect of the present invention steps of: manufacturing a cylindrical crucible body which has a bottom and is made of quartz glass; and forming a crystallization-accelerator containing-coating film on an inner surface or an outer surface of the crucible body so as to cause a crystallization-accelerator-enriched layer to be formed in the vicinity of a surface of at least one of the inner surface and the outer surface of the crucible body by heating during a step of pulling up the silicon single crystal.

According to the present invention, since the crystallization of the quartz glass is accelerated, a crystal layer composed of an aggregate of dome-shaped or columnar crystal grains can be formed. Therefore, it is possible to prevent deformation of the crucible caused during the pull-up step taken for a very long period of time, such as multi-pulling. In addition, since the crystallization-accelerator-enriched layer is interposed between the crystal layer and the glass layer as a liquid phase, stress is relieved, and since the crystallization-accelerator-enriched layer has an appropriate thickness, the fluidity of the part is not so high, so that the crystal layer and the glass layer are less likely to be shifted from each other, wrinkles and cracks are not generated on the surface of the crystal layer, and the crystal layer is not delaminated. Therefore, the manufacturing yield of the silicon single crystal can be increased.

In addition, a manufacturing method of a quartz glass crucible according to an eighth aspect of the present invention steps of: manufacturing a cylindrical crucible body which has a bottom and is made of quartz glass; forming a first crystallization-accelerator-containing coating film on an inner surface of the crucible body so as to an inner crystal layer to be formed on the inner surface of the crucible body by heating during a step of pulling up the silicon single crystal; and forming a second crystallization-accelerator-containing coating film on an outer surface of the crucible body so as to an outer crystal layer having a thickness to to be formed on the outer surface of the crucible body by heating during a step of pulling up the silicon single crystal, in which the steps of forming the first and second crystallization-accelerator-containing coating films include a step of applying crystallization accelerators in which concentrations of the crystallization accelerators are adjusted so as to cause a ratio $t_i/t_o$ of a thickness $t_i$ of the inner crystal layer to the thickness $t_o$ of the outer crystal layer to be 0.3 or more and 5 or less.

According to the present invention, even if there is a difference in shrinkage stress due to the difference in thermal expansion coefficient or density between the crystal layer and the glass layer during heating, the tensile stress of the glass layer from both the inner surface and the outer surface of the crucible is balanced, thereby preventing generation of wrinkles and cracks in the crystal layer. Therefore, it is possible to manufacture a crucible which is less likely to deform during the pull-up step taken for a very long period of time, such as multi-pulling.

In addition, a manufacturing method of a quartz glass crucible according to a ninth aspect of the present invention steps of: manufacturing a cylindrical crucible body which has a bottom and is made of quartz glass; and forming a crystallization-accelerator-containing coating film on an inner surface of the crucible body so as to cause an inner crystal layer to be formed on the inner surface of the crucible body by heating during a step of pulling a the silicon single crystal, in which the step of manufacturing the crucible body includes a step of subjecting raw material quartz powders to arc melting in a rotating mold, and types of the raw material quartz powder forming an inner surface side of the crucible body and the raw material quartz powder forming an outer surface side of the crucible are changed so as to cause a ratio $\eta_o/\eta_i$ of a glass viscosity $\eta_o$ on the outer surface side of the crucible body to a glass viscosity $\eta_i$ on the inner surface side of the crucible body at a heating temperature during the step of pulling up to be 0.5 or more and 10 or less.

According to the present invention, even if the surface-layer portion on the outer surface side of the crucible body is crystallized and shrinks, it is possible to manufacture a quartz glass crucible which is less likely to deform.

In addition, a manufacturing method of a quartz glass crucible according to a tenth aspect of the present invention steps of: manufacturing a cylindrical crucible body which has a bottom and is made of quartz glass; and forming a crystallization-accelerator-containing coating film on an outer surface of the crucible body so as to cause an outer crystal layer to be formed on the outer surface of the crucible body by heating during a step of pulling up a silicon single crystal, in which the step of manufacturing the crucible body includes a step of subjecting raw material quartz powders to arc melting in a rotating mold, and types of the raw material quartz powder forming an inner surface side of the crucible body and the raw material quartz powder forming an outer surface side of the crucible are changed so as to cause a ratio $\eta_i/\eta_o$ of a glass viscosity $\eta_i$ on the inner surface side of the crucible body to a glass viscosity $\eta_o$ on the outer surface side of the crucible body at a heating temperature during the step of pulling up to be 0.5 or more.

According to the present invention, even if the surface layer portion on the inner surface side of the crucible body is crystallized and shrinks, it is possible to manufacture a quartz glass crucible which is less likely to deform.

In addition, a manufacturing method of a quartz glass crucible according to an eleventh aspect of the present invention includes: applying a first crystallization-accelerator-coating solution containing a thickener to an inner surface of the quartz glass crucible so as to cause a concentration of a crystallization accelerator in the inner surface to be $3.9 \times 10^{16}$ atoms/cm$^2$ or more. In addition, it is preferable that the manufacturing method of a quartz glass crucible according to the present invention further includes: applying a second crystallization-accelerator-coating solution containing the thickener to an outer surface of the quartz glass crucible so as to cause the concentration of the crystallization accelerator in the outer surface to be equal to or more than $4.9 \times 10^{15}$ atoms/cm$^2$ and less than $3.9 \times 10^{16}$ atoms/cm$^2$. As described above, the inner crystal layer in the columnar orientation can be formed on the inner surface of the crucible, and the outer crystal layer in the dome-shaped orientation can be formed on the outer surface of the crucible.

A manufacturing method of a quartz glass crucible according to a twelfth aspect of the present invention includes: applying a crystallization accelerator coating solution to a surface of a quartz glass base material; forming a crystal layer on a surface-layer portion of the surface of the quartz glass base material by an evaluation heat treatment at 1400° C. or higher; analyzing a crystallized state of the surface of the quartz glass base material by an X-ray diffraction method, and adjusting a concentration of a crystallization accelerator in the crystallization accelerator coating solution based on an analysis result; and applying the adjusted crystallization accelerator coating solution to a surface of the quartz glass crucible.

Crystal grains in a dome-shaped orientation or a columnar orientation can be grown by causing the crystallization accelerator to be present at a high density at the interface between quartz glass and the crystal grains. However, the degree of density at which the crystallization accelerator is present by applying the crystallization accelerator coating solution to the surface of the quartz glass crucible is unclear. However, by checking in advance the action of the crystallization accelerator coating solution using the quartz glass base material, problems such as deformation of the quartz glass crucible in an actual pull-up step can be prevented in advance.

According to a thirteenth aspect of the present invention, a manufacturing method of a silicon single crystal by a Czochralski method in which a silicon single crystal is pulled up from a silicon melt in a quartz glass crucible, includes: applying a first crystallization accelerator coating solution to an inner surface of the quartz glass crucible; forming, on a surface-layer portion of the inner surface of the quartz glass crucible, an inner crystal layer having a laminated structure of a dome-shaped crystal layer composed of an aggregate of dome-shaped crystal grains and a columnar crystal layer composed of an aggregate of columnar crystal grains immediately under the dome-shaped crystal layer, by heating in a step of pulling up the silicon single crystal; and pulling up the silicon single crystal while allowing growth of the inner crystal layer to continue.

According to the present invention, by causing the crystal structure of the inner crystal layer to have orientation, crystallization is accelerated, so that the crystal layer having a thickness that does not cause deformation in the crucible wall can be formed. Therefore, it is possible to prevent deformation of the crucible caused during the pull-up step taken for a very long period of time, such as multi-pulling. In addition, it is possible to prevent dislocation of the silicon single crystal caused by delamination of crystal grains (cristobalite) from the inner wall surface of the crucible.

In the present invention, it is preferable that a ratio A/B between a maximum value A of a peak intensity at a diffraction angle 2θ of 20 to 25° and a maximum value B of a peak intensity at a diffraction angle 2θ of 33 to 40° obtained by analyzing the inner surface of the crucible body on which the inner crystal layer is formed, measured by an X-ray diffraction method is less than 0.4. In a case where the analysis result of the X-ray diffraction method satisfies the above conditions, it can be determined that the inner crystal layer primarily has the crystal structure in a columnar orientation.

In the present invention, it is preferable that a crystallization accelerator contained in the first crystallization-accelerator coating solution is barium, and a concentration of the barium applied to the inner surface is $3.9 \times 10^{16}$ atoms/cm$^2$ or more. Accordingly, a countless number of crystal nuclei are generated on the surface of the crucible within a short period of time, so that crystal growth in a columnar orientation can be accelerated from the earliest possible stage.

It is preferable that the manufacturing method of a silicon single crystal according to the present invention further includes: applying a second crystallization-accelerator coating solution is applied to an outer surface of the quartz glass crucible; forming an outer crystal layer composed of an aggregate of dome-shaped crystal grains on a surface-layer portion of the outer surface of the quartz glass crucible by heating in the step of pulling up the silicon single crystal; and pulling up the silicon single crystal without allowing growth of the outer crystal layer to continue.

Accordingly, by causing the crystal structure of the outer crystal layer to have orientation, crystallization is accelerated, so that the crystal layer having a thickness that does not cause deformation in the crucible wall can be formed. Therefore, it is possible to prevent deformation of the crucible caused during the pull-up step taken for a very long period of time, such as multi-pulling. In addition, since the outer crystal layer can have an appropriate thickness according to the pull-up time, it is possible to prevent foaming and delamination from the quartz glass interface of the outer crystal layer.

In the present invention, it is preferable that a ratio AB between a maximum value A of a peak intensity at a diffraction angle 2θ of 20 to 25° and a maximum value B of a peak intensity at a diffraction angle 2θ of 33 to 40° obtained by analyzing the outer surface of the quartz glass crucible, on which the outer crystal layer is formed, by an X-ray diffraction method is 0.4 or more and 7 or less. In a case where the analysis result of the X-ray diffraction method satisfies the above conditions, it can be determined that the outer crystal layer has a crystal structure in a dome-shaped orientation.

In the present invention, it is preferable that a crystallization accelerator contained in the second crystallization-accelerator-coating solution is barium, and a concentration of the barium applied to the outer surface is equal to or more than $4.9 \times 10^{15}$ atoms/cm$^2$ and less than $3.9 \times 10^{16}$ atoms/cm$^2$. Accordingly, crystal growth in a dome-shaped orientation can be accelerated.

In the present invention, it is preferable that the first and second crystallization-accelerator coating solutions further contain a thickener. Accordingly, the viscosity of the coating solution can be increased, so that it is possible, when applied to the crucible, to prevent the coating solution from flowing with gravity and the like, and becoming uneven. In addition, since the crystallization accelerator does not cohere in the coating solution but diffuses, it is possible to uniformly apply the crystallization accelerator to the surface of the crucible. Therefore, the crystallization accelerator at a high concentration can be uniformly and densely fixed to the wall surface of the crucible, thereby accelerating the growth of crystal grains in a columnar orientation or a dome-shaped orientation.

In the present invention, it is preferable that a region having a predetermined width extending downward from a rim upper end of the inner surface and a rim upper end of the outer surface of the crucible body, is a crystallization-accelerator-uncoated region in which the crystallization-accelerator-containing coating film is not formed. Accordingly, the generation of particles of small crystal fragments at the rim upper end can be suppressed, and a reduction in the yield of the silicon single crystal can be prevented. It is preferable that the crystallization-accelerator-uncoated region is formed by applying the crystallization-accelerator coating solution by a spraying method in a state in which the region having a predetermined width extending downward from the rim upper end is masked.

In the manufacturing method of a silicon single crystal according to the present invention, it is preferable that a crystallized state of the inner crystal layer formed by heating in the step of pulling up is analyzed, and based on an analysis result, a concentration of the crystallization accelerator in the first crystallization-accelerator coating solution applied to an inner surface of a new quartz glass crucible used in a subsequent step of pulling up a silicon single crystal is adjusted. Accordingly, the crystallized state of the inner surface of the crucible used can be evaluated and fed back to the quality of a subsequent quartz glass crucible, thereby improving the durability and reliability of the crucible.

In the manufacturing method of a silicon single crystal according to the present invention, it is preferable that a crystallized state of the outer crystal layer formed by heating in the step of pulling up is analyzed, and based on an analysis result, a concentration of the crystallization accelerator in the second crystallization-accelerator coating solution applied to an outer surface of a new quartz glass crucible used in a subsequent step of pulling up a silicon single crystal is adjusted. Accordingly, by evaluating the crystallized state of the outer surface of the used crucible and reflecting it in the quality of a subsequent quartz glass crucible, the durability and reliability of the crucible can be improved.

Effects of the Invention

According to the present invention, it is possible to provide a quartz glass crucible capable of withstanding a single crystal pull-up step taken for a very long period of time, such as multi-pulling, and a manufacturing method thereof. According to the present invention, it is possible to provide a manufacturing method of a silicon single crystal using the quartz glass crucible.

BRIEF DESCRIPTION OF DRAWINGS

FIGS. 3 (a) to (c) are schematic views for explaining a mechanism of crystallization of the surface-layer portion of the crucible by a crystallization accelerator.

FIGS. 4 (a) and (b) are cross-sectional views of the vicinity of the surface of the quartz glass crucible after use illustrated in FIG. 2, in which (a) is an image taken with an optical microscope, and (b) is a Ba ion image map of a crystal glass interface, which is an analysis result of TOF-SIMS.

FIGS. 5 (a) to (e) are photographs of the crystallized surface of the crucible, in which (a) shows a state in which wrinkles are generated on the surface of the crucible, (b) shows a state in which there are no wrinkles and cracks on the surface of the crucible, (c) shows a state in which only wrinkles are generated on the surface of the crucible and no cracks are generated, (d) shows a state in which wrinkles and cracks are generated on the surface of the crucible, and (e) shows a state in which wrinkles and cracks are generated on the surface of the crucible and furthermore, delamination of the crystal layer occurs.

FIGS. 6 (a) to (c) show graphs showing measurement results of the surface-layer portion of the crucible by the surface X-ray diffraction method, in which FIGS. 6(a), 6(b), and 6(c) show crystal layers in a random orientation, in a dome-shaped orientation, and in a columnar orientation, respectively.

FIG. 7 is a table showing suitable crystal structures of an inner crystal layer 14A and an outer crystal layer 14B for each part.

FIGS. 10 (a) and (b) are schematic cross-sectional views illustrating the structure of a quartz glass crucible according to a second embodiment of the present invention.

FIGS. 11 (a) and (b) are schematic views for explaining the relationship between the glass viscosity and crystal layers of the crucible.

FIGS. 12 (a) and (b) are schematic cross-sectional views illustrating the structure of a quartz glass crucible according to a third embodiment of the present invention.

FIG. 16(a) is an image showing observation results by SEM, and FIG. 16(b) is a graph showing the relationship between a heating time of a quartz glass plate and a thickness of a crystal layer formed on a surface-layer portion of the quartz glass plate.

FIGS. 18 (a) and (b) show evaluation results of crystallized states and deformation when (sample #2) a quartz glass crucible to which a coating solution containing barium is applied is used in an actual crystal pull-up step, in which (a) is an SEM image of the crystal layer, and (b) is an X-ray diffraction spectrum graph.

FIGS. 19 (a) and (b) show evaluation results of crystallized states and deformation when (sample #3) a quartz glass crucible to which a coating solution containing barium is applied is used in an actual crystal pull-up step, in which (a) is an SEM image of the crystal layer, and (b) is an X-ray diffraction spectrum graph.

FIG. 20 is a table showing evaluation results of quartz glass crucibles used for actual crystal pulling.

FIG. 21 is a table showing evaluation results of quartz glass crucibles used for actual crystal pulling.

FIG. 22 is a table showing evaluation results of quartz glass crucibles used for actual crystal pulling.

FIG. 23 is a table showing evaluation results of quartz glass crucibles used for actual crystal pulling.

FIG. 24 is a table showing evaluation results of quartz glass crucibles used for actual crystal pulling.

MODE FOR CARRYING OUT THE INVENTION

Preferred embodiments of the present invention will be described in detail below with reference to the accompanying drawings.

Figure 1:
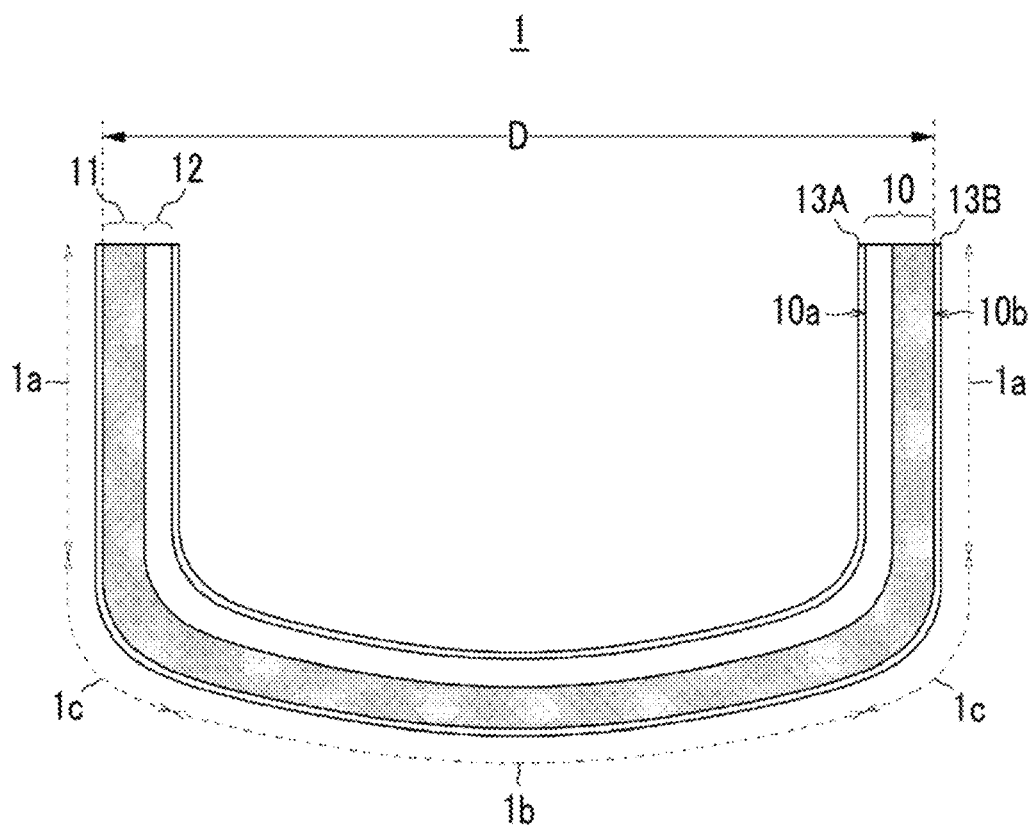
FIG. 1 is a schematic cross-sectional view illustrating the structure of a quartz glass crucible according to a first embodiment of the present invention.

FIG. 1 is a schematic cross-sectional view illustrating the structure of a quartz glass crucible according to a first embodiment of the present invention.

As illustrated in FIG. 1, a quartz glass crucible 1 is a cylindrical container having a bottom for supporting a silicon melt, and includes a straight body portion 1a having a cylindrical shape, a bottom portion 1b which is gently curved, and a corner portion 1c which has a larger curvature than the bottom portion 1b and connects the straight body portion 1a to the bottom portion 1b.

The diameter D (aperture) of the quartz glass crucible 1 is 24 inches (about 600 mm) or more and is preferably 32 inches (about 800 mm) or more. This is because such a crucible having a large aperture is used for pulling up a large-size silicon single crystal ingot having a diameter of 300 mm or more and is required to be less likely to be deformed even when used for a long period of time. In recent years, with an increase in the size of a crucible due to an increase in the size of a silicon single crystal and an increase in the time for a pull-up step, the thermal environment of the crucible has become more severe, and improvement in the durability of a large crucible is an extremely important issue. Although the thickness of the crucible slightly varies depending on its part, the thickness of the straight body portion 1a of a crucible of 24 inches or more is preferably 8 mm or more, the thickness of the straight body portion 1a of a large crucible of 32 inches or more is preferably 10 mm or more, and the thickness of the straight body portion 1a of a large crucible of 40 inches (about 1000 mm) or more is more preferably 13 mm or more.

The quartz glass crucible 1 has a two-layer structure, and includes an opaque layer 11 (bubble layer) made of quartz glass containing a large number of minute bubbles, and a transparent layer 12 (bubble-free layer) made of quartz glass with substantially no bubbles contained therein.

The opaque layer 11 is provided in order to heat the silicon melt in the crucible as uniformly as possible without radiant heat from a heater of a single crystal pull-up apparatus being transmitted through the crucible wall. Therefore, the opaque layer 11 is provided in the entire crucible ranging from the straight body portion 1a to the bottom portion 1b of the crucible. The thickness of the opaque layer 11 is a value obtained by subtracting the thickness of the transparent layer 12 from the thickness of the crucible wall, and varies depending on the part of the crucible.

The bubble content rate in the quartz glass forming the opaque layer 11 is 0.8% or more, and preferably 1 to 5%. The bubble content rate of the opaque layer 11 can be obtained by specific gravity measurement (Archimedes' method). When an opaque quartz glass piece of unit volume (1 cm$^3$) is cut out from a crucible and the mass thereof is referred to as A, and the specific gravity of the quartz glass with no bubbles contained therein (true density of quartz glass) is referred to as B=2.2 g/cm$^3$, the bubble content rate P (%) is P=(B−A)/B×100.

The transparent layer 12 is a layer forming the inner surface of the crucible wall which is in contact with the silicon melt, is required to be highly pure in order to prevent contamination of the silicon melt, and is provided in order to, if bubbles are contained, prevent dislocation of a single crystal due to crucible fragments and the like when the bubbles burst. The thickness of the transparent layer 12 is preferably 0.5 to mm, and is set to an appropriately thickness for each part of the crucible so as not to cause the opaque layer 11 to be exposed due to the transparent layer 12 being completely removed by erosion during a single crystal pull-up step. Similarly to the opaque layer 11, it is preferable that the transparent layer 12 is provided over the entire crucible from the straight body portion 1a to the bottom portion 1b of the crucible. However, in the upper end portion (rim portion) of the crucible which is not in contact with the silicon melt, it is also possible to omit formation of the transparent layer 12.

"With substantially no bubbles contained" in the transparent layer 12 means a bubble content rate at which the single-crystal yield is not decreased by crucible fragments when bubbles burst, and means that the bubble content rate is 0.8% or less and the average diameter of the bubbles is 100 μm or less. A change in the bubble content rate at the boundary between the opaque layer 11 and the transparent layer 12 is steep, and the boundary between the two is apparent with the naked eye.

The bubble content rate of the transparent layer 12 can be measured nondestructively using optical detecting means. The optical detecting means includes a light receiving device which receives the reflected light of the light irradiating the inner surface of a crucible to be inspected. Irradiation light emitting means may be built in or external light emitting means may also be used. In addition, as the optical detecting means, one that can be turned along the inner surface of the quartz glass crucible is preferably used. As the irradiation light, X-rays, laser light, and the like as well as visible light, ultraviolet light, and infrared light can be used, and any light can be applied as long as the light can be reflected for bubble detection. The light receiving device is selected according to the type of the irradiation light, and for example, an optical camera including a light receiving lens and an imaging unit can be used.

Measurement results by the optical detecting means are received by an image processing device to calculate the bubble content rate. Specifically, an image of the inner surface of the crucible is taken using the optical camera, the inner surface of the crucible is divided into predetermined areas as reference areas S1, an area S2 occupied by bubbles is obtained for each reference area S1, and the bubble content rate P (%) is calculated by $P=(S2/S1)\times 100$. In order to detect bubbles present at a constant depth from the surface of quartz glass, the focal point of a light receiving lens may be scanned in a depth direction from the surface. A plurality of images are taken in this manner, and the bubble content rate in a space may be obtained on the basis of the bubble content rate of each of the images.

The quartz glass crucible 1 according to the embodiment includes a crucible body 10 made of quartz glass, and first and second crystallization-accelerator-containing coating films 13A and 13B respectively formed on an inner surface 10a and an outer surface 10b of the crucible body 10. Such coating films play a role in accelerating crystallization of the surface-layer portion of the crucible body 10 by heating in a step of pulling up a silicon single crystal. Typically, the inner surface 10a of the crucible body 10 serves as the surface of the transparent layer 12, the outer surface 10b serves as the surface of the opaque layer 11, and the first crystallization-accelerator-containing coating film 13A and the second crystallization-accelerator-containing coating film 13B are respectively formed on the transparent layer 12 and the opaque layer 11. The crystallization-accelerator-containing coating films 13A and 13B contain a water-soluble polymer acting as a thickener, whereby a hard film is formed on the surface of the crucible body 10.

The thickness of the crystallization-accelerator-containing coating films 13A and 13B is preferably 0.3 to 100 μm. Accordingly, the concentration of barium applied to the crucible body 10 is controlled by changing the thickness of the crystallization-accelerator-containing coating films 13A and 13B. It should be noted that elements that can act as a crystallization accelerator are not intentionally added to the crucible body 10 made of quartz glass, and for example, in a case where the crucible body 10 is formed of natural quartz powder, it is preferable that the concentration of barium contained in the crucible body 10 is less than 0.10 ppm, the concentration of magnesium is less than 0.10 ppm, and the concentration of calcium is less than 2.0 ppm. In a case of using synthetic quartz powder as the constituent raw material of the inner surface in the crucible body 10, it is preferable that the concentrations of both magnesium and calcium contained in the crucible body 10 are less than 0.02 ppm.

The crystallization accelerator contained in the crystallization-accelerator-containing coating films 13A and 13B is an element in group 2a, and examples thereof include magnesium (Mg), calcium (Ca), strontium (Sr), barium (Ba), and radium (Ra). However, barium is particularly preferred because of its small segregation coefficient to silicon, and the characteristics that the crystallization rate does not attenuate with crystallization, and growth in an orientation is caused most strongly compared to other elements. In addition, barium is stable at room temperature and easy to handle, and has substantially the same nuclear radius as that of glass (Si), so that there is also an advantage that a crystallization-accelerator-enriched layer, which will be described later, is easily formed. The crystallization-accelerator-containing coating films 13A and 13B can be formed by applying a coating solution containing barium to the wall surface of the crucible. Examples of the crystallization accelerator include lithium (Li), zinc (Zn), and lead (Pb) in addition to the elements in group 2a.

The coating solution containing barium may be a coating solution containing a barium compound and water, or may be a coating solution which does not contain water but contains anhydrous ethanol and a barium compound. Examples of the barium compound include barium carbonate, barium chloride, barium acetate, barium nitrate, barium hydroxide, barium oxalate, and barium sulfate. It should be noted that if the surface concentration (atoms/cm$^2$) of the barium element is the same, the crystallization acceleration effect is also the same regardless of being insoluble or being water-soluble. However, since barium which is insoluble in water is less likely to be taken into the human body, it is highly safe and is advantageous in terms of handling.

It is preferable that the coating solution containing barium further contains a highly viscous water-soluble polymer (thickener) such as carboxyvinyl polymer. In a case of using a coating solution without a thickener contained therein, fixing of barium to the wall surface of the crucible is instable, so that a heat treatment for fixing barium is necessary. When such a heat treatment is performed, barium diffuses and penetrates into the quartz glass, and becomes the cause of acceleration of random growth of crystal, which will be described later. However, in a case of using a coating solution containing a thickener together with barium, the viscosity of the coating solution increases, so that it is possible to prevent the coating solution from flowing with gravity when applied to the crucible and thus becoming uneven. Furthermore, regarding the barium compound such as barium carbonate, in a case where the coating solution contains the water-soluble polymer, the barium compound does not cohere in the coating solution but diffuses, so that it is possible to uniformly apply the barium compound to the surface of the crucible. Therefore, barium at a high concentration can be uniformly and densely fixed to the wall surface of the crucible, thereby accelerating the growth of crystal grains in a columnar orientation or a dome-shaped orientation, which will be described later.

Examples of the thickener include water-soluble polymers containing a small amount of metallic impurities such as polyvinyl alcohol, a cellulosic thickener, high purity glucomannan, an acrylic polymer, a carboxyvinyl polymer, and a polyethylene glycol fatty acid ester. In addition, an acrylic acid-alkyl methacrylate copolymer, polyacrylate, polyvinyl carboxylic acid amide, vinylcarboxylic acid amide, or the like may also be used as the thickener. The viscosity of the coating solution containing barium is preferably in a range of 100 to 10000 mPa·s, and the boiling point of the solvent is preferably 50 to 100° C.

For example, a crystallization accelerator coating solution for coating the outer surface of a 32-inch crucible contains 0.0012 g/mL of barium carbonate and 0.0008 g/mL of a carboxyvinyl polymer, and can be produced by adjusting the ratio between ethanol and pure water and mixing and stirring the mixture therein.

Application of the crystallization accelerator coating solution to the surface of the crucible can be performed by a brush or a spray. After the application, water and the like evaporate such that a hard film is formed by the thickener. It should be noted that in a method of the related art, after applying water or alcohols containing barium carbonate, the crucible is heated to 200 to 300° C. for the purpose of suppressing delamination. Due to the heating, barium on the surface diffuses to the inside, crystal nuclei are simultaneously generated, so that random growth is necessarily incurred. Therefore, after being applied, the coating film should not be heated before pulling operation.

It is preferable that the concentration of the crystallization accelerator in the surface-layer portion of the crucible body 10 on which the crystallization accelerator-containing-coating film is formed is low. In a case where the concentration of the crystallization accelerator in the crucible body 10 is high, random growth occurs in the surface-layer portion of the crucible body 10 and the crystallization accelerator in the crystallization-accelerator-containing coating film is trapped at the crystal interface, whereby it is difficult to form a crystallization-accelerator-enriched layer. However, in a case where the crystallization-accelerator containing-coating film is formed on the surface of the crucible body 10, the crystallization accelerator can be localized on the surface of the crucible body 10 at a uniform concentration. In particular, in a case where the concentration of the crystallization accelerator in the quartz glass is low, the crystallization accelerator having a high concentration is uniformly localized on the surface of the crucible body 10, so that random growth is not incurred when the crystallization proceeds due to heat applied by subsequent crystal pulling and a crystallization-accelerator-enriched layer is more likely to be formed.

In the embodiment, the first and second crystallization-accelerator-containing coating films 13A and 13B are formed on substantially the entire inner and outer surfaces of the crucible body 10, but may be formed at least on the straight body portion 1a. By forming the crystallization-accelerator-enriched layer at least on the straight body portion 1a, it is possible to prevent the straight body portion 1a from collapsing to the inside.

It is preferable that the first and second crystallization-accelerator-containing coating films 13A and 13B are formed on the straight body portion 1a and the corner portion 1c. The first and second crystallization-accelerator-containing coating films 13A and 13B may be formed at least on the straight body portion 1a and the corner portion 1c, but may be formed only on the straight body portion and the corner portion. By forming the crystallization-accelerator-enriched layer on the straight body portion and the corner portion, it is not only possible to prevent the straight body portion from collapsing to the inside, but also possible to prevent sinking, which causes an increase in the thickness of the lower portion of the crucible, or buckling (uplift). The crystallization-accelerator-containing coating film may be, or may not be on the bottom portion 1b. There may be cases where the bottom portion 1b of the crucible is deformed to be uplifted, and such uplift can be prevented by the presence of the crystal layer on the bottom portion 1b.

Although the details will be described later, the crystallization-accelerator-containing coating film may be formed only on the inner surface 10a side of the crucible body 10 or may be formed only on the outer surface 10b side. However, in this case, careful consideration is needed so that deformation is not caused by the shrinkage stress when the surface of the crucible body 10 is crystallized by the action of the crystallization-accelerator-containing coating film.

In the embodiment, it is preferable that the ratio $c_i/c_o$ of the concentration $c_i$ of the crystallization accelerator in the first crystallization-accelerator-containing coating film 13A to the concentration $c_o$ of the crystallization accelerator in the second crystallization-accelerator-containing coating film 13B is 0.3 or more and 20 or less. By causing the ratio $c_i/c_o$ of the concentration of the crystallization accelerator to be in a range of 0.3 to 20, the thickness ratio ($t_i/t_o$) of an inner crystal layer 14A to an outer crystal layer 14B, which will be described later, can be within a range of 0.3 to 5.

In the embodiment, the ratio of the glass viscosity $\eta_i$ on the inner surface 10a side to the glass viscosity $\eta_o$ on the outer surface 10b side of the crucible body 10 at a heating temperature in a pull-up step is 0.2 or more and 5 or less. By causing the ratio $\eta_i/\eta_o$ of the glass viscosity to be in a range of 0.2 to 5, the thickness ratio ($t_i/t_o$) of the inner crystal layer 14A to the outer crystal layer 14B, which will be described later, can be within a range of 0.3 to 5.

In the embodiment, it is preferable that the concentration ci of the crystallization accelerator in the first crystallization-accelerator-containing coating film 13A is different from the concentration co of the crystallization accelerator in the second crystallization-accelerator-containing coating film 13B, and the glass viscosity on one surface side of the inner surface 10a and the outer surface 10b of the crucible body 10, which is in contact with the crystallization-accelerator-containing coating film having a higher crystallization accelerator concentration is higher than the glass viscosity on the other surface side which is in contact with the crystallization-accelerator-containing coating film having a lower crystallization accelerator concentration. For example, in a case of ci>co, it is preferable that the glass viscosity $\eta_i$ on the inner surface 10a side of the crucible body 10 is higher than the glass viscosity $\eta_o$ on the outer surface 10b side. In contrast, in a case of ci<co, it is preferable that the glass viscosity $\eta_o$ on the outer surface 10b side of the crucible body 10 is higher than the glass viscosity $\eta_i$ on the inner surface 10a side. By causing the viscosity of the glass surface in contact with the crystallization-accelerator-containing coating film having a higher crystallization accelerator concentration to be higher, the crystallization rate can be made slow, and accordingly the thickness ratio $t_i/t_o$ of the inner crystal layer to the outer crystal layer can be within a range of 0.3 to 5.

Figure 2:
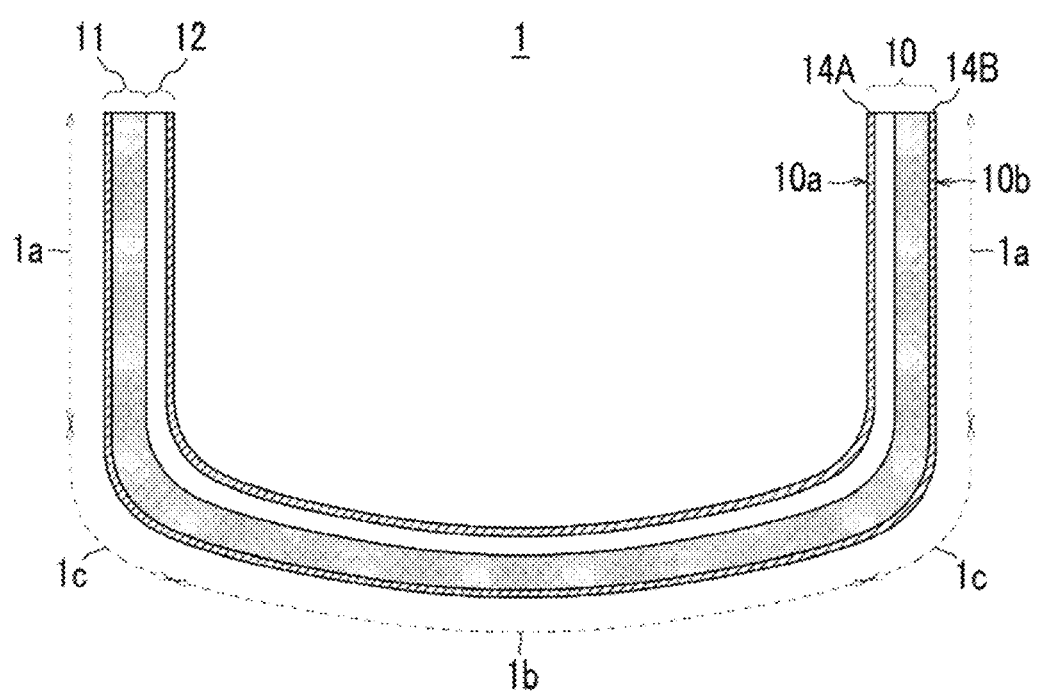
FIG. 2 is a schematic cross-sectional view illustrating the structure of the quartz glass crucible in a state in which the surface is crystallized by heating.

FIG. 2 is a schematic cross-sectional view illustrating the structure of the quartz glass crucible 1 in a state in which the surface is crystallized by heating.

As illustrated in FIG. 2, the surface of the quartz glass crucible to which the crystallization accelerator is applied is heated during the step of pulling up a silicon single crystal such that the crystallization of the quartz glass is accelerated, so that the inner crystal layer 14A and the outer crystal layer 14B are respectively formed on the inner surface 10a and the outer surface 10b of the crucible body 10. Heating during the step of pulling up a silicon single crystal is performed even for several tens of hours or longer at a temperature of the melting point of silicon (about 1400° C.) or higher. However, how the crystal layer is formed on the surface-layer portion of the crucible body 10 can be evaluated, as well as by actually performing the step of pulling up a silicon single crystal, by performing a heat treatment at a temperature equal to or higher than 1400° C. and equal to or lower than the softening point of silica glass for 1.5 hours or longer. More preferably, heating is preferably performed at a heating temperature set to 1500° C. for a heating time set to 15 hours or longer according to actual crystal pull-up conditions (atmosphere component such as Ar, reduced pressure level, and the like).

It is preferable that the crystallized state of the inner crystal layer 14A has a single layer of a dome-shaped crystal layer or a two-layer structure of a dome-shaped crystal layer and a columnar crystal layer (hereinafter, referred to as dome-shaped+columnar crystal layer). In particular, in a case where the use time of the crucible is very long, the inner crystal layer 14A is preferably a dome-shaped+columnar crystal layer, and in a case where the use time of the crucible is relatively short, the inner crystal layer 14A may have a single-layer structure consisting solely of a dome-shaped crystal layer. Here, the dome-shaped crystal layer refers to a crystal layer composed of an aggregate of dome-shaped crystal grains, and the columnar crystal layer refers to a crystal layer composed of an aggregate of columnar crystal grains.

The thickness of the inner crystal layer 14A capable of suppressing the deformation of the crucible is 200 μm or more, and particularly 400 μm or more. The inner crystal layer 14A which is in contact with the silicon melt during pulling up a single crystal is gradually eroded. However, since the columnar crystal layer gradually grows, it is also possible to maintain the thickness of the inner crystal layer 14A at 400 μm or more. In addition, the degree of the thickness of the inner crystal layer 14A at which the deformation of the crucible can be suppressed can be easily evaluated by a so-called beam bending method using a quartz glass crucible piece having a crystal layer formed therein.

The crystallized state of the outer crystal layer 14B preferably has a single-layer structure of the dome-shaped crystal layer. Although described later in detail, this is because crystal growth continues in the dome-shaped/columnar (mixed) crystal layer such that the thickness of the outer crystal layer 14B increases, and foaming and delamination is likely to occur at the interface between the crystal layer and the quartz glass layer. However, in a case where the use time of the crucible is relatively short and the outer crystal layer does not become excessively thick, the outer crystal layer 14B may have a structure consisting of the dome-shaped/columnar crystal layer.

It is preferable that the ratio $t_i/t_o$ of the thickness $t_i$ of the inner crystal layer 14A to the thickness $t_o$ of the outer crystal layer 14B is 0.3 or more to 5 or less. In a case of a thickness ratio of $t_i/t_o>5$, the shrinkage stress on the inner surface 10a side of the crucible body 10 becomes strong, so that wrinkles and cracks are generated on the outer surface 10b side of the crucible body 10 and there is concern that the crucible may deform. In a case of a thickness ratio of $t_i/t_o<0.3$, the shrinkage stress on the outer surface 10b side of the crucible body 10 becomes strong, so that wrinkles and cracks are generated on the inner surface 10a, the inner crystal layer 14A is delaminated, and there is concern that the single-crystal yield may decrease. However, by causing the thickness ratio $t_i/t_o$ of the inner crystal layer 14A to the outer crystal layer 14B to be in a range of 0.3 to 5, even if there is a difference in shrinkage stress due to the difference in thermal expansion coefficient or density between the crystal layer and the glass layer during heating, the tensile stress from both the inner surface and the outer surface is balanced, thereby preventing generation of wrinkles and cracks in the crystal layer.

As described above, since the inner surface of the crucible is covered with the crystal layer, erosion of the crucible can be suppressed, and dislocation of the silicon single crystal due to delamination of crystal grains can be prevented. Furthermore, since the outer surface of the crucible is crystallized, the strength of the crucible can be increased, and deformation of the crucible such as buckling or collapse to the inside can be suppressed.

FIGS. 3(a) to (c) are schematic views for explaining a mechanism of crystallization of the surface-layer portion of the crucible by the crystallization accelerator.

As illustrated in FIG. 3(a), in a case where barium (Ba) as the crystallization accelerator is present on the surface of the crucible (quartz glass interface) and the concentration of Ba ions ($Ba^{2+}$) from ionized barium is lower than the concentration of Si ions ($Si^{4+}$), the amount of crystal nuclei initially generated on the surface of the crucible is small, so that random crystal growth on the crystal nuclei as the origins occurs. Here, the Ba ions are trapped in the crystal grain boundaries, so that the amount of Ba ions which are present at the interface between the quartz glass and the crystal grains and thus contribute to the crystal growth in the thickness direction of the crucible decreases. Accordingly, the crystal growth gradually weakens and stops soon.

However, as illustrated in FIG. 3(b), in a case where the concentration of the Ba ions is higher than the concentration of the Si ions, a large amount of crystal nuclei are generated on the surface of the crucible, and crystals competitively grow on the crystal nuclei as the origins, so that crystal grains in a dome-shaped orientation are formed. When the crystallization further proceeds, only crystals in a vertical orientation survive in the competing process. However, the Ba ions are trapped in the crystal grain boundaries, so that the amount of Ba ions which are present at the interface between the quartz glass and the crystal grains decreases. Accordingly, the crystal growth gradually weakens and stops soon. However, with the crystal layer in the dome-shaped orientation, it is possible to form a crystal layer sufficiently thicker than a crystal layer in a random orientation.

In addition, in a structure in which Ba ions are present in a glass matrix in the related art, Ba ions simultaneously generate crystal nuclei. However, the crystals grow randomly, and the amount of Ba ions contributing to crystal growth in the thickness direction decreases. Therefore, the crystal layer cannot be made thick. Contrary to this, as illustrated in FIG. 3(b), in a model in which crystal nuclei start growing uniformly in the depth direction from the glass surface, crystals in a vertical orientation do not cancel out, so that it is possible to form a thick crystal layer.

Furthermore, as illustrated in FIG. 3(c), in a case where the concentration of Ba ions is very high and particularly 50 times or more the concentration of Si ions on the surface of quartz glass, a countless number of crystal nuclei are generated on the surface of the crucible within a short period of time, and selective crystal growth in a vertical direction occurs fast, so that crystal grains in a columnar orientation are formed. As the crystal grains grow, Ba ions are less likely to be trapped in the crystal grain boundaries, and a decrease in the amount of Ba ions is suppressed, so that a decrease in the crystallization rate is suppressed. As described above, by allowing Ba ions to be present at a high concentration on the extreme surface of the quartz glass to advance crystallization at once in the direction toward the inside of the glass, it is possible to turn the crystal structure from the dome-shaped orientation into the columnar orientation. With the crystal layer in the columnar orientation, crystal growth of the surface-layer portion of the crucible can be allowed to continue, so that it is possible to form a crystal layer which is thicker than the crystal layer in the dome-shaped orientation.

Since the crystal layer of the inner surface of the crucible is melted by the reaction with the silicon melt, during random growth in which crystallization of quartz glass stops in an initial stage of heating, the crystal layer of the inner surface of the crucible disappears, which is not suitable for long-term use. In addition, since the crystal layer of the outer surface of the crucible also decreases in thickness due to the reaction with a carbon susceptor, there is concern that the crystal layer of the outer surface may disappear during random growth in which crystallization stops in an initial stage of heating. However, the crystal growth period can be increased in the case of dome-like growth, and the thickness of the crystal layer can be sufficiently secured. In addition, the crystal growth period can be further increased in the case of columnar growth, and continuous crystal growth can be realized.

In a case where the crystal growth in the dome-like or columnar orientation continues, a crystallization-accelerator-enriched layer 10P (Ba-enriched layer) is formed at the interface between a crystal layer 14 and a glass layer 10G which is not crystallized. In the present invention, the "crystallization-accelerator-enriched layer" is a layer which is generated at the interface between the crystal layer 14 and the glass layer 10G in a case where the crystallization accelerator such as Ba is applied to the surface of the crucible and heated, and thus has the crystallization accelerator present at a high density. The concentration of the crystallization accelerator in the crystallization-accelerator-enriched layer 10P is 5 times or more the concentration of the crystallization accelerator in the crystal layer 14.

FIGS. 4 (a) and (b) are cross-sectional views of the vicinity of the surface of the quartz glass crucible 1 after use illustrated in FIG. 2, in which (a) is an image taken with an optical microscope, and (b) is a Ba ion image map of a crystal glass interface, which is an analysis result of TOF-SIMS (Time-of-Flight Secondary Ion Mass Spectrometry).

As shown in FIG. 4(a), a crystal layer is formed on the surface of the quartz glass crucible 1, a glass layer which is not crystallized is present therebelow, and the boundary between the two layers is clear. It should be noted that large black masses in the figure are bubbles.

As shown in FIG. 4(b), when surface analysis is performed with TOF-SIMS after the vicinity of the crystal glass interface is etched, it can be seen that a crystallization-accelerator-enriched layer which is a region with a high Ba ion density is generated in the vicinity of the crystal glass interface. The crystallization-accelerator-enriched layer in this figure has a thickness of about 8 to 10 μm.

It is preferable that the thickness of the crystallization-accelerator-enriched layer 10P is 0.1 μm or more and 50 μm or less. In a case where the crystallization-accelerator-enriched layer 10P is too thick, the fluidity increases, and the positions of the crystal layer 14 and the glass layer 10G are shifted from each other, resulting in the generation of wrinkles and cracks on the surface of the crystal layer 14. In a case where the crystallization-accelerator-enriched layer 10P is absent or too thin, an extreme decrease in the crystallization rate occurs even during heating, and the crystal layer 14 having a sufficient thickness cannot be formed. Also, due to the stress caused by the difference in thermal expansion coefficient or density between the crystal layer 14 and the glass layer 10G during heating, separation of the crystal layer 14 easily occurs. This stress also causes cracks, and cracks lead to deformation of the crucible.

FIGS. 5 (a) to (e) are photographs of the crystallized surface of the crucible, in which (a) shows a state in which wrinkles are generated on the surface of the crucible, (b) shows a state in which there are no wrinkles and cracks on the surface of the crucible, (c) shows a state in which only wrinkles are generated on the surface of the crucible and no cracks are generated, (d) shows a state in which wrinkles and cracks are generated on the surface of the crucible, and (e) shows a state in which wrinkles and cracks are generated on the surface of the crucible and furthermore, delamination of the crystal layer occurs.

As shown in FIG. 5(a), in a case where the crystallization-accelerator-enriched layer is too thick, the fluidity increases, and the positions of the crystal layer and the glass layer tend to be shifted from each other, resulting in the generation of wrinkles on the surface of the crystal layer. As shown in FIG. 5(b), the surface of the crystal layer, which has no wrinkles generated therein, is very smooth. On the other hand, if the degree of positional shift between the crystal layer and the glass layer is small, as shown in FIG. 5(c), only wrinkles are generated on the surface of the crucible, and no cracks are generated. Wrinkles refer to a state in which a part of the crystal layer flows and the surface gains thin pleats. The glass layer is not exposed, but a minute amount of small crystal pieces (particles) are generated from the pleats. Therefore, in a case where wrinkles are generated on the inner surface 10a side of the crucible, the single-crystal yield decreases. It is considered that even if wrinkles are generated on the outer surface 10b side of the crucible, there is no direct effect on the single-crystal yield.

When the positional shift between the crystal layer and the glass layer increases, cracks as well as wrinkles are generated. FIG. 5(d) shows the state in which cracks are generated on the surface of the crystal layer. Cracks refer to a state in which a part of the crystal layer is split, cracking occurs, and thus a cross section of the glass layer is exposed. As shown in the figure, a large number of small crystal pieces (particles) is generated from the cracks. Therefore, when cracks are generated on the inner surface 10a side of the crucible, the silicon single-crystal yield significantly decreases. In addition, when wrinkles and cracks are generated on the inner surface 10a side of the crucible body, delamination of the crystal layer occurs as shown in FIG. 5(e), which has a further effect on the single-crystal yield. Even if wrinkles are generated on the outer surface 10b side of the crucible, there is no direct effect on the single-crystal yield. However, the generation of cracks significantly reduces the strength of the crucible, and leads to deformation of the crucible.

However, in a case where the crystallization-accelerator-enriched layer has an appropriate thickness, the fluidity of the part is not so high, so that the crystal layer and the glass layer are less likely to be shifted from each other, wrinkles and cracks are not generated in the crystal layer, and the crystal layer is not delaminated.

The crystallized state of the surface-layer portion of the crucible can be observed using a SEM (Scanning Electron Microscope), but can also be evaluated by a surface X-ray diffraction method.

Figure 6:
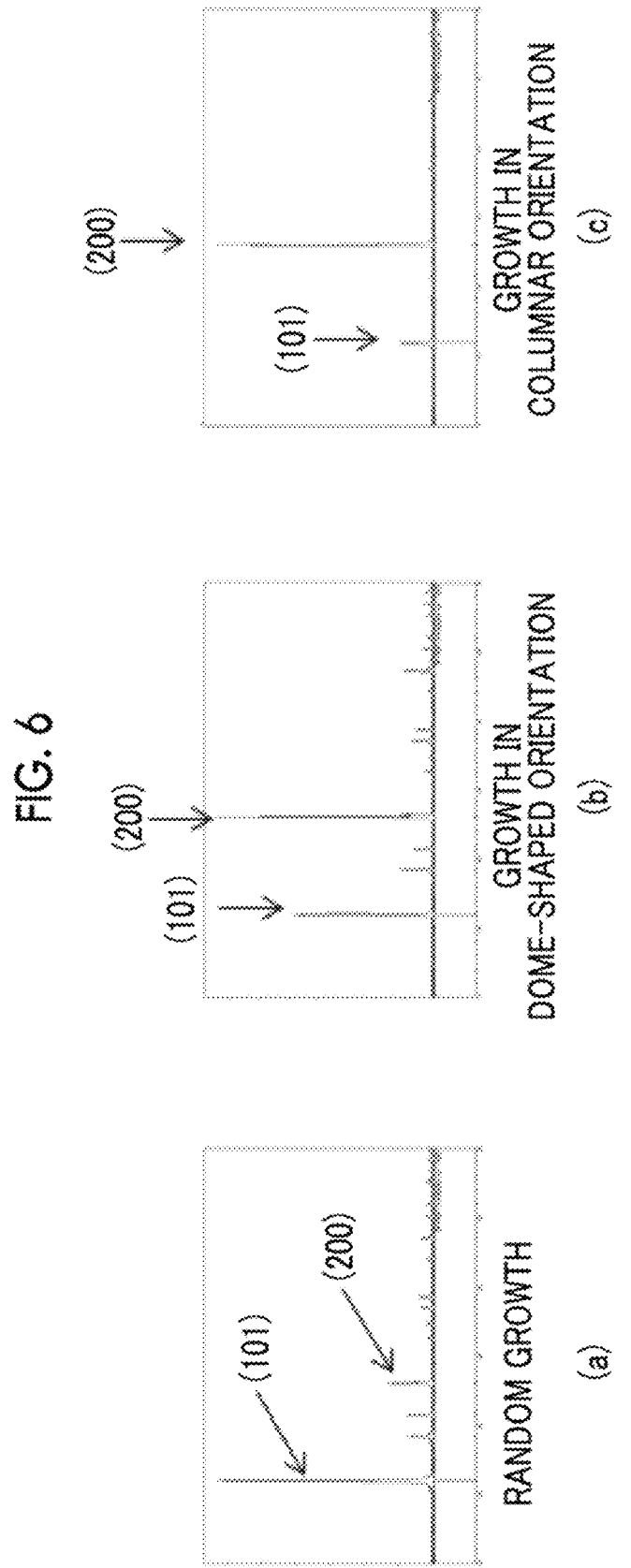

FIGS. 6 (a) to (c) show graphs showing measurement results of the surface-layer portion of the crucible by the surface X-ray diffraction method, in which FIGS. 6(a), 6(b), and 6(c) show crystal layers in a random orientation, in a dome-shaped orientation, and in a columnar orientation, respectively.

In a case where the crystal layer is in a random orientation, as illustrated in FIG. 6(a), the maximum value A of the peak intensity (counts) at a diffraction angle 2θ of 20 to 25° caused by a (100) crystal orientation is very high, the maximum value B of the peak intensity at a diffraction angle 2θ of 33 to 40° caused by a (200) crystal orientation is very low, and the peak intensity ratio A/B becomes larger than 7.

Contrary to this, in a case where the crystal layer is in the dome-shaped orientation, as illustrated in FIG. 6(b), the difference between the maximum value A of the peak intensity at a diffraction angle 2θ of 20 to 25° and the maximum value B of the peak intensity at a diffraction angle 2θ of 33 to 40° decreases, and the peak intensity ratio A/B becomes 0.4 or more and 7 or less.

Furthermore, in a case where the crystal layer is in the columnar orientation, as illustrated in FIG. 6(c), the maximum value A of the peak intensity at a diffraction angle 2θ of 20 to 25° is very low, the maximum value B of the peak intensity at a diffraction angle 2θ of 33 to 40° is very high, and the peak intensity ratio A/B becomes less than 0.4.

FIG. 7 is a table showing suitable crystal structures of the inner crystal layer 14A and the outer crystal layer 14B for each part, in which a preferable crystal structure for each part is indicated by "B", and a more preferable crystal structure is indicated by "A".

As shown in FIG. 7, regarding the inner surface 10a of the crucible body 10, the entire inner surface from the straight body portion (W portion) 1a to the bottom portion (B portion) 1b may be caused to have a dome-shaped/columnar crystal layer (A/B is less than 0.4). In addition, only the corner portion (R portion) 1c and the bottom portion 1b can be caused to have a dome-shaped/columnar crystal layer while the inner surface of the straight body portion 1a is caused to have a dome-shaped crystal layer (A/B is equal to or more than 0.4 and less than 7). This is because the inner surface of the straight body portion 1a has a shorter contact time with the silicon melt than that of the corner portion 1c or the bottom portion 1b, and it is sufficient to form a dome-shaped crystal layer thereon. In a case where a crystal pull-up time is relatively short, it is also preferable to adopt the condition that the inner surface of the straight body portion 1a of the crucible body 10 becomes a dome-shaped crystal layer. The thickness of the crystallization-accelerator-containing coating film 13A in the straight body portion 1a can be reduced, so that the incorporation of impurities contained in the coating film into the silicon melt can be reduced.

Regarding the outer surface 10b of the crucible body 10, the entire outer surface from the straight body portion 1a to the bottom portion 1b may have a dome-shaped/columnar crystal layer or a dome-shaped crystal layer regardless of the part of the crucible, but particularly preferably has a dome-shaped crystal layer. This is because, although the strength of the crucible can be increased by allowing the outer crystal layer 14B to have a certain thickness, when the thickness of the outer crystal layer 14B increases, bubbles in a bubble layer of the crystallized quartz glass cohere and expand, and deformation of the crucible or delamination of the crystal layer easily occurs. When the thickness of the outer crystal layer 14B becomes 1.5 mm or more, delamination of the outer crystal layer 14B particularly easily occurs. Therefore, it is preferable that the crystal growth rate of the outer crystal layer 14B slows down as the crystal growth thereof proceeds, and it is preferable that the thickness of the outer crystal layer 14B is suppressed to be less than 1.5 mm.

It is preferable that the coating solution used for forming the crystallization-accelerator-containing coating films 13A and 13B is used in an actual quartz glass crucible after a test for a crystallized state is conducted in advance on a base material such as a quartz glass plate. In the test for a crystallized state, after a crystallization accelerator coating solution at a predetermined concentration is applied to the surface of the quartz glass base material, an evaluation heat treatment is performed at 1400° C. or higher to form a crystal layer on a surface-layer portion of the surface of the quartz glass base material. Next, the crystallized state of the surface of the quartz glass base material is analyzed by the X-ray diffraction method, and the concentration of the crystallization accelerator in the crystallization accelerator coating solution is adjusted based on the analysis result. Then, the crystallization-accelerator coating solution after the adjustment of the concentration is applied to the surface of the quartz glass crucible (the crucible body 10), thereby completing the quartz glass crucible 1. As described above, a desired crystallized state can be reliably reproduced regardless of slight differences in conditions such as the concentration, composition, coating conditions, and the like of the crystallization accelerator coating solution, thereby realizing a quartz glass crucible having high reliability.

Figure 8:
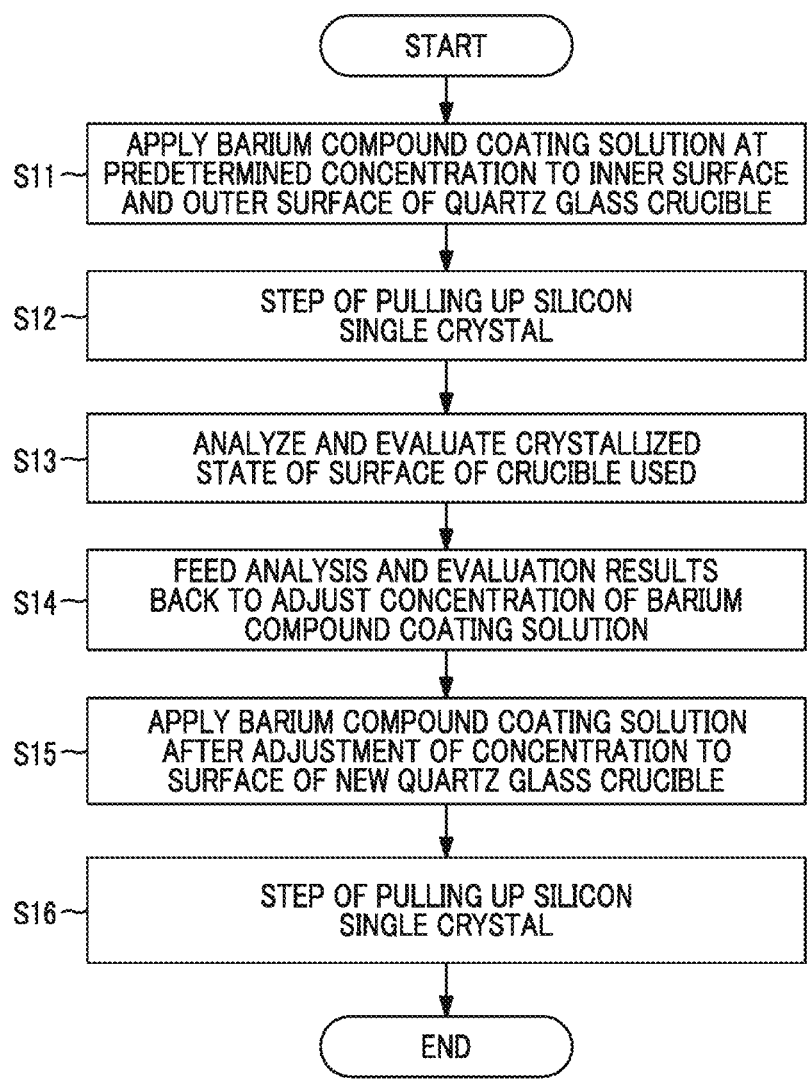
FIG. 8 is a flowchart for explaining a manufacturing method of a silicon single crystal using the quartz glass crucible 1 according to the embodiment.

FIG. 8 is a flowchart for explaining a manufacturing method of a silicon single crystal using the quartz glass crucible 1 according to the embodiment.

As illustrated in FIG. 8, in the manufacturing of a silicon single crystal according to the embodiment, a quartz glass crucible having the first and second crystallization-accelerator-containing coating films 13A and 13B formed therein is used. Therefore, a quartz glass crucible (crucible body 10) to which the crystallization accelerator is not applied (uncoated) is prepared, and barium compound coating solutions having appropriate concentrations are respectively applied to the inner surface and the outer surface thereof (step S11).

Next, a step of pulling up a silicon single crystal is performed using the quartz glass crucible 1 having the first and second crystallization-accelerator-containing coating films 13A and 13B formed therein (step S12). The pull-up step may be multi-pulling in which a plurality of silicon single crystals are pulled up from the same crucible, or may be single-pulling in which only a single silicon single crystal is pulled up.

Next, the surface of the used crucible after the end of the pull-up step is analyzed by the X-ray diffraction method, and the crystallized state of the crystal layer is evaluated (step S13). As described above, a peak intensity ratio A/B of more than 7 can be evaluated as a crystal layer in a random orientation, a peak intensity ratio A/B of 0.4 or more and 7 or less can be evaluated as a crystal layer in a dome-shaped orientation, and a peak intensity ratio A/B of less than 0.4 can be evaluated as a crystal layer in a columnar orientation.

Next, the analysis and evaluation results are fed back to adjust the concentration of the barium compound coating solution (step S14). For example, in a case where the crystallized state of the outer crystal layer 14B is in a columnar orientation and the crystal layer becomes excessively thick, the barium concentration in the barium compound coating solution to be used may be adjusted to be decreased. In addition, in a case where the crystallized state of the inner crystal layer 14A is in a dome-shaped orientation but a columnar orientation is desired, the barium concentration in the barium compound coating solution to be used may be adjusted to be increased.

The analysis and evaluation results may include the degree of orientation of crystals (evaluation results by X-ray diffraction: peak ratio), the thickness of a crystal layer, the thickness gradient, the thickness distribution, the grain size of crystals, the presence or absence of foaming and delamination of the crystal layer, the thickness of the crystallization-accelerator-enriched layer, and the like. In addition, adjustment items may include the concentration (of each part), the thickness of the coating film (of each part), formulation of the thickener, the particle size of barium carbonate, and the like. As a method of adjusting the items, since the thermal load varies with the part of the crucible depending on the crystal pull-up conditions, pulling up is performed by applying barium at a uniform barium concentration regardless of the part of the crucible initially, the thickness distribution and the like of the crystal layer of the used crucible are analyzed, and the above-mentioned items may be adjusted for each part so that the crystal layer becomes uniform.

Thereafter, a new uncoated quartz glass crucible is prepared, the barium compound coating solution of which the concentration is adjusted is applied to the surface thereof (step S15), and the step of pulling up a silicon single crystal is newly performed using the quartz glass crucible (step S16). In the pull-up step performed as described above, the crystal layer of the surface of the quartz glass crucible 1 is in the optimal crystallized state for each part, so that a crystal layer which is uniform in a plane can be formed without delamination of crystal grains at the inner surface 10a of the crucible body 10 and columnar crystals can be continuously grown, which in turn always maintains the strength. In addition, on the outer surface 10b of the crucible body 10, inconveniences such as foaming and delamination can be prevented while maintaining a certain strength.

Figure 9:
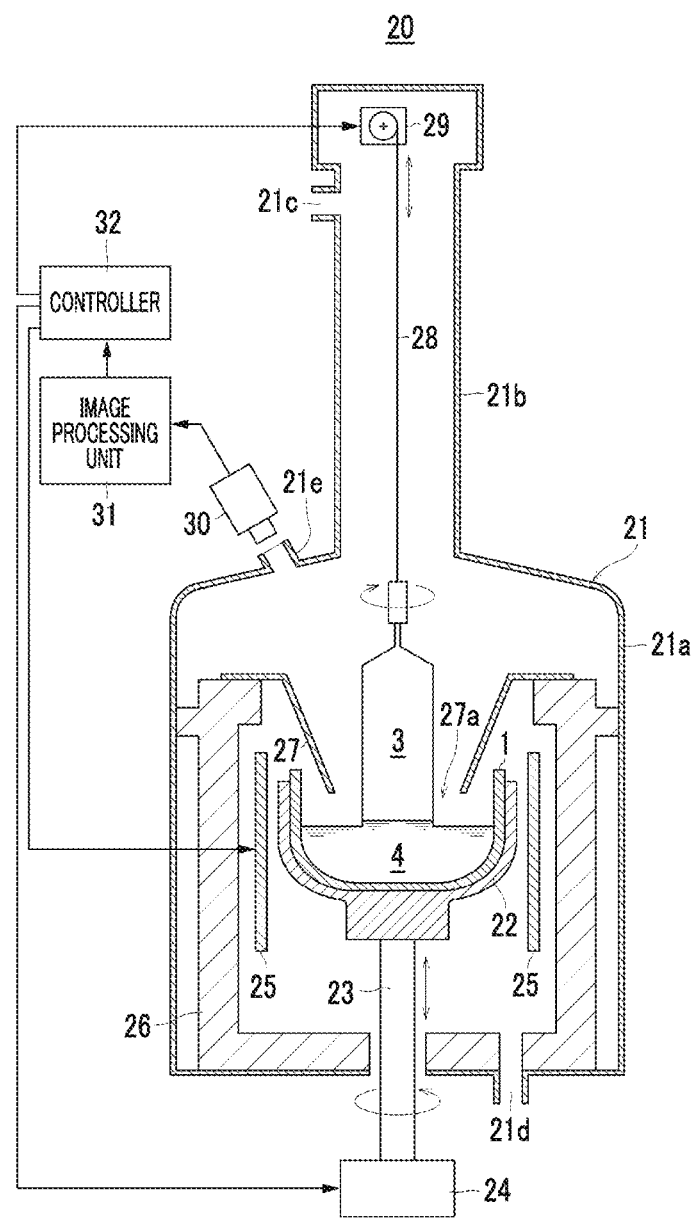
FIG. 9 is a schematic view for explaining a step of pulling up a silicon single crystal by the CZ method.

FIG. 9 is a schematic view for explaining the step of pulling up a silicon single crystal by the CZ method.

As illustrated in FIG. 9, a single crystal pull-up apparatus 20 is used in the step of pulling up a silicon single crystal by the CZ method. The single crystal pull-up apparatus 20 includes a water cooling type chamber 21, the quartz glass crucible 1 which holds a silicon melt 4 in the chamber 21, a carbon susceptor 22 which holds the quartz glass crucible 1, a rotary shaft 23 which supports the carbon susceptor 22, a shaft driving mechanism 24 which rotates and lifts/lowers the rotary shaft 23, a heater 25 disposed in the periphery of the carbon susceptor 22, a heat insulation material 26 disposed outside the heater 25 along the inner surface of the chamber 21, a heat-shield body 27 disposed above the quartz glass crucible 1, a crystal pull-up wire 28 disposed above the quartz glass crucible 1 coaxially with the rotary shaft 23, and a wire winding mechanism 29 disposed at the upper portion the chamber 21.

The chamber 21 is constituted by a main chamber 21a and an elongated cylindrical pull chamber 21b connected to an upper opening of the main chamber 21a. The quartz glass crucible 1, the carbon susceptor 22, the heater 25, and the heat-shield body 27 are provided in the main chamber 21a. A gas inlet port 21c for introducing inert gas (purge gas) such as argon gas or dopant gas into the chamber 21 is provided in the upper portion of the pull chamber 21b, and a gas exhaust port 21d for exhausting the atmosphere gas in the chamber 21 is provided at the lower portion of the main chamber 21a. In addition, a sight window 21e is provided at the upper portion of the main chamber 21a so as to allow a growing state of a silicon single crystal 3 to be observed through the sight window 21e.

The carbon susceptor 22 is used for maintaining the shape of the quartz glass crucible 1 which is softened by heating, and holds and surrounds the quartz glass crucible 1 by coming in close contact with the outer surface of the quartz glass crucible 1. The quartz glass crucible 1 and the carbon susceptor 22 constitute a double-structure quartz glass crucible that supports the silicon melt in the chamber 21.

The carbon susceptor 22 is fixed to the upper end portion of the rotary shaft 23, and the lower end portion of the rotary shaft 23 passes through the bottom portion of the chamber 21 and is connected to the shaft driving mechanism 24 provided outside the chamber 21. The rotary shaft 23 and the shaft driving mechanism 24 constitute a rotary mechanism and a lifting/lowering mechanism of the quartz glass crucible 1 and the carbon susceptor 22.

The heater 25 is used for generating the silicon melt 4 by melting a silicon raw material filling the quartz glass crucible 1, and for maintaining the molten state of the silicon melt 4. The heater 25 is a carbon heater of a resistance heating type and is provided so as to surround the quartz glass crucible 1 in the carbon susceptor 22. Furthermore, the heat insulation material 26 is provided outside the heater 25 to surround the heater 25, whereby the heat retention in the chamber 21 can be enhanced.

The heat-shield body 27 is provided to form an appropriate hot zone in the vicinity of the crystal growth interface by suppressing temperature variations of the silicon melt 4 and to prevent the silicon single crystal 3 from being heated by radiant heat from the heater 25 and the quartz glass crucible 1. The heat-shield body 27 is a graphite member which covers the region above the silicon melt 4 excluding the pull-up path of the silicon single crystal 3, and for example, has an inverse truncated cone shape with an opening size increasing from the lower end to the upper end.

The diameter of an opening 27a of the lower end of the heat-shield body 27 is larger than the diameter of the silicon single crystal 3, whereby the pull-up path of the silicon single crystal 3 is secured. The diameter of the opening 27a of the heat-shield body 27 is smaller than the aperture of the quartz glass crucible 1, and the lower end portion of the heat-shield body 27 is positioned inside the quartz glass crucible 1. Therefore, the heat-shield body 27 does not interfere with the quartz glass crucible 1 even when the rim upper end of the quartz glass crucible 1 is lifted above the lower end of the heat-shield body 27.

While the amount of the melt in the quartz glass crucible 1 decreases as the silicon single crystal 3 grows, temperature variations in the silicon melt 4 are suppressed by lifting the quartz glass crucible 1 so as to cause the gap between the melt surface and the lower end of the heat-shield body 27 to be constant, and the amount of dopants vaporized from the silicon melt 4 can be controlled by causing the flow rate of gas flowing in the vicinity of the melt surface to be constant. Therefore, it is possible to improve the stability of a crystal defect distribution, an oxygen concentration distribution, a resistivity distribution, and the like in a pull-up axis direction of the silicon single crystal 3.

Above the quartz glass crucible 1, the wire 28 as a pull-up axis of the silicon single crystal 3, and the wire winding mechanism 29 for winding the wire 28 are provided. The wire winding mechanism 29 has a function of rotating the silicon single crystal 3 together with the wire 28. The wire winding mechanism 29 is disposed at the upper portion of the pull chamber 21b, the wire 28 extends downward from the wire winding mechanism 29 through the pull chamber 21b, and the tip end portion of the wire 28 reaches the internal space of the main chamber 21a. FIG. 9 illustrates a state where the silicon single crystal 3 during growing is suspended by the wire 28. During pulling up the silicon single crystal 3, the silicon single crystal 3 is grown by gradually pulling up the wire 28 while rotating each of the quartz glass crucible 1 and the silicon single crystal 3.

A CCD camera 30 is provided outside the sight window 21e. During the step of pulling up a single crystal, the CCD camera 30 photographs the boundary between the silicon single crystal 3 and the silicon melt 4 viewed obliquely from above through the opening 27a of the heat-shield body 27 from the sight window 21e. The image taken by the CCD camera 30 is processed by an image processing unit 31, and the processing result is used by a controller 32 to control pull-up conditions.

Although the inner surface of the quartz glass crucible 1 is eroded by the reaction with the silicon melt 4 during the step of pulling up a silicon single crystal, since crystallization of the inner surface and the outer surface proceeds due to the action of the crystallization accelerator applied to the inner surface and the outer surface of the crucible, the crystal layer of the inner surface does not disappear, and the thickness of the crystal layer can be secured to some extent, thereby maintaining the strength of the crucible and suppressing deformation thereof. Therefore, it is possible to prevent the crucible from being deformed and coming into contact with the members in the furnace such as the heat-shield body 27, and to prevent variations in the liquid surface position of the silicon melt 4 due to a change in the internal volume of the crucible.

When a crystal piece delaminated from the inner surface of the quartz glass crucible 1 rides on the convection of the silicon melt 4 and reaches a solid/liquid interface, the crystal piece is incorporated into the silicon single crystal 3, so that there is concern that dislocation may occur. However, according to the embodiment, delamination of the crystal piece from the inner surface of the crucible can be prevented, whereby dislocation of a single crystal can be prevented.

As described above, in the quartz glass crucible 1 according to the embodiment, since the inner crystal layer 14A formed of the dome-shaped+columnar crystal layer or the dome-shaped crystal layer is formed on the inner surface 10a of the crucible body 10 by heating in the pull-up step, the inner crystal layer 14A can have a sufficient thickness. Therefore, the deformation thereof can be prevented by increasing the strength of the crucible. In addition, it is possible to prevent the inner crystal layer 14A from completely disappearing due to the erosion of the inner surface of the crucible.

In a case where the inner crystal layer 14A is the dome-shaped+columnar crystal layer, even if the dome-shaped crystal layer is eroded, since the orientation direction of the columnar crystal layer is the thickness direction of the crucible wall, delamination of columnar crystal grains can be prevented. In addition, by causing the inner crystal layer 14A to undergo the columnar orientation, the crystal growth can be concentrated in the thickness direction of the crucible wall, so that the crystal growth rate can be increased.

In addition, in the quartz glass crucible 1 according to the embodiment, since the outer crystal layer 14B formed of the dome-shaped crystal layer is formed on the outer surface 10b of the crucible body 10 by heating in the pull-up step, the outer crystal layer 14B can have a sufficient thickness. Therefore, the deformation thereof can be prevented by increasing the strength of the crucible. In addition, by forming the dome-shaped crystal layer in the outer surface 10b of the crucible body 10, the crystal grain boundaries can be densified, thereby preventing cracks from reaching the inside of the crucible due to impacts and the like from the outer surface of the crucible.

In addition, by causing the outer crystal layer 14B to have the dome-shaped crystal layer instead of the columnar crystal layer, crystal growth is not sustained, so that the outer crystal layer 14B does not become excessively thick. Therefore, it is possible to prevent delamination of the crystal layer due to expansion of bubbles at the interface between a thick crystal layer and quartz glass, and furthermore, it is possible to prevent the generation of cracks propagating from the bubbles along the columnar crystal grain boundaries.

Also, according to the embodiment, the crystallized states of the crystal layers of the surfaces (the inner surface and the outer surface) of the crucible can be easily evaluated by the X-ray diffraction method. Therefore, the coating conditions of the crystallization accelerator can be selected based on the evaluation results, and the quartz glass crucible 1 having a crystallized state matching the pull-up conditions of the silicon single crystal and the part of the crucible can be manufactured.

The crystallization-accelerator-containing coating films 13A and 13B do not necessarily have to be formed on both the inner surface 10a and the outer surface 10b of the crucible body 10, but may be formed only on the inner surface 10a of the crucible body 10 or only on the outer surface 10b. However, since the inner surface 10a of the crucible is in contact with the silicon melt and has a large erosion amount, the effect of crystallization thereof is larger than that of the outer surface 10b of the crucible, and it is more important to form a crystal layer on the inner surface than on the outer surface of the crucible.

FIGS. 10 (*a*) and (*b*) are schematic cross-sectional views illustrating the structure of a quartz glass crucible according to a second embodiment of the present invention. In addition, FIGS. 11 (*a*) and (*b*) are schematic views for explaining the relationship between the glass viscosity and crystal layers of the crucible.

As illustrated in FIGS. 10 (*a*) and (*b*), in a quartz glass crucible 2A, the first crystallization-accelerator-containing coating film 13A is formed only on the inner surface 10a side of the crucible body 10 in the quartz glass crucible 1 in FIG. 1, and the second crystallization-accelerator-containing coating film 13B on the outer surface 10b side is omitted.

In the quartz glass crucible 2A, the ratio $\eta_o/\eta_i$ of the glass viscosity $\eta_o$ on the outer surface 10b side to the glass viscosity $\eta_i$ on the inner surface 10a side of the crucible body 10 at a heating temperature in a pull-up step is preferably 0.5 or more and 10 or less. In a case where the glass viscosity $\eta_o$ on the outer surface 10b side of the crucible body 10 is too low ($\eta_o/\eta_i<0.5$), the inner surface 10a side of the crucible is crystallized at a relatively early stage of the pull-up step and increases in strength and the inner surface 10a becomes free-standing, while the glass on the outer surface 10b side has no affinity to the susceptor, the outer glass layer is deformed by being lowered and separated as illustrated in FIG. 11(*a*), and the wall thickness is thinned, resulting in a reduction in the strength of the crucible. On the other hand, in a case where the glass viscosity $\eta_o$ on the outer surface 10b side of the crucible body 10 is too high ($\eta_o/\eta_i>10$), as illustrated in FIG. 11(*b*), the inner glass layer is deformed by being separated from the outer glass layer at the boundary between the inner glass layer and the outer glass layer, resulting in a reduction in the strength of the crucible. However, by causing the ratio $\eta_o/\eta_i$ between the glass viscosities on the outer surface 10b side and the inner surface 10a side of the crucible body 10 to be in a range of 0.5 to 10, the shrinkage stress can be relieved even if the surface layer portion on the inner surface 10a side of the crucible body 10 is crystallized and shrinks, thereby preventing deformation of the crucible.

In order to cause the ratio $\eta_o/\eta_i$ of the glass viscosity $\eta_o$ on the outer surface 10b side to the glass viscosity $\eta_i$ on the inner surface 10a side of the crucible body 10 at a heating temperature in a pull-up step to be 0.5 or more and 10 or less, when the crucible body 10 is manufactured by subjecting raw material quartz powders to arc melting in a rotating mold, the ratio can be realized by changing the types of raw material quartz powder forming the inner surface 10a side of the crucible body 10 and raw material quartz powder forming the outer surface 10b side. Specifically, the ratio can be realized by using quartz powders which are different in impurity concentration, particle size, degree of crystallization, and the like.

In the manufacturing of quartz glass crucibles, the types of raw material quartz powder forming the inner surface side of the crucible and raw material quartz powder forming the outer surface side are changed in many cases. For example, there may be cases where a raw material quartz powder which has impurities in as small amount as possible and is thus highly pure is used on the inner surface side of the crucible, and a raw material quartz powder having a low purity and is thus inexpensive is used on the outer surface side of the crucible with emphasis on cost rather than purity. The thickness of the inner layer formed of the high-purity material is larger than the thickness of the inner surface of the crucible being eroded in the silicon melt, and is set to about 1 to 3 mm. The proportion of the thickness of the inner layer in the total thickness of the crucible is about 5% to 30%. In this case, the glass viscosities on the inner surface side and the outer surface side of the crucible are different from each other. However, by controlling the glass viscosity ratio as described above, deformation of the crucible caused by the formation of the inner crystal layer can be suppressed.

Figure 13:
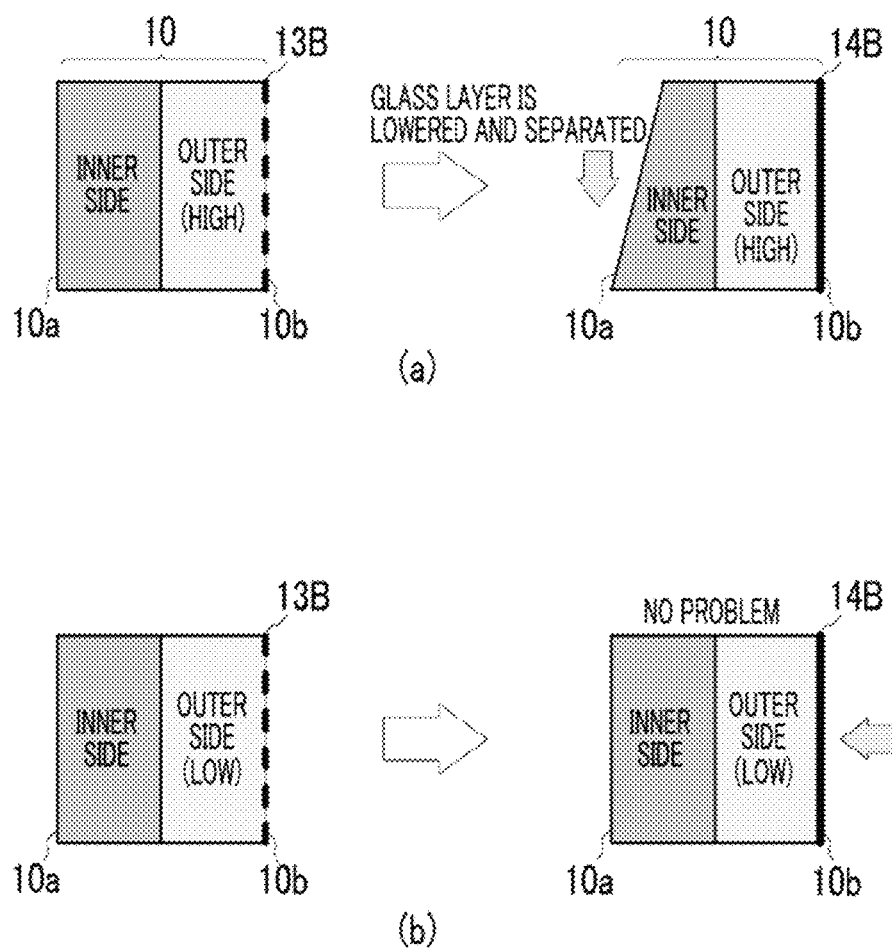
FIGS. 13 (a) and (b) are schematic views for explaining the relationship between the glass viscosity and the crystal layers of the crucible.

FIGS. 12 (a) and (b) are schematic cross-sectional views illustrating the structure of a crucible according to a third embodiment of the present invention. In addition, FIGS. 13 (a) and (b) are schematic views for explaining the relationship between the glass viscosity and the crystal layers of the quartz glass crucible.

As illustrated in FIGS. 12 (a) and (b), in a quartz glass crucible 2B, the second crystallization-accelerator-containing coating film 13B is formed only on the outer surface 10b side of the crucible body 10 in the quartz glass crucible 1 in FIG. 1, and the first crystallization-accelerator-containing coating film 13A on the inner surface 10a side is omitted.

In the quartz glass crucible 2B, the ratio $\eta_i/\eta_o$ of the glass viscosity $\eta_i$ on the inner surface 10a side to the glass viscosity $\eta_o$ on the outer surface 10b side of the crucible body 10 at a heating temperature in a pull-up step is preferably 0.5 or more. In a case where the glass viscosity $\eta_o$ on the outer surface 10b side of the crucible body 10 is too high ($\eta_i/\eta_o<0.5$), as illustrated in FIG. 13(a), the inner glass layer is deformed by being lowered and separated, resulting in a reduction in the strength of the crucible. On the other hand, even if the glass viscosity $\eta_o$ on the outer surface 10b side of the crucible body 10 is low ($\eta_i/\eta_o>10$), as illustrated in FIG. 13(b), the outer glass layer is held in the carbon susceptor in the CZ furnace and can be pressed against the susceptor by the self-weight thereof and the weight of the silicon melt, so that separation of the outer glass layer does not occur. Therefore, by causing the ratio between the glass viscosities on the inner surface 10a side and the outer surface 10b side of the crucible body 10 to be in a range of 0.5 or more, the shrinkage stress can be relieved even if the surface layer portion on the outer surface 10b side of the crucible body 10 is crystallized and shrinks, thereby preventing deformation of the crucible.

In order to cause the ratio $\eta_i/\eta_o$ of the glass viscosity $\eta_i$ on the inner surface 10a side to the glass viscosity $\eta_o$ on the outer surface 10b side of the crucible body 10 at a heating temperature in a pull-up step to be 0.5 or more, when the crucible body 10 is manufactured by subjecting raw material quartz powders to arc melting in a rotating mold, the ratio can be realized by changing the types of raw material quartz powder forming the inner surface 10a side of the crucible body 10 and raw material quartz powder forming the outer surface 10b side.

In the quartz glass crucibles 2A and 2B, the in-plane gradient of the thicknesses of the inner crystal layer 14A and the outer crystal layer 14B is preferably 0.5 or more and 1.5 or less. Accordingly, even if there is a difference in shrinkage stress due to the difference in thermal expansion coefficient or density between the crystal layer and the glass layer during heating, when the in-plane thickness of the crystal layer is uniform, there are no origins of deformation of the crystal layer, such as wrinkles and cracks, and the crystal layer can be less susceptible to generation of wrinkles and cracks. In addition, the in-plane concentration gradient of the crystallization accelerator in the first and second crystallization-accelerator-containing coating films 13A and 13B is 40% or more and 150% or less. By causing the in-plane concentration gradients of the crystallization accelerators in the crystallization-accelerator-containing coating films to be 40 to 150%, the in-plane gradient of the thickness of the crystal layer in a pull-up step can be within a range of 0.5 to 1.5.

Figure 14:
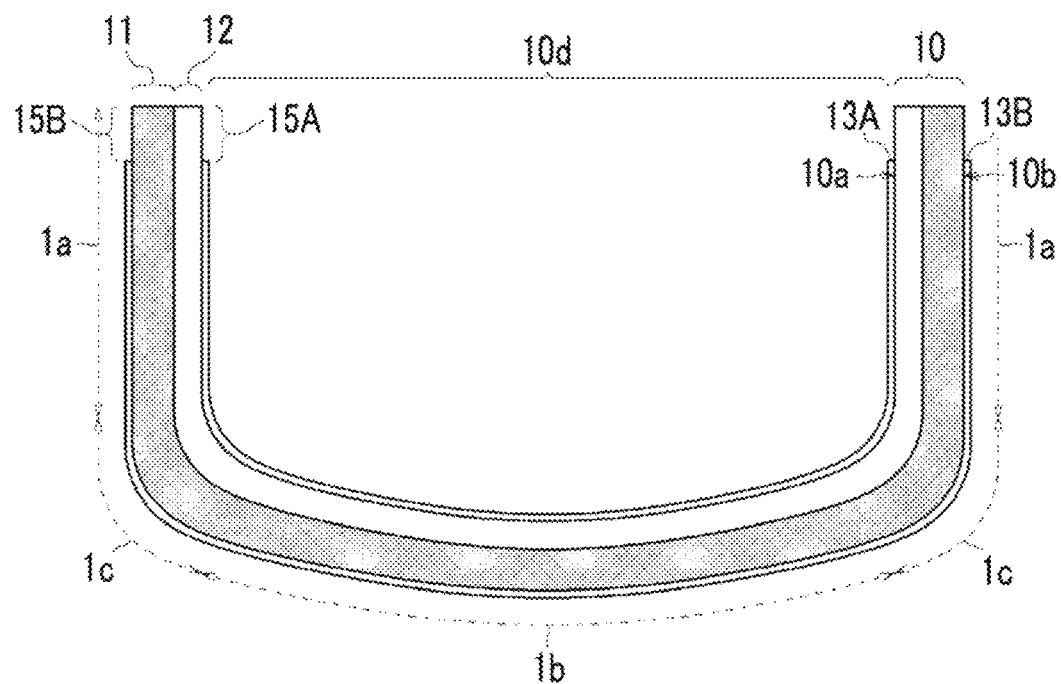
FIG. 14 is a schematic cross-sectional view illustrating the structure of a quartz glass crucible according to a fourth embodiment of the present invention.

FIG. 14 is a schematic cross-sectional view illustrating the structure of a quartz glass crucible according to a fourth embodiment of the present invention.

As illustrated in FIG. 14, a quartz glass crucible 5 according to the embodiment is featured in that the crystallization-accelerator-containing coating films 13A and 13B respectively formed on the inner surface 10a and the outer surface 10b of the crucible body 10 are not formed to reach the rim upper end of the crucible body 10. That is, a band-like region having a predetermined width extending downward from the rim upper end of the inner surface 10a of the crucible body 10 is a crystallization-accelerator-uncoated region 15A (hereinafter, simply referred to as "uncoated region 15A") in which the crystallization-accelerator-containing coating film 13A is not formed, and a band-like region having a predetermined width extending downward from the rim upper end of the outer surface 10b is a crystallization-accelerator-uncoated region 15B (hereinafter, simply referred to as "uncoated region 15B") in which the crystallization-accelerator-containing coating film 13B is not formed.

In the case where the crystallization-accelerator-containing coating films 13A and 13B are respectively formed to reach the rim upper ends of the inner surface 10a and the outer surface 10b of the crucible body 10, the rim upper end portion (the inner surface 10a and the outer surface 10b in the vicinity of the rim upper end surface and the rim upper end) is crystallized, and there is concern that particles of small crystal pieces generated from the crystallized region may be incorporated into the silicon melt in the crucible, resulting in a reduction in the yield of the silicon single crystal. However, in a case where the uncoated regions 15A and 15B are provided, crystallization of the rim upper end portion can be suppressed, and a reduction in the yield of the silicon single crystal due to the generation of particles of small crystal pieces at the rim upper end portion can be prevented.

It is preferable that the uncoated regions 15A and 15B extend downward from the rim upper end in a range of 2 mm or more to 40 mm or less. This is because, in a case where the width of the uncoated regions 15A and 15B is smaller than 2 mm, the effect of providing the uncoated regions 15A and 15B is insufficient. In addition, in a case where the width of the uncoated regions 15A and 15B is greater than 40 mm, there is a possibility that the boundary position between the crystallization-accelerator-containing coating film and the uncoated region may be present in the silicon melt, and when the boundary between the crystal layer and the glass layer is immersed in the silicon melt, there is a higher possibility that cracks may be generated by stress concentration on the boundary region and particles of small crystal pieces may be generated.

In addition, as illustrated in FIG. 9, although the quartz glass crucible 1 during the crystal pull-up step is accommodated in the carbon susceptor 22, the rim upper end portion of the quartz glass crucible 1 protrudes upward beyond the upper end of the carbon susceptor 22 and thus is always in a self-sustaining state without being supported by the carbon susceptor 22. It is preferable that the uncoated regions 15A and 15B are provided in a region protruding upward beyond the upper end of the carbon susceptor 22. As described above, by causing the rim upper end portion of the quartz glass crucible 1 which is not in contact with the carbon susceptor 22 to be the uncoated region, the yield of the silicon single crystal can be improved, and deformation of the crucible due to foaming and delamination of the crystal layer can be prevented.

It is preferable that the range of the width of the uncoated regions 15A and 15B is 0.02 times to 0.1 times the length of the straight body portion 1a of the crucible. This is because, in a case where the width of the uncoated regions 15A and 15B is smaller than 0.02 times the length of the straight body portion 1a of the crucible, the effect of providing the uncoated regions 15A and 15B is insufficient. In addition, in a case where the width of the uncoated regions 15A and 15B is larger than 0.1 times the length of the straight body portion 1a of the crucible, the uncoated region is formed to reach the region supported by the carbon susceptor 22 and there is concern of deformation of the crucible due to foaming and delamination of the crystal layer or deterioration of the yield of the silicon single crystal.

Figure 15:
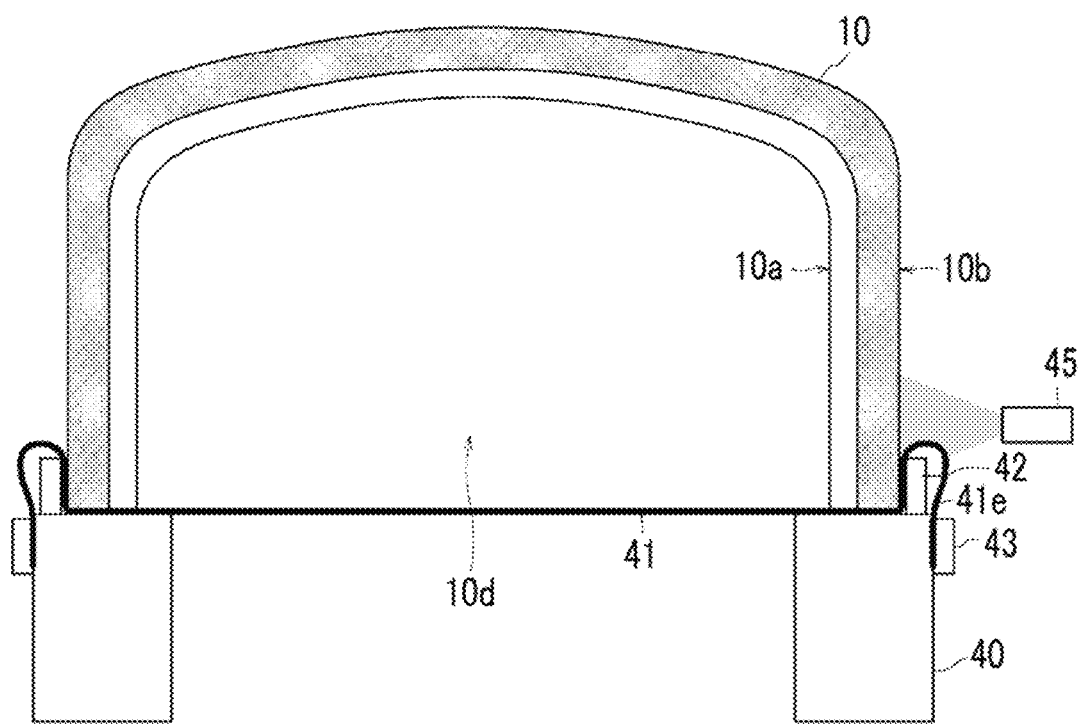
FIG. 15 is a schematic view for explaining an example of a method of forming a crystallization-accelerator-containing coating film formed on an outer surface of the quartz glass crucible illustrated in FIG. 14.

FIG. 15 is a schematic view for explaining an example of a method of forming the uncoated region 15B together with the crystallization-accelerator-containing coating film 13B on the outer surface of the quartz glass crucible 5 illustrated in FIG. 14.

As illustrated in FIG. 15, in a case of forming the crystallization-accelerator-containing coating film 13B on the outer surface 10b of the crucible body 10, the crystallization-accelerator-containing coating film 13B can be formed by a spraying method. Here, in a case where the uncoated region 15B is provided at the rim upper end portion, first, a polyethylene sheet (PE sheet) 41 is put on an opening 10d of the crucible body 10 to cover the opening 10d, and the PE sheet 41 at the mouth of the opening 10d is fixed by a polypropylene band (PP band) 42 to seal the opening 10d.

Thereafter, as illustrated, the opening 10d of the crucible body 10 is placed on a rotary stage 40 in a state of facing downward, an end portion 41e of the PE sheet 41 which extends outward beyond the fixing position of the PP band 42 is turned upside down to be brought into a state of facing downward, and the end portion 41e of the PE sheet 41 is fixed to the outer circumferential surface of the rotary stage 40 by a rubber band 43.

After masking the region having a predetermined width (2 to 40 mm) extending downward from the rim upper end of the outer surface 10b of the crucible body 10 with the PE sheet 41 and the PP band 42, a crystallization-accelerator-containing coating solution is applied to the entire outer surface 10b of the crucible body 10 using a spray 45, whereby the crystallization-accelerator-containing coating film 13B can be formed and the uncoated region 15B can be formed in the vicinity of the rim upper end of the outer surface 10b of the crucible body 10.

The above description is an example of the method of forming the uncoated region 15B together with the crystallization-accelerator-containing coating film 13B on the outer surface of the quartz glass crucible 5, and the same can also be applied to a case of forming the uncoated region 15A together with the crystallization-accelerator-containing coating film 13A on the inner surface of the quartz glass crucible 5. That is, the crystallization accelerator coating solution may be applied by the spraying method in a state in which a region having a predetermined width extending downward from the rim upper end in the inner surface 10a of the crucible body 10 is masked.

While the preferred embodiments of the present invention have been explained above, the present invention is not limited to the embodiments and may be variously modified without departing from the scope of the present invention. Accordingly, all such modifications are included in the present invention.

In addition, in the embodiment, the inner crystal layer 14A may have a single-layer structure of a dome-shaped crystal layer, and the outer crystal layer 14B may have a random crystal layer or a dome-shaped crystal layer.

In addition, in the embodiment, the case where the crystallized state of the crucible used in the proceeding crystal pull-up step is fed back to the crucible used in the subsequent crystal pull-up step is exemplified. However, the present invention is not limited to such a case. Therefore, for example, the conditions of a simulation test with a quartz piece may be determined based on predetermined crystal pull-up conditions, evaluation of the quartz piece may be performed under these conditions, and coating conditions may be determined based on the evaluation results. That is, the crystallized state of the crystal layer formed on the surface layer of the quartz piece by heating during the simulation test modeled on the crystal pull-up step may be analyzed, and based on the analysis results, the concentration of the crystallization accelerator in the crystallization-accelerator-coating solution applied to the inner surface of the quartz glass crucible used in an actual silicon single crystal pull-up step may be adjusted.

In addition, as a method of applying the crystallization accelerator coating solution to the surface of the crucible, in addition to a method using a brush, a spray type, a dipping type, curtain coating, or the like may also be adopted.

Example

The effect of the concentration of the barium compound coating solution on the crystallized state of the crystal layer was evaluated. In this evaluation test, an aqueous solution having a reference concentration in which 50 g/L of polyvinyl alcohol (thickener) was dissolved in barium acetate (0.02 M of metal ions) was first prepared, and six types of coating solutions in which the concentration of barium acetate in the aqueous solution was adjusted to 0.01 times, 0.031 times, 0.063 times, 0.125 times, 0.5 times, and 2 times, were prepared. Next, 12 quartz glass plates were prepared, and a set of two plates was immersed into each of the six types of coating solutions after adjusting the concentration so as to be coated.

Next, the barium concentration on the surface of the quartz glass plate was obtained. In order to calculate the barium concentration, the number of moles of barium was obtained from the weight of the barium acetate aqueous solution which was reduced by immersing the quartz glass plate, the number of atoms of barium was calculated from the number of moles of barium and the Avogadro constant, and the barium concentration was obtained from the number of atoms thereof and the surface area of the quartz glass plate to which the barium acetate aqueous solution was adhered.

Next, the 12 quartz glass plates were heated in a test furnace at 1450° C. The heating time was set to 30 minutes for one of the two quartz glass plates to which the same aqueous solution was applied, and was set to 90 minutes for the other.

Next, the crystallized state of the surface-layer portion of the 12 quartz glass plates after the heat treatment was observed by a SEM (Scanning Electron Microscope). Furthermore, among the 12 quartz glass plates, the surfaces of the quartz glass plates subjected to the heat treatment with the coating solutions at a concentration ratio of 0.031 times, 0.125 times, 0.5 times, and 2 times, for 90 minutes was analyzed by the X-ray diffraction method, and the peak intensity ratio A/B was obtained. The evaluation of the quartz glass plates by the X-ray diffraction method was performed using an X-ray diffractometer RINT 2500 manufactured by Rigaku Corporation with target: Cu ($\lambda$=1.5418 nm), scanning axis: 2$\theta$, measurement method: continuous, 2$\theta$ angle scanning range: 10° to 70°, light-receiving slit: 0.15 mm, divergence slit: 1°, scattering slit: 1°, sampling width: 0.02°, and scanning speed: 10°/min. The depth (detection depth) from the surface being evaluated by X-rays varied depending on the incident angle of X-rays, and was set to several nanometers to several tens micrometers.

Table 1 is a list of evaluation test results of the quartz glass plates.

TABLE 1

| Quartz glass plate sample | Coating solution concentration ratio | Surface concentration (atoms/cm$^2$) | Crystal orientation | Crystal growth rate 30 → 90 min | X-ray diffraction peak intensity ratio |
|---|---|---|---|---|---|
| A1 | ×0.01 | 7.8E14 | Random | | |
| A2 | ×0.031 | 2.4E15 | Random | 0 μm/h | 8 |
| A3 | ×0.063 | 4.9E15 | Dome-like | | |
| A4 | ×0.125 | 9.7E15 | Dome-like | 150 μm/h | 0.64 |
| A5 | ×0.5 | 3.9E16 | Columnar | 450 μm/h | 0.16 |
| A6 | ×2 | 1.6E17 | Columnar | 450 μm/h | |

As shown in Table 1, the barium concentration on the surface (surface barium concentration) of a quartz glass plate sample A1 to which the barium acetate aqueous solution at a concentration ratio of 0.01 times to the reference concentration was applied was 7.8×10$^{14}$ atoms/cm$^2$, and the barium concentration on the surface of a quartz glass plate sample A2 to which the barium acetate aqueous solution at a concentration ratio of 0.031 times was applied was 2.4×10$^{15}$ atoms/cm$^2$, so that both were crystal growths of cristobalite in a random orientation.

The barium concentration on the surface of a quartz glass plate sample A3 to which the barium acetate aqueous solution at a concentration ratio of 0.063 times was applied was 4.9×10$^{15}$ atoms/cm$^2$, and the barium concentration on the surface of a quartz glass plate sample A4 to which the barium acetate aqueous solution at a concentration ratio of 0.125 times was applied was 9.7×10$^{15}$ atoms/cm$^2$, so that both were crystal growths of cristobalite in a dome-shaped orientation.

In addition, the barium concentration on the surface of a quartz glass plate sample A5 to which the barium acetate aqueous solution at a concentration ratio of 0.5 times was applied was 3.9×10$^{16}$ atoms/cm$^2$, and the barium concentration on the surface of a quartz glass plate sample A6 to which the barium acetate aqueous solution at a concentration ratio of 2 times was applied was 1.6×10$^{17}$ atoms/cm$^2$, so that both were crystal growths of cristobalite in a columnar orientation.

FIG. 16(a) is an image showing the observation results of the crystal layers by SEM. In addition, FIG. 16(b) is a graph showing the relationship between the heating time of the quartz glass plate and the thickness of the crystal layer formed on the surface-layer portion of the quartz glass plate, in which the horizontal axis represents the heating time and the vertical axis represents the thickness of the crystal layer.

As shown in FIG. 16(b), in a case where the barium acetate aqueous solution diluted to 0.031 times the reference concentration was applied to the quartz glass plate, the thickness of the crystal layer after 30 minutes from the start of the heating was about 200 μm, and was about 200 μm even after 90 minutes, which means that crystal layer hardly grew after 30 minutes from the start of the heating. That is, the crystal growth rate after 30 minutes from the start of the heating was approximately 0 μm/h. In addition, as shown in FIG. 16(a), the crystal layer from the SEM image was crystal growth of cristobalite in a random orientation. Furthermore, the crystal structure of the crystal layer was analyzed by the X-ray diffraction method and had a peak pattern as shown in FIG. 6(a), and the peak intensity ratio AB mentioned above was 8.

In a case where the barium acetate aqueous solution diluted to 0.125 times the reference concentration was applied to the quartz glass plate, the thickness of the crystal layer after 30 minutes was about 250 μm, and was about 400 μm after 90 minutes, which means that the crystal growth rate after 30 minutes from the start of the heating was approximately 150 μm/h. In addition, as shown in FIG. 16(a), the crystal layer from the SEM image was crystal growth of cristobalite in a dome-shaped orientation. Both the width and the length of dome-shaped crystal grains were about 5 to 30 μm. Furthermore, the crystal structure of the crystal layer was analyzed by the X-ray diffraction method and had a peak pattern as shown in FIG. 6(b), and the peak intensity ratio A/B mentioned above was 0.64.

In a case where the barium acetate aqueous solution diluted to 0.5 times the reference concentration was applied to the quartz glass plate, the thickness of the crystal layer after 30 minutes was about 190 μm, but was about 600 μm after 90 minutes, which means that the crystal growth rate after 30 minutes from the start of the heating was approximately 450 μm/h. In addition, as shown in FIG. 16(a), the crystal layer from the SEM image was changed to crystal growth in a columnar orientation from a dome-shaped orientation. The width of columnar crystal grains was about 10 to 50 μm, and the length thereof was 50 μm or more, and mostly about 50 to 100 μm. Furthermore, the crystal structure of the crystal layer was analyzed by the X-ray diffraction method and had a peak pattern as shown in FIG. 6(c), and the peak intensity ratio A/B mentioned above was 0.16.

In a case where the barium acetate aqueous solution adjusted to twice the reference concentration was applied to the quartz glass plate, the same results were obtained as when the barium acetate aqueous solution adjusted to 0.5 times the reference concentration was used. In addition, as shown in FIG. 16(a), it was found that although the crystal layer from the SEM image was changed to the crystal growth in the columnar orientation from the dome-shaped orientation, the crystal growth period of the dome-shaped orientation was very short, and the crystal layer was changed from the dome-shaped orientation to the columnar orientation in an early stage.

From the above results, it was found that the crystallized state of the crystal layer was changed in order of the random orientation, the dome-shaped orientation, and the columnar orientation by increasing the concentration of the barium acetate aqueous solution, and the crystal layer was reliably changed from growth in the dome-shaped orientation to growth in the columnar orientation if the concentration is four times or more the concentration during the growth in the dome orientation. Therefore, it can be seen that when the crystal layer is in the columnar orientation, the barium concentration on the surface is $3.9 \times 10^{16}$ atoms/cm² or more. It should be noted that the barium concentration on the surface can also be obtained by analysis with fluorescent X-rays or the like.

Next, an evaluation test was conducted on the crystallized state and deformation of the surface of the crucible when the quartz glass crucible to which the coating solution containing barium was applied was used in an actual crystal pull-up step. In the crystal pull-up step, a silicon single crystal ingot having a diameter of about 300 mm was grown using a 32-inch quartz glass crucible. As the coating solution applied to the quartz glass crucible, a barium carbonate coating solution was used. As the barium carbonate coating solution, a solution containing 0.0012 g/mL of barium carbonate and 0.0008 g/mL of a carboxyvinyl polymer, in which the ratio between ethanol and pure water was adjusted, was used. Application to the surface of the crucible was performed with a brush.

In this evaluation test, three types of crucible samples were prepared. Sample #1 was obtained by applying the coating solution once to the outer surface of the crucible, sample #2 was obtained by applying the coating solution six times to the inner surface of the crucible, and sample #3 was obtained by applying the coating solution five times to the inner surface of the crucible. After the application, water evaporated in about 10 minutes, and ethanol evaporated in about 30 minutes, so that a hard film made from the thickener was formed. After the application, the barium concentration on the surface of the crucible was obtained from the amount of the coating solution used.

Thereafter, silicon single crystal ingots were pulled up using the samples #1 to #3 of the quartz glass crucible by the CZ method. After the pull-up step ended, the shapes of the used crucible samples #1 to #3 were visually checked, and no deformation was observed. The crystallized state of the crucible was evaluated from SEM images of the sections of the used crucible samples #1 to #3, and the crystal structure of the crystal layer was further analyzed by the X-ray diffraction method.

Table 2 is a table showing the evaluation test results of the quartz glass crucibles.

Figure 17:
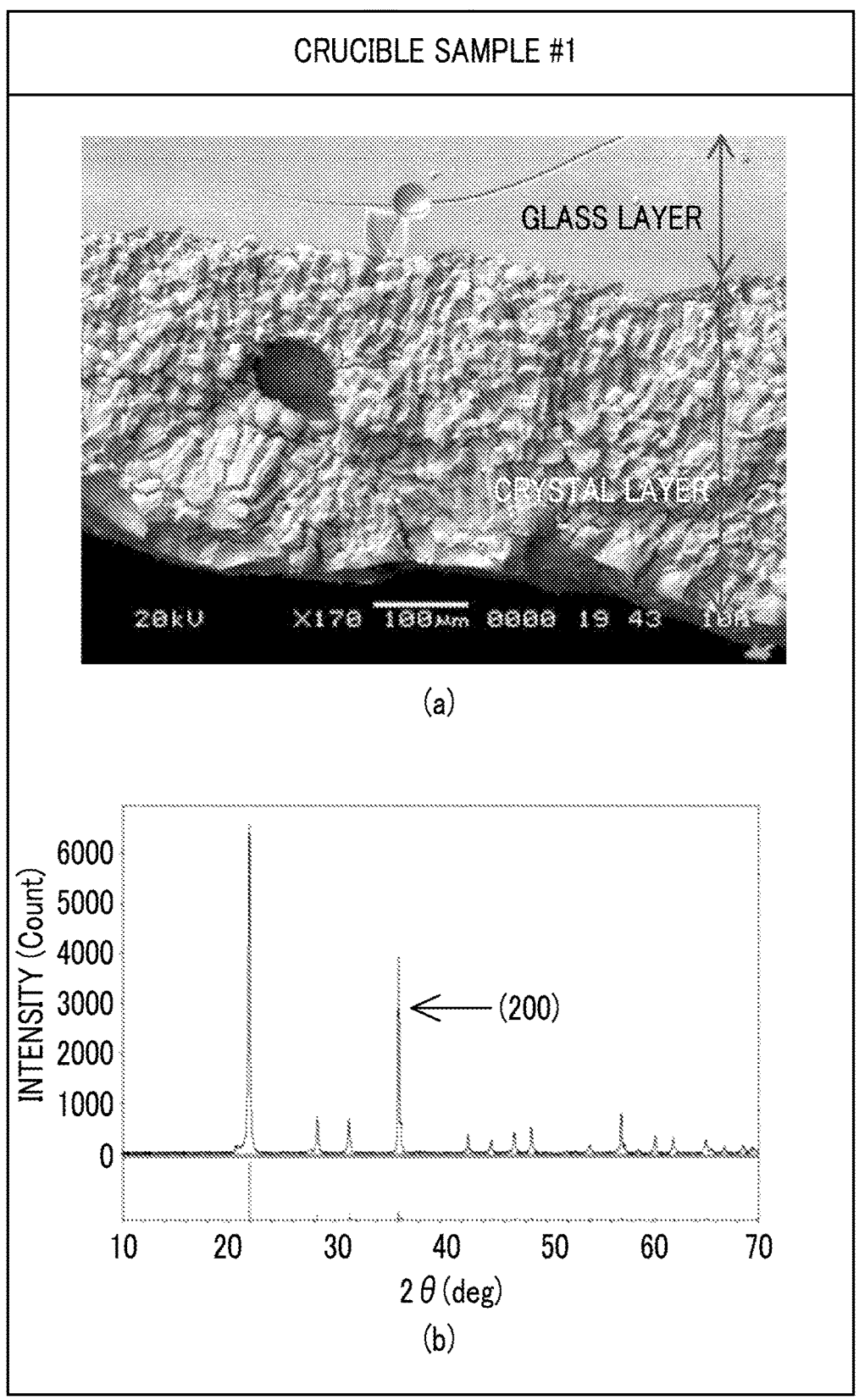
FIGS. 17 (a) and (b) show evaluation results of crystallized states and deformation when (sample #1) a quartz glass crucible to which a coating solution containing barium is applied is used in an actual crystal pull-up step, in which (a) is an SEM image of the crystal layer, and (b) is an X-ray diffraction spectrum graph.

In addition, FIG. 17 to FIG. 19 are graphs of SEM images and X-ray diffraction spectrum[spectra?] of the crystal layers of the respective crucible samples #1 to #3.

The barium concentration on the outer surface of the sample #1 of the quartz glass crucible in which the coating solution was applied once to the outer surface of the crucible was $1.1 \times 10^{16}$ atoms/cm², and crystal growth of cristobalite in a dome-shaped orientation was confirmed from the SEM image shown in FIG. 17(a). In addition, the thickness of the outer crystal layer was about 360 μm. Furthermore, the X-ray diffraction spectrum of the outer crystal layer had a peak pattern in which the peak intensity B (the right peak at 2θ of 33 to 40°) was lower than the peak intensity A (the left peak at 2θ of 20° to 25°) as shown in FIG. 17(b), and the peak intensity ratio A/B mentioned above was 1.7.

In addition, the barium concentration on the inner surface of the crucible sample #2 in which the coating solution was applied six times to the inner surface of the crucible was $6.6 \times 10^{16}$ atoms/cm², and crystal growth of cristobalite in a columnar orientation was confirmed from the SEM image shown in FIG. 18(a). In addition, the thickness of the inner crystal layer was about 380 μm. Furthermore, the X-ray diffraction spectrum of the inner crystal layer had a peak pattern in which the peak intensity B was higher than the peak intensity A as shown in FIG. 18(b), and the peak intensity ratio A/B mentioned above was 0.14.

In addition, the barium concentration on the inner surface of the crucible sample #3 in which the coating solution was applied five times to the inner surface of the crucible was $5.5 \times 10^{16}$ atoms/cm², and crystal growth of cristobalite in a columnar orientation was confirmed from the SEM image shown in FIG. 19(a). In addition, the thickness of the inner crystal layer was about 350 μm. Furthermore, the X-ray diffraction spectrum of the inner crystal layer had a peak pattern in which the peak intensity B was higher than the peak intensity A as shown in FIG. 19(b), and the peak intensity ratio A/B mentioned above was 0.23.

Next, more crucible samples (X1 to X24 and Y1 to Y6) were prepared based on the evaluation results of the above-mentioned crucible samples #1 to #3, and were used for actual CZ pulling, and thereafter deformation of the crucible, presence or absence of generation of wrinkles and cracks, and the like were evaluated. Tables summarizing the conditions and results of evaluation tests are shown in FIG. 20 to FIG. 24.

Among the samples, the samples X1 to X11, Y1, and Y2 of the quartz glass crucibles had crystallization-accelerator-containing coating films formed on both the inner surface 10a and the outer surface 10b of the crucible body 10, and the samples X12 to X18, Y3, and Y4 had a crystallization-accelerator-containing coating film formed only on the inner surface 10a, and the samples X19 to X24, Y5, and Y6 had a crystallization-accelerator-containing coating film formed only on the outer surface 10b.

TABLE 2

| Crucible sample | Coating conditions | Surface concentration (atoms/cm²) | Crystal orientation | Crystal layer thickness | X-ray diffraction peak intensity ratio | Crucible deformation |
| --- | --- | --- | --- | --- | --- | --- |
| #1 | Outer surface: once | 1.1E16 | Dome-like | 360 μm | 1.7 | Absent |
| #2 | Inner surface: six times | 6.6E16 | Columnar | 380 μm | 0.14 | Absent |
| #3 | Inner surface: five times | 5.5E16 | Columnar | 350 μm | 0.23 | Absent |

(Crucible Sample X1)

In the sample X1 of the quartz glass crucible, the conditions of the crystallization-accelerator-containing coating films were set such that the thickness of the crystal layer was greater in the inner crystal layer than in the outer crystal layer. Specifically, the concentration of Ba in the coating solution applied to the inner surface was set to $1\times10^{17}$ atoms/cm$^2$, and the concentration of Ba in the coating solution applied to the outer surface was set to $8\times10^{15}$ atoms/cm$^2$. The ratio (Ba concentration ratio (inner surface/outer surface)) of the concentration of Ba in an inner surface coating film to the concentration of Ba in an outer surface coating film, the coating films being formed by applying the coating solutions, was 12.5. In addition, the Ba concentration gradients in the inner surface coating film and the outer surface coating film were both in a range of 70 to 130%. It should be noted that the Ba concentration gradient is the amount of change in the concentration of Ba in the coating film at a position of 1 cm apart in a vertical or horizontal direction, and is an overall value when the range from the center of the bottom portion of the crucible to the upper portion of the straight body portion was measured at intervals of 1 cm. The glass viscosity ratio (inner side/outer side) of the uncoated quartz glass crucible (crucible body) was 0.8. It should be noted the measurement of the glass viscosity is performed by a three-point bending inspection (beam bending) of a glass piece cut from the crucible and is thus a destructive inspection. Therefore, an actual crucible sample is manufactured under the same conditions as the crucible subjected to the destructive inspection.

When a 300 mm silicon single crystal ingot was pulled up using the sample X1 of such a quartz glass crucible, the single-crystal yield (weight of single crystal ingot/weight of input polycrystalline raw material) was 89%, so that good results were obtained. In addition, when the outer appearance of the crucible after use was visually observed, there was no deformation, there were no wrinkles and cracks on the surface, and no delamination of the crystal layer was seen.

Next, when the crucible sample X1 after use was cut and the cross section was observed by SEM, the inner crystal layer had a dome-like+columnar orientation, while the outer crystal layer had a dome-shaped orientation. In addition, the thickness ratio (crystal layer thickness ratio) of the inner crystal layer to the outer crystal layer was 4.5, and the thickness gradients of the inner crystal layer and the outer crystal layer were both in a range of 0.8 to 1.2. It should be noted that like the Ba concentration gradient, the thickness gradient is the amount of change in the thickness of the crystal layer at a position of 1 cm apart in the vertical or horizontal direction, and is an overall value when the range from the center of the bottom portion of the crucible to the upper portion of the straight body portion was measured at intervals of 1 cm. For example, if the thickness is 110 μm when measured at 1 cm apart from the position at which the thickness of the crystal layer is 100 μm in a surface direction, the thickness gradient is 110/100=1.1, and if the thickness is 160 μm when measured at 1 cm apart from the position at which the thickness of the crystal layer is 100 μm, the thickness gradient is 160/100=1.6.

Furthermore, when the crystal glass interfaces on the inner surface side and the outer surface side were analyzed by TOF-SIMS, the presence of a Ba-enriched layer was confirmed. The thickness of the Ba-enriched layer was about 6 μm on both the inner surface side and the outer surface side.

As described above, in the sample X1 of the quartz glass crucible, since the crystal layer had a dome-shaped orientation or a columnar orientation and the glass viscosity of the inner surface was slightly low, the crystallization rate was fast. In addition, since the concentration of Ba in the coating film on the inner surface side was high, the inner crystal layer became thick. However, since the stress between the inner and outer sides was in a balanced range, there was no deformation of the crucible, and since the in-plane thickness of the crystal layer was uniform, there were no wrinkles or delamination, so that good results were obtained.

(Crucible Sample X2)

In the sample X2 of the quartz glass crucible, the conditions of the crystallization-accelerator-containing coating films were set such that the thickness of the crystal layer was smaller in the inner crystal layer than in the outer crystal layer. Specifically, the concentration of Ba in the coating solution applied to the inner surface was set to $8\times10^{15}$ atoms/cm$^2$, and the concentration of Ba in the coating solution applied to the outer surface was also set to $8\times10^{15}$ atoms/cm$^2$. The Ba concentration ratio (inner surface/outer surface) between coating films respectively formed on the inner surface and the outer surface of the crucible by applying the coating solutions, was 1. In addition, the Ba concentration gradients in the inner surface coating film and the outer surface coating film were both in a range of 70 to 130%. The glass viscosity ratio (inner side/outer side) of the uncoated quartz glass crucible (crucible body) was 2.0.

When crystal pulling was performed using the sample X2 of such a quartz glass crucible, the single-crystal yield was 88%, so that good results were obtained. In addition, when the outer appearance of the crucible after use was visually observed, there was no deformation, there were no wrinkles and cracks on the surface, and no delamination of the crystal layer was seen.

Next, when the crucible sample X2 after use was cut and the cross section was observed by SEM, both the inner crystal layer and the outer crystal layer had a dome-shaped orientation. In addition, the crystal layer thickness ratio (inner surface/outer surface) was 0.6, and the thickness gradients of the inner crystal layer and the outer crystal layer were both in a range of 0.8 to 1.2.

Furthermore, when the crystal glass interfaces were analyzed by TOF-SIMS, the presence of a Ba-enriched layer was confirmed. The thickness of the Ba-enriched layer was about 6 μm on both the inner surface side and the outer surface side.

As described above, in the sample X2 of the quartz glass crucible, since the crystal layer had a dome-shaped orientation or a columnar orientation and the glass viscosity of the inner surface was slightly high, the crystallization rate decreased, and the outer crystal layer became thick. However, since the stress between the inner and outer sides was in a balanced range, there was no deformation of the crucible, and since the in-plane thickness of the crystal layer was uniform, there were no wrinkles or delamination, so that good results were obtained.

(Crucible Sample X3)

When crystal pulling was performed using the sample X3 of a quartz glass crucible manufactured under the same conditions as the crucible sample X1 except that the glass viscosity ratio (inner side/outer side) of the crucible body was 6.5, the single-crystal yield was 86%, so that good results were obtained. In addition, when the crucible after use was evaluated, the inner crystal layer had a dome-like+columnar orientation, the outer crystal layer had a dome-shaped orientation, the crystal layer thickness ratio was 1.5, and the presence of a Ba-enriched layer having a thickness of about 6 μm in each of the crystal glass interfaces on the inner surface side and the outer surface side was confirmed. The other evaluation results were also the same as in the sample X1.

As described above, in the sample X3 of the quartz glass crucible, although the crystallization rate was slow because of a high glass viscosity in the inner surface, since the Ba application concentration on the inner surface side was high, the inner crystal layer became thick. However, since the stress between the inner and outer sides was in a balanced range, there was no deformation of the crucible, and since the in-plane thickness of the crystal layer was uniform, there were no wrinkles or delamination, so that good results were obtained.

(Crucible Sample X4)

When crystal pulling was performed using the sample X4 of a quartz glass crucible manufactured under the same conditions as the crucible sample X2 except that the glass viscosity ratio (inner side/outer side) of the crucible body was 0.1, the single-crystal yield was 87%, so that good results were obtained. In addition, when the crucible after use was evaluated, both the inner crystal layer and the outer crystal layer had a dome-shaped orientation, the crystal layer thickness ratio (inner surface/outer surface) was 1.2, and the presence of a Ba-enriched layer having a thickness of about 6 μm in each of the crystal glass interfaces on the inner surface side and the outer surface side was confirmed. The other evaluation results were also the same as in the sample X2.

As described above, in the sample X4 of the quartz glass crucible, since the glass viscosity of the inner surface was lower than that in the sample X2, the crystallization rate increased, and the inner crystal layer became slightly thick. However, since the stress between the inner and outer sides was in a balanced range, there was no deformation of the crucible, and since the in-plane thickness of the crystal layer was uniform, there were no wrinkles or delamination, so that good results were obtained.

(Crucible Sample X5)

When crystal pulling was performed using the sample X5 of a quartz glass crucible manufactured under the same conditions as the crucible sample X1 except that the concentration of Ba in the coating solution applied to the inner surface was set to $2.4 \times 10^{17}$ atoms/cm$^2$, the Ba concentration ratio (inner surface/outer surface) between the coating films was 30, and the glass viscosity ratio (inner side/outer side) of the crucible body was 2, the single-crystal yield was 85%, so that good results were obtained. In addition, when the crucible after use was evaluated, the inner crystal layer had a dome-like+columnar orientation, the outer crystal layer had a dome-shaped orientation, and the crystal layer thickness ratio (inner surface/outer surface) was 2.5. It was also confirmed that a Ba-enriched layer having a thickness of 7 μm was present at the crystal glass interface on the inner surface side and a thickness of about 6 μm at the crystal glass interface on the outer surface side. The other evaluation results were also the same as in the sample X1.

As described above, in the sample X5 of the quartz glass crucible, although the Ba application concentration on the inner surface side was too high compared to the sample X1, since the glass viscosity of the inner surface is high, the crystallization rate decreased, and the inner crystal layer became thick. However, since the stress between the inner and outer sides was in a balanced range, there was no deformation of the crucible, and since the in-plane thickness of the crystal layer was uniform, there were no wrinkles or delamination, so that good results were obtained.

(Crucible Sample X6)

When crystal pulling was performed using the sample X6 of a quartz glass crucible manufactured under the same conditions as the crucible sample X2 except that the concentration of Ba in the coating solution applied to the inner surface was set to $6.0 \times 10^{15}$ atoms/cm$^2$, the concentration of Ba in the coating solution applied to the outer surface was set to $3.0 \times 10^{16}$ atoms/cm$^2$, the Ba concentration ratio (inner surface/outer surface) between the coating films was 0.2, and the glass viscosity ratio (inner side/outer side) of the crucible body was 0.8, the single-crystal yield was 85%, so that good results were obtained. In addition, when the crucible after use was evaluated, both the inner crystal layer and the outer crystal layer had a dome-shaped orientation, and the crystal layer thickness ratio (inner surface/outer surface) was 0.6. It was also confirmed that a Ba-enriched layer having a thickness of 5 μm was present at the crystal glass interface on the inner surface side and a thickness of about 6 μm at the crystal glass interface on the outer surface side. The other evaluation results were also the same as in the sample X2.

As described above, in the sample X6 of the quartz glass crucible, although the Ba application concentration on the inner surface side was lower and the Ba application concentration on the outer surface side was higher than the sample X2, since the glass viscosity of the inner surface was low, the crystallization rate increased, and the outer crystal layer became thick. However, since the stress between the inner and outer sides was in a balanced range, there was no deformation of the crucible, and since the in-plane thickness of the crystal layer was uniform, there were no wrinkles or delamination, so that good results were obtained.

(Crucible Sample X7)

When crystal pulling was performed using the sample X7 of a quartz glass crucible manufactured under the same conditions as the crucible sample X1 except that there were areas where the thickness gradients of the inner crystal layer and the outer crystal layer were both 0.2 and there were areas where the Ba concentration gradients in the inner surface coating film and the outer surface coating film were both 30%, the single-crystal yield was 81%, so that generally good results were obtained. In addition, when the crucible after use was evaluated, although some wrinkles were seen on the inner surface and the outer surface of the crucible, there was no deformation of the crucible, and no cracks or delamination of the crystal layer were observed. Moreover, there were areas where the thickness gradients of the inner crystal layer and the outer crystal layer were both 0.2. The other evaluation results were the same as in the sample X1.

As described above, in the sample X7 of the quartz glass crucible, although the glass viscosity of the inner surface was slightly low, since the Ba application concentration on the inner surface side was high, the inner crystal layer became thick. However, since the stress between the inner and outer sides was in a balanced range, there was no deformation of the crucible. Although there were no delamination of the crystal layer and cracks, since the in-plane thickness of the crystal layer was not uniform, some wrinkles were seen.

(Crucible Sample X8)

When crystal pulling was performed using the sample X8 of a quartz glass crucible manufactured under the same conditions as the crucible sample X7 except that there were areas where the Ba concentration gradients in the inner surface coating film and the outer surface coating film were both 30% and the glass viscosity ratio (inner side/outer side) of the crucible body was 6.5, the single-crystal yield was 79%, so that generally good results were obtained. In addition, when the crucible after use was evaluated, although some wrinkles were seen on the inner surface and the outer surface of the crucible, there was no deformation of the crucible, and no cracks or delamination of the crystal layer were seen. Moreover, there were areas where the thickness gradients of the inner surface coating film and the outer surface coating film were both 0.2. The inner crystal layer had a dome-like+columnar orientation, the outer crystal layer had a dome-shaped orientation, and the crystal layer thickness ratio (inner surface/outer surface) was 1.5. The other evaluation results were the same as in the sample X7.

As described above, in the sample X8 of the quartz glass crucible, although the glass viscosity of the inner surface was higher than that in the sample X1 and the crystallization rate decreased, since the Ba application concentration on the inner surface side was high, the inner crystal layer became thick. However, since the stress between the inner and outer sides was in a balanced range, there was no deformation of the crucible. Although there were no delamination of the crystal layer and cracks, since the in-plane thickness of the crystal layer was not uniform, some wrinkles were seen.
(Crucible Sample X9)

When crystal pulling was performed using the sample X9 of a quartz glass crucible manufactured under the same conditions as the crucible sample X7 except that the concentration of Ba in the coating solution applied to the inner surface was set to $2.4 \times 10^{17}$ atoms/cm$^2$, the Ba concentration ratio (inner side/outer side) between the coating films was 30, there were areas where the Ba concentration gradients in the inner surface coating film and the outer surface coating film were both 30%, and the glass viscosity ratio (inner side/outer side) of the crucible body was 2, the single-crystal yield was 80%, so that generally good results were obtained. In addition, when the crucible after use was evaluated, although some wrinkles were seen on the inner surface and the outer surface of the crucible, there was no deformation of the crucible, and no cracks or delamination of the crystal layer were seen. Moreover, there were areas where the thickness gradients of the inner surface layer and the outer surface layer were both 0.2. The inner crystal layer had a dome-like+columnar orientation, the outer crystal layer had a dome-shaped orientation, and the presence of a Ba-enriched layer having a thickness of 7 μm at the crystal glass interface on the inner surface side and a Ba-enriched layer having a thickness of about 6 μm at the crystal glass interface on the outer surface side was confirmed. The other evaluation results were also the same as in the sample X7.

As described above, in the sample X9 of the quartz glass crucible, although the glass viscosity of the inner surface was higher than that in the sample X1 and the crystallization rate decreased, since the Ba application concentration on the inner surface side was higher, the inner crystal layer became thick. However, since the stress between the inner and outer sides was in a balanced range, there was no deformation of the crucible. Although there were no delamination of the crystal layer and cracks, since the in-plane thickness of the crystal layer was not uniform, some wrinkles were seen.
(Crucible Sample X10)

When crystal pulling was performed using the sample X10 of a quartz glass crucible manufactured under the same conditions as the crucible sample X1 except that the concentration of Ba in the coating solution applied to the inner surface was set to $2.4 \times 10^{17}$ atoms/cm$^2$, the crystal layer thickness ratio (inner surface/outer surface) was 6.5, the Ba concentration ratio (inner side/outer side) between the coating films was 30, and the glass viscosity ratio (inner side/outer side) of the crucible body was 7.5, the single-crystal yield was 80%, so that generally good results were obtained. In addition, when the crucible after use was evaluated, although some wrinkles were seen on the inner surface and the outer surface of the crucible, there was no deformation of the crucible, and no cracks or delamination of the crystal layer were seen. The inner crystal layer had a dome-like+columnar orientation, the outer crystal layer had a dome-shaped orientation, and the presence of a Ba-enriched layer having a thickness of 7 μm at the crystal glass interface on the inner surface side and a Ba-enriched layer having a thickness of about 6 μm at the crystal glass interface on the outer surface side was confirmed. The other evaluation results were also the same as in the sample X1.

As described above, in the sample X10 of the quartz glass crucible, although the glass viscosity of the inner surface was higher than that in the sample X1 and the crystallization rate decreased, since the Ba application concentration on the inner surface side was higher, the inner crystal layer became thick. In addition, there was no deformation of the crucible though the stress balance between the inner and outer sides slightly deviated from an appropriate range. Although there were no delamination of the crystal layer and cracks, and the in-plane thickness of the crystal layer was uniform, some wrinkles were seen on the inner crystal layer.
(Crucible Sample X11)

When crystal pulling was performed using the sample X11 of a quartz glass crucible manufactured under the same conditions as the crucible sample X2 except that the concentration of Ba in the coating solution applied to the outer surface of the crucible body was set to $1.0 \times 10^{17}$ atoms/cm$^2$, the Ba concentration ratio (inner side/outer side) between the coating films was 0.08, and the glass viscosity ratio (inner side/outer side) of the crucible body was 0.1, the single-crystal yield was 86%, so that good results were obtained. In addition, when the crucible after use was evaluated, although some wrinkles were seen on the outer surface of the crucible, there was no deformation of the crucible, and no cracks or delamination of the crystal layer were seen. In addition, the inner crystal layer had a dome-shaped orientation, the outer crystal layer had a dome-shaped/columnar orientation, and the crystal layer thickness ratio (inner side/outer side) was 0.1. Furthermore, the presence of a Ba-enriched layer having a thickness of about 6 μm at the crystal glass interface was confirmed. The other evaluation results were the same as in the sample X2.

As described above, in the sample X11 of the quartz glass crucible, although the glass viscosity of the inner surface was low and thus the crystallization rate increased, since the Ba application concentration on the outer surface side was high, the outer crystal layer became thick. In addition, there was no deformation of the crucible though the stress balance between the inner and outer sides slightly deviated from an appropriate range. Although there were no delamination of the crystal layer and cracks, and the in-plane thickness of the crystal layer was uniform, some wrinkles were seen on the outer crystal layer.
(Crucible Sample X12)

When crystal pulling was performed using the sample X12 of a quartz glass crucible manufactured under the same conditions as the crucible sample X1 except that a crystallization-accelerator-containing coating film was not formed on the outer surface 10b of the crucible body 10 but was formed only on the inner surface 10a, and furthermore, the glass viscosity ratio (inner side/outer side) of the crucible body was 3.0, the single-crystal yield was 89%, so that good results were obtained. In addition, when the crucible after use was evaluated, the inner crystal layer had a dome-like+columnar orientation, and the presence of a Ba-enriched layer having a thickness of about 0.6 μm at the crystal glass interface on the inner surface side was confirmed. The other evaluation results were also the same as in the sample X1.

As described above, in the sample X12 of the quartz glass crucible, since the crystal orientation was within range, there was no deformation of the crucible, and since the glass viscosity was within an appropriate range, there was no glass separation. In addition, since the in-plane thickness of the inner crystal layer was uniform, there were no wrinkles or delamination, so that good results were obtained.
(Crucible Sample X13)

When crystal pulling was performed using the sample X13 of a quartz glass crucible manufactured under the same conditions as the crucible sample X12, the single-crystal yield was 93%, so that good results were obtained. In addition, when the crucible after use was evaluated, the inner crystal layer had a dome-like+columnar orientation, and the presence of a Ba-enriched layer having a thickness of about 18 μm at the crystal glass interface on the inner surface side was confirmed. The other evaluation results were also the same as in the sample X12.

As described above, in the sample X13 of the quartz glass crucible, since the crystal orientation was within range, there was no deformation of the crucible, and since the glass viscosity was within an appropriate range, there was no glass separation. In addition, since the in-plane thickness of the inner crystal layer was uniform, there were no wrinkles or delamination, so that good results were obtained.
(Crucible Sample X14)

When crystal pulling was performed using the sample X14 of a quartz glass crucible manufactured under the same conditions as the crucible sample X12 except that the glass viscosity ratio (inner side/outer side) of the crucible body was 0.3, the single-crystal yield was 81%, so that generally good results were obtained. In addition, when the crucible after use was evaluated, the inner crystal layer had a dome-like+columnar orientation, and the presence of a Ba-enriched layer having a thickness of about 6 μm at the crystal glass interface on the inner surface side was confirmed.

Furthermore, in the sample X14 of the quartz glass crucible, since the outer glass viscosity was low, the outer glass was lowered and separated and thus the crucible was slightly deformed. However, since the in-plane thickness of the inner crystal layer was uniform, there were no wrinkles or delamination.
(Crucible Sample X15)

When crystal pulling was performed using the sample X15 of a quartz glass crucible manufactured under the same conditions as the crucible sample X12 except that the glass viscosity ratio (inner side/outer side) of the crucible body was 12, the single-crystal yield was 81%, so that generally good results were obtained. In addition, when the crucible after use was evaluated, the inner crystal layer had a dome-like+columnar orientation, and the presence of a Ba-enriched layer having a thickness of about 6 μm at the crystal glass interface on the inner surface side was confirmed.

Furthermore, in the sample X15 of the quartz glass crucible, since the outer glass viscosity was high, and glass separation had occurred between the inner surface and the outer surface, the crucible was slightly deformed. However, since the in-plane thickness of the inner crystal layer was uniform, there were no wrinkles or delamination.
(Crucible Sample X16)

When crystal pulling was performed using the sample X16 of a quartz glass crucible manufactured under the same conditions as the crucible sample X12 except that there were areas where the Ba concentration gradient in the inner surface coating film was 30%, the single-crystal yield was 80%, so that generally good results were obtained. In addition, when the crucible after use was evaluated, the inner crystal layer had a dome-like+columnar orientation, and the presence of a Ba-enriched layer having a thickness of about 6 μm at the crystal glass interface on the inner surface side was confirmed. In addition, there were areas where the thickness gradient of the inner crystal layer was 0.2.

Furthermore, in the sample X16 of the quartz glass crucible, since the glass viscosity was within an appropriate range, glass separation had not occurred, and thus there was no deformation of the crucible. In addition, no cracks or delamination of the crystal layer were seen. However, since the in-plane thickness of the inner crystal layer was not uniform, some wrinkles were seen.
(Crucible Sample X17)

When crystal pulling was performed using the sample X17 of a quartz glass crucible manufactured under the same conditions as the crucible sample X12, the single-crystal yield was 83%, so that good results were obtained. In addition, when the crucible after use was evaluated, the inner crystal layer had a dome-like+columnar orientation, and the presence of a Ba-enriched layer having a thickness of about 50 μm at the crystal glass interface on the inner surface side was confirmed.

As described above, in the sample X17 of the quartz glass crucible, although the Ba-enriched layer was slightly thick and some wrinkles were generated on the surface of the inner crystal layer, this did not have an influence on the single-crystal yield. In addition, since the glass viscosity was within an appropriate range and glass separation had not occurred, there was no deformation of the crucible and no cracks or delamination of the crystal layer were seen.
(Crucible Sample X18)

When crystal pulling was performed using the sample X18 of a quartz glass crucible manufactured under the same conditions as the crucible sample X12, the single-crystal yield was 72%. In addition, when the crucible after use was evaluated, the inner crystal layer had a dome-like+columnar orientation, and the presence of a Ba-enriched layer having a thickness of about 80 μm at the crystal glass interface on the inner surface side was confirmed.

As described above, in the sample X18 of the quartz glass crucible, since the Ba-enriched layer was too thick, wrinkles and cracks were generated on the surface of the inner crystal layer, and the single-crystal yield was lower than that in the crucible sample X17. However, since the glass viscosity was within an appropriate range and glass separation had not occurred, there was no deformation of the crucible, and no delamination of the crystal layer was seen.
(Crucible Sample X19)

When crystal pulling was performed using the sample X19 of a quartz glass crucible manufactured under the same conditions as the crucible sample X1 except that a crystallization-accelerator-containing coating film was not formed on the inner surface 10a of the crucible body 10 but was formed only on the outer surface 10b, and furthermore, the glass viscosity ratio (inner side/outer side) of the crucible body was 2.0, the single-crystal yield was 88%, so that good results were obtained. In addition, when the crucible after use was evaluated, the outer crystal layer had a dome-shaped orientation, and the presence of a Ba-enriched layer having a thickness of about 0.6 μm at the crystal glass interface on the outer surface side was confirmed. The other evaluation results were also the same as in the sample X1.

As described above, in the sample X19 of the quartz glass crucible, since the crystal orientation was within the range, there was no deformation of the crucible, and since the glass viscosity was within an appropriate range, there was no glass separation. In addition, since the in-plane thickness of the outer crystal layer was uniform, there were no wrinkles or delamination, so that good results were obtained.

(Crucible Sample X20)

When crystal pulling was performed using the sample X20 of a quartz glass crucible manufactured under the same conditions as the crucible sample X19, the single-crystal yield was 93%, so that good results were obtained. In addition, when the crucible after use was evaluated, the outer crystal layer had a dome-shaped orientation, and the presence of a Ba-enriched layer having a thickness of about 18 μm at the crystal glass interface on the outer surface side was confirmed. The other evaluation results were also the same as in the sample X19.

As described above, in the sample X20 of the quartz glass crucible, since the crystal orientation was within the range, there was no deformation of the crucible, and since the glass viscosity was within an appropriate range, there was no glass separation. In addition, since the in-plane thickness of the outer crystal layer was uniform, there were no wrinkles or delamination, so that good results were obtained.

(Crucible Sample X21)

When crystal pulling was performed using the sample X21 of a quartz glass crucible manufactured under the same conditions as the crucible sample X19 except that the glass viscosity ratio (inner side/outer side) of the crucible body was 0.3, the single-crystal yield was 80%, so that generally good results were obtained. In addition, when the crucible after use was evaluated, the outer crystal layer had a dome-shaped orientation, and the presence of a Ba-enriched layer having a thickness of about 6 μm at the crystal glass interface on the outer surface side was confirmed.

Furthermore, in the sample X21 of the quartz glass crucible, since the inner glass viscosity was low, the outer glass was lowered and separated and thus the crucible was slightly deformed. However, since the in-plane thickness of the outer crystal layer was uniform, there were no wrinkles or delamination.

(Crucible Sample X22)

When crystal pulling was performed using the sample X22 of a quartz glass crucible manufactured under the same conditions as the crucible sample X19 except that there were areas where the Ba concentration gradient in the outer surface coating film was 30%, the single-crystal yield was 79%, so that generally good results were obtained. In addition, when the crucible after use was evaluated, the outer crystal layer had a dome-shaped orientation, and the presence of a Ba-enriched layer having a thickness of about 6 μm at the crystal glass interface on the outer surface side was confirmed. In addition, there were areas where the thickness gradient of the outer crystal layer was 0.2.

Furthermore, in the sample X22 of the quartz glass crucible, since the glass viscosity was within an appropriate range, glass separation had not occurred, and thus there was no deformation of the crucible. In addition, no cracks or delamination of the crystal layer were seen. However, since the in-plane thickness of the outer crystal layer was not uniform, some wrinkles were seen.

(Crucible Sample X23)

When crystal pulling was performed using the sample X23 of a quartz glass crucible manufactured under the same conditions as the crucible sample X19 except that the concentration of Ba in the coating solution applied to the outer surface of the crucible body was set to $4.0 \times 10^{17}$ atoms/cm$^2$, the single-crystal yield was 88%, so that good results were obtained. In addition, when the crucible after use was evaluated, the outer crystal layer had a dome-like+columnar orientation, and the presence of a Ba-enriched layer having a thickness of about 50 μm at the crystal glass interface on the outer surface side was confirmed.

As described above, in the sample X23 of the quartz glass crucible, although the Ba-enriched layer was slightly thick and some wrinkles were generated on the surface of the outer crystal layer, this did not have an influence on the single-crystal yield. In addition, since the glass viscosity was within an appropriate range and glass separation had not occurred, there was no deformation of the crucible and no cracks or delamination of the crystal layer were seen.

(Crucible Sample X24)

When crystal pulling was performed using the sample X24 of a quartz glass crucible manufactured under the same conditions as the crucible sample X19 except that the concentration of Ba in the coating solution applied to the outer surface of the crucible body was set to $8.0 \times 10^{17}$ atoms/cm$^2$, the single-crystal yield was 72%. In addition, when the crucible after use was evaluated, the outer crystal layer had a dome-like+columnar orientation, and the presence of a Ba-enriched layer having a thickness of about 80 μm at the crystal glass interface on the outer surface side was confirmed.

As described above, in the sample X24 of the quartz glass crucible, since the Ba-enriched layer was too thick, wrinkles and cracks were generated on the surface of the outer crystal layer, and the single-crystal yield was lower than that in the crucible sample X23. Although the glass viscosity was within an appropriate range and there was no glass separation or delamination of the crystal layer, the crucible was slightly deformed.

(Crucible Sample Y1)

In the sample Y1 of the quartz glass crucible, the concentration of Ba in the coating solution applied to the inner surface was set to $3 \times 10^{15}$ atoms/cm$^2$, and the concentration of Ba in the coating solution applied to the outer surface was set to $1 \times 10^{14}$ atoms/cm$^2$. The Ba concentration ratio (inner surface/outer surface) between coating films was 30. In addition, there were areas where the Ba concentration gradients in the inner surface coating film and the outer surface coating film were both 30%. The glass viscosity ratio (inner side/outer side) of the uncoated quartz glass crucible (crucible body) was 30.

When a 300 mm silicon single crystal ingot was pulled up using the sample Y1 of such a quartz glass crucible, the single-crystal yield was 53%. In addition, when the outer appearance of the crucible after use was visually observed, the crucible was clearly deformed, wrinkles and cracks were generated on the surface, and delamination of the crystal layer had occurred.

Next, when the cut section of the crucible sample Y1 after use was observed by SEM, both the inner crystal layer and the outer crystal layer had a random orientation. In addition, the crystal layer thickness ratio (inner surface/outer surface) was 6.5, and there were areas where the thickness gradients of the inner crystal layer and the outer crystal layer were both 0.2.

Furthermore, when the crystal glass interfaces on the inner surface side and the outer surface side were analyzed by TOF-SIMS, the thickness of a Ba-enriched layer was below the detection limit 0.1 μm), and the presence of a Ba-enriched layer could not be confirmed.

As described above, in the sample Y1 of the quartz glass crucible, the crystal layer had a random orientation, and it was difficult to determine a Ba-enriched layer. In addition, since the Ba application concentration on the inner surface side was too high and the glass viscosity of the inner surface was high, the crystallization rate was slow, and since the inner crystal layer was too thick, the stress balance between the inner and outer sides was poor. In addition, since the in-plane thickness of the crystal layer was not uniform, wrinkles were generated, and delamination of the crystal layer had occurred.

(Crucible Sample Y2)

When crystal pulling was performed using the sample Y2 of a quartz glass crucible manufactured under the same conditions as the crucible sample Y1 except that the concentration of Ba in the coating solution applied to the inner surface was set to $1\times10^{14}$ atoms/cm$^2$, the concentration of Ba in the coating solution applied to the outer surface was set to $1\times10^{15}$ atoms/cm$^2$, the thickness ratio (inner side/outer side) between the crystal layers was 0.1, the Ba concentration ratio (inner side/outer side) between the coating films was 0.1, and the glass viscosity ratio (inner side/outer side) of the crucible body was 0.1, the single-crystal yield was 53%. The other evaluation results were also the same as in the sample Y1.

As described above, in the sample Y2 of the quartz glass crucible, the crystal layer had a random orientation, and it was difficult to determine a Ba-enriched layer. In addition, since the Ba application concentration on the outer surface side was too high and the glass viscosity of the outer surface was high, the crystallization rate was slow, and since the outer crystal layer was too thick, the stress balance between the inner and outer sides was poor. In addition, since the in-plane thickness of the crystal layer was not uniform, wrinkles were generated, and delamination of the crystal layer had occurred.

(Crucible Sample Y3)

When crystal pulling was performed using the sample Y3 of a quartz glass crucible manufactured under the same conditions as the crucible sample Y1 except that a crystallization-accelerator-containing coating film was not formed on the outer surface 10b of the crucible body 10 but was formed only on the inner surface 10a, the concentration of Ba in the coating solution applied to the inner surface was set to $1\times10^{14}$ atoms/cm$^2$, the Ba concentration gradient in the inner surface coating film was in a range of 40 to 150%, and further, the glass viscosity ratio (inner side/outer side) of the crucible body was 3.0, the single-crystal yield was 59%.

In addition, when the crucible after use was evaluated, the inner crystal layer had a random orientation, and the presence of a Ba-enriched layer at the crystal glass interface on the inner surface side could not be confirmed (<0.1 μm). In addition, the thickness gradient of the inner crystal layer was in a range of 0.5 to 1.5. Although the crucible was deformed due to the thin inner crystal layer, since the glass viscosity was within an appropriate range, there was no glass separation, and since the in-plane thickness of the inner crystal layer was uniform, there were no wrinkles or delamination.

(Crucible Sample Y4)

When crystal pulling was performed using the sample Y4 of a quartz glass crucible manufactured under the same conditions as the crucible sample Y3 except that there were areas where the Ba concentration gradient in the inner surface coating film was 30% and the glass viscosity ratio (inner side/outer side) of the crucible body was 12, the single-crystal yield was 48%. In addition, when the crucible after use was evaluated, the inner crystal layer had a random orientation, and the presence of a Ba-enriched layer at the crystal glass interface on the inner surface side could not be confirmed (<0.1 μm). In addition, since the outer glass viscosity was high and glass separation had occurred between the inner surface and the outer surface, the crucible was deformed. The in-plane thickness of the inner crystal layer was not uniform, wrinkles and cracks were generated, and furthermore, delamination of the crystal layer was also seen.

(Crucible Sample Y5)

When crystal pulling was performed using the sample Y5 of a quartz glass crucible manufactured under the same conditions as the crucible sample Y1 except that a crystallization-accelerator-containing coating film was not formed on the inner surface 10a of the crucible body 10 but was formed only on the outer surface 10b, the Ba concentration gradient in the outer surface coating film was in a range of 70 to 130%, and the glass viscosity ratio (inner side/outer side) of the crucible body was 3.0, the single-crystal yield was 60%.

In addition, when the crucible after use was evaluated, the outer crystal layer had a random orientation, and the presence of a Ba-enriched layer at the crystal glass interface on the outer surface side could not be confirmed (<0.1 μm). In addition, the thickness gradient of the outer crystal layer was in a range of 0.8 to 1.2. Although the crucible was deformed due to the thin outer crystal layer, since the glass viscosity was within an appropriate range, there was no glass separation, and since the in-plane thickness of the outer crystal layer was uniform, there were no wrinkles or delamination.

(Crucible Sample Y6)

When crystal pulling was performed using the sample Y6 of a quartz glass crucible manufactured under the same conditions as the crucible sample Y5 except that there were areas where the Ba concentration gradient in the outer surface coating film was 30% and the glass viscosity ratio (inner side/outer side) of the crucible body was 0.3, the single-crystal yield was 49%. In addition, when the crucible after use was evaluated, the outer crystal layer had a random orientation, and the presence of a Ba-enriched layer at the crystal glass interface on the outer surface side could not be confirmed (<0.1 μm). In addition, there were areas where the thickness gradient of the outer crystal layer was 0.2. In addition, since the inner glass viscosity was low and the inner glass was lowered and separated, the crucible was deformed. Since the in-plane thickness of the outer crystal layer was not uniform, wrinkles and cracks were generated, and furthermore, delamination of the crystal layer was also seen.

DESCRIPTION OF THE SYMBOLS 1 quartz glass crucible
1a straight body portion of quartz glass crucible
1b bottom portion of quartz glass crucible
1c corner portion of quartz glass crucible
2A, 2B quartz glass crucible
3 silicon single crystal
4 silicon melt
5 quartz glass crucible
10 crucible body
10a inner surface of crucible body
10b outer surface of crucible body
10G glass layer 10P crystallization-accelerator-enriched layer (Ba-enriched layer)
11 opaque layer
12 transparent layer
13A first crystallization-accelerator-containing coating film
13B second crystallization-accelerator-containing coating film
14 crystal layer
14A inner crystal layer
14B outer crystal layer
15A crystallization-accelerator-uncoated region
15B crystallization-accelerator-uncoated region
20 single crystal pull-up apparatus
21 chamber
21a main chamber
21b pull chamber
21c gas inlet port
21d gas exhaust port
21e sight window
22 carbon susceptor
23 rotary shaft
24 shaft driving mechanism
25 heater
26 heat insulation material
27 heat-shield body
27a opening of heat-shield body
28 crystal pull-up wire
29 wire winding mechanism
30 CCD camera
31 image processing unit
32 controller
40 rotary stage
41 polyethylene sheet (PE sheet)
41e end portion of polyethylene sheet
42 polypropylene band (PP band)
43 rubber band
45 spray

What is claimed is:

1. A quartz glass crucible used for pulling up a silicon single crystal by a Czochralski method, comprising:
a cylindrical crucible body which has a bottom and is made of quartz glass; and
a crystallization-accelerator-containing coating film which is formed on a surface of the crucible body so as to cause a crystallization-accelerator-enriched layer to be formed in the vicinity of the surface of the crucible body by heating during a step of pulling up the silicon single crystal,
wherein the crystallization-accelerator-containing coating film is a non-heated polymer film formed of: (i) a barium compound which is insoluble in water, and (ii) a thickener composed of a polymer in which the barium compound diffuses.

2. The quartz glass crucible according to claim 1, wherein a thickness of the crystallization-accelerator-enriched layer is 0.1 μm or more and 50 μm or less.

3. The quartz glass crucible according to claim 1, wherein the crucible body includes
a straight body portion having a cylindrical shape,
a bottom portion which is curved, and
a corner portion which connects the straight body portion to the bottom portion, and
the crystallization-accelerator-containing coating film is formed at least on the straight body portion.

4. The quartz glass crucible according to claim 1, wherein a crystallization accelerator contained in the crystallization-accelerator-containing coating film contains a compound forming glass of a system of two or more components with $SiO_2$.

5. A quartz glass crucible used for pulling up a silicon single crystal by a Czochralski method, comprising:
a cylindrical crucible body which has a bottom and is made of quartz glass; and
first and second crystallization-accelerator-containing coating films which are respectively formed on an inner surface of the crucible body and an outer surface of the crucible body so as to cause a ratio $t_i/t_o$, of a thickness $t_i$ of an inner crystal layer formed on the inner surface of the crucible body to a thickness $t_o$ of an outer crystal layer formed on the outer surface of the crucible body by heating during a step of pulling up the silicon single crystal, to be 0.3 or more and 5 or less,
wherein each of the first and second crystallization-accelerator-containing coating films is a non-heated polymer film formed of: (i) a barium compound which is insoluble in water, and (ii) a thickener composed of a polymer in which the barium compound diffuses.

6. The quartz glass crucible according to claim 5,
wherein a ratio $c_i/c_o$ of a concentration $c_i$ of a crystallization accelerator in the first crystallization-accelerator-containing coating film to a concentration $c_o$ of a crystallization accelerator in the second crystallization-accelerator-containing coating film is 0.3 or more and 20 or less.

7. The quartz glass crucible according to claim 6,
wherein a ratio $\eta_i/\eta_o$ of a glass viscosity $\eta_i$ on an inner surface side to a glass viscosity $\eta_o$ on an outer surface side of the crucible body at a heating temperature during the step of pulling up is 0.2 or more and 5 or less.

8. The quartz glass crucible according to claim 7,
wherein the concentration of the crystallization accelerator in the first crystallization-accelerator-containing coating film is different from the concentration of the crystallization accelerator in the second crystallization-accelerator-containing coating film, and
a glass viscosity on one surface side of the inner surface and the outer surface of the crucible body, which is in contact with a crystallization-accelerator-containing coating film having a higher crystallization accelerator concentration is higher than a glass viscosity on the other surface side which is in contact with a crystallization-accelerator-containing coating film having a lower crystallization accelerator concentration.

9. The quartz glass crucible according to claim 5,
wherein an in-plane gradient of the thickness of each of the inner crystal layer and the outer crystal layer is 0.5 or more and 1.5 or less.

10. The quartz glass crucible according to claim 5,
wherein in-plane gradients of concentrations of crystallization accelerators in the first and second crystallization-accelerator-containing coating films are 40% or more and 150% or less.

11. A quartz glass crucible used for pulling up a silicon single crystal by a Czochralski method, comprising:
a cylindrical crucible body which has a bottom and is made of quartz glass; and
a crystallization-accelerator-containing coating film which is formed on an inner surface of the crucible body so as to cause an inner crystal layer to be formed on the inner surface of the crucible body by heating during a step of pulling up the silicon single crystal,
wherein the crystallization-accelerator-containing coating film is a non-heated polymer film formed of: (i) a barium compound which is insoluble in water, and (ii) a thickener composed of a polymer in which the barium compound diffuses, and wherein a ratio $\eta_o/\eta_i$ of a glass viscosity $\eta_o$ on an outer surface side to a glass viscosity $\eta_i$ on an inner surface side of the crucible body at a heating temperature during the step of pulling up is 0.5 or more and 10 or less.

12. The quartz glass crucible according to claim 11, wherein an in-plane gradient of a thickness of the inner crystal layer is 0.5 or more and 1.5 or less.

13. The quartz glass crucible according to claim 11, wherein an in-plane concentration gradient of a crystallization accelerator in the crystallization-accelerator-containing coating film is 40% or more and 150% or less.

14. A quartz glass crucible used for pulling up a silicon single crystal by a Czochralski method, comprising:
a cylindrical crucible body which has a bottom and is made of quartz glass; and
a crystallization-accelerator-containing coating film which is formed on an outer surface of the crucible body so as to cause an outer crystal layer to be formed on the outer surface of the crucible body by heating during a step of pulling up the silicon single crystal,
wherein the crystallization-accelerator-containing coating film is a non-heated polymer film formed of: (i) a barium compound which is insoluble in water, and (ii) a thickener composed of a polymer in which the barium compound diffuses, and
wherein a ratio $\eta_i/\eta_o$ of a glass viscosity $\eta_i$ on an inner surface side to a glass viscosity $\eta_o$ on an outer surface side of the crucible body at a heating temperature during the step of pulling up is 0.5 or more.

15. The quartz glass crucible according to claim 14, wherein an in-plane gradient of a thickness of the outer crystal layer is 0.5 or more and 1.5 or less.

16. The quartz glass crucible according to claim 14, wherein an in-plane concentration gradient of a crystallization accelerator in the crystallization-accelerator-containing coating film is 40% or more and 150% or less.

17. A manufacturing method of a quartz glass crucible comprising steps of:
manufacturing a cylindrical crucible body which has a bottom and is made of quartz glass; and
forming a crystallization-accelerator-containing coating film on an inner surface or an outer surface of the crucible body so as to cause a crystallization-accelerator-enriched layer to be formed in the vicinity of a surface of at least one of the inner surface and the outer surface of the crucible body by heating during a step of pulling up a silicon single crystal,
wherein the crystallization-accelerator-containing coating film is a non-heated polymer film formed of: (i) a barium compound which is insoluble in water, and (ii) a thickener composed of a polymer in which the barium compound diffuses.

18. A manufacturing method of a quartz glass crucible comprising steps of:
manufacturing a cylindrical crucible body which has a bottom and is made of quartz glass;
forming a first crystallization-accelerator containing-coating film on an inner surface of the crucible body so as to an inner crystal layer to be formed on the inner surface of the crucible body by heating during a step of pulling up a silicon single crystal; and
forming a second crystallization-accelerator-containing coating film on an outer surface of the crucible body so as to an outer crystal layer having a thickness $t_o$ to be formed on the outer surface of the crucible body by heating during a step of pulling up the silicon single crystal,
wherein each of the first and second crystallization-accelerator-containing coating films is a non-heated polymer film formed of: (i) a barium compound which is insoluble in water, and (ii) a thickener composed of a polymer in which the barium compound diffuses, and
wherein the steps of forming the first and second crystallization-accelerator-containing coating films include a step of applying crystallization accelerators in which concentrations of the crystallization accelerators are adjusted so as to cause a ratio $t_i/t_o$ of a thickness $t_i$ of the inner crystal layer to the thickness $t_o$ of the outer crystal layer to be 0.3 or more and 5 or less.

19. A manufacturing method of a quartz glass crucible comprising steps of:
manufacturing a cylindrical crucible body which has a bottom and is made of quartz glass; and
forming a crystallization-accelerator-containing coating film on an inner surface of the crucible body so as to cause an inner crystal layer to be formed on the inner surface of the crucible body by heating during a step of pulling up a silicon single crystal,
wherein the crystallization-accelerator-containing coating film is a non-heated polymer film formed of: (i) a barium compound which is insoluble in water, and (ii) a thickener composed of a polymer in which the barium compound diffuses, and
wherein the step of manufacturing the crucible body includes a step of subjecting raw material quartz powders to arc melting in a rotating mold, and
types of the raw material quartz powder forming an inner surface side of the crucible body and the raw material quartz powder forming an outer surface side of the crucible are changed so as to cause a ratio $\eta_o/\eta_i$ of a glass viscosity $\eta_o$ on the outer surface side of the crucible body to a glass viscosity $\eta_i$ on the inner surface side of the crucible body at a heating temperature during the step of pulling up to be 0.5 or more and 10 or less.

20. A manufacturing method of a quartz glass crucible comprising steps of:
manufacturing a cylindrical crucible body which has a bottom and is made of quartz glass; and
forming a crystallization-accelerator-containing coating film on an outer surface of the crucible body so as to cause an outer crystal layer to be formed on the outer surface of the crucible body by heating during a step of pulling up a silicon single crystal,
wherein the crystallization-accelerator-containing coating film is a non-heated polymer film formed of: (i) a barium compound which is insoluble in water, and (ii) a thickener composed of a polymer in which the barium compound diffuses, and
wherein the step of manufacturing the crucible body includes a step of subjecting raw material quartz powders to arc melting in a rotating mold, and
types of the raw material quartz powder forming an inner surface side of the crucible body and the raw material quartz powder forming an outer surface side of the crucible are changed so as to cause a ratio $\eta_i/\eta_o$ of a glass viscosity $\eta_i$ on the inner surface side of the crucible body to a glass viscosity $\eta_o$ on the outer surface side of the crucible body at a heating temperature during the step of pulling up to be 0.5 or more.

21. A quartz glass crucible used for pulling up a silicon single crystal by a Czochralski method, comprising:
   a cylindrical crucible body which has a bottom and is made of quartz glass; and
   first and second crystallization-accelerator-containing coating films which are respectively formed on an inner surface of the crucible body and an outer surface of the crucible body so as to cause a ratio ti/to, of a thickness ti of an inner crystal layer formed on the inner surface of the crucible body to a thickness to of an outer crystal layer formed on the outer surface of the crucible body by heating during a step of pulling up the silicon single crystal, to be 0.3 or more and 5 or less,
   wherein in-plane gradients of concentrations of crystallization accelerators in the first and second crystallization-accelerator-containing coating films are 40% or more and 150% or less.

22. A quartz glass crucible used for pulling up a silicon single crystal by a Czochralski method, comprising:
   a cylindrical crucible body which has a bottom and is made of quartz glass; and
   a crystallization-accelerator-containing coating film which is formed on an inner surface of the crucible body so as to cause an inner crystal layer to be formed on the inner surface of the crucible body by heating during a step of pulling up the silicon single crystal,
   wherein an in-plane concentration gradient of a crystallization accelerator in the crystallization-accelerator-containing coating film is 40% or more and 150% or less, and
   wherein a ratio $\eta o/\eta i$ of a glass viscosity $\eta o$ on an outer surface side to a glass viscosity $\eta i$ on an inner surface side of the crucible body at a heating temperature during the step of pulling up is 0.5 or more and 10 or less.

23. A quartz glass crucible used for pulling up a silicon single crystal by a Czochralski method, comprising:
   a cylindrical crucible body which has a bottom and is made of quartz glass; and
   a crystallization-accelerator-containing coating film which is formed on an outer surface of the crucible body so as to cause an outer crystal layer to be formed on the outer surface of the crucible body by heating during a step of pulling up the silicon single crystal,
   wherein an in-plane concentration gradient of a crystallization accelerator in the crystallization-accelerator-containing coating film is 40% or more and 150% or less, and
   wherein a ratio $\eta i/\eta o$ of a glass viscosity $\eta i$ on an inner surface side to a glass viscosity $\eta o$ on an outer surface side of the crucible body at a heating temperature during the step of pulling up is 0.5 or more.

* * * * *